(12) United States Patent
Murakami et al.

(10) Patent No.: US 11,744,070 B2
(45) Date of Patent: Aug. 29, 2023

(54) SEMICONDUCTOR MEMORY DEVICE

(71) Applicant: KIOXIA CORPORATION, Tokyo (JP)

(72) Inventors: Toshiya Murakami, Meguro (JP); Kenji Tashiro, Kuwana (JP); Hidenori Miyagawa, Yokkaichi (JP); Reiko Kitamura, Kuwana (JP)

(73) Assignee: KIOXIA CORPORATION, Tokyo (JP)

( * ) Notice: Subject to any disclaimer, the term of this patent is extended or adjusted under 35 U.S.C. 154(b) by 242 days.

(21) Appl. No.: 17/199,660

(22) Filed: Mar. 12, 2021

(65) Prior Publication Data

US 2022/0093636 A1 Mar. 24, 2022

(30) Foreign Application Priority Data

Sep. 18, 2020 (JP) ................................. 2020-157246

(51) Int. Cl.
*H10B 43/27* (2023.01)
*H01L 23/522* (2006.01)
*H10B 41/27* (2023.01)

(52) U.S. Cl.
CPC ......... *H10B 43/27* (2023.02); *H01L 23/5226* (2013.01); *H10B 41/27* (2023.02)

(58) Field of Classification Search
CPC ...... H10B 43/27; H10B 41/27; H01L 23/5226
See application file for complete search history.

(56) References Cited

U.S. PATENT DOCUMENTS

| | | |
|---|---|---|
| 9,666,296 B1 | 5/2017 | Maejima |
| 10,475,804 B1 | 11/2019 | Nishikawa et al. |
| 10,692,876 B2 | 6/2020 | Okawa |
| 10,833,096 B2 | 11/2020 | Tanaka et al. |
| 10,903,233 B2 | 1/2021 | Nakaki |
| 2018/0277476 A1 | 9/2018 | Hagishima |
| 2020/0212059 A1 | 7/2020 | Nishikawa |

FOREIGN PATENT DOCUMENTS

| | | |
|---|---|---|
| JP | 2017-157260 A | 9/2017 |
| JP | 2018-163966 A | 10/2018 |
| JP | 2019-165089 A | 9/2019 |
| JP | 2020-038930 A | 3/2020 |
| JP | 2020-043211 A | 3/2020 |
| JP | 2020-107673 A | 7/2020 |

*Primary Examiner* — Thao X Le
*Assistant Examiner* — Daniel Hyun Suh
(74) *Attorney, Agent, or Firm* — Oblon, McClelland, Maier & Neustadt, L.L.P.

(57) ABSTRACT

A semiconductor memory device comprises: first conductive layers arranged in a first direction; a first semiconductor layer facing the first conductive layers; a second semiconductor layer facing the first conductive layers; second conductive layers arranged in the first direction; third conductive layers arranged in the first direction; a third semiconductor layer facing the second conductive layers and connected to the first semiconductor layer; a fourth semiconductor layer facing the third conductive layers and connected to the second semiconductor layer; a fourth conductive layer facing the third semiconductor layer; and a fifth conductive layer connected to the third conductive layers. A distance from a central axis of the third semiconductor layer to a central axis of the fourth semiconductor layer is larger than a distance from a central axis of the first semiconductor layer to a central axis of the second semiconductor layer.

19 Claims, 54 Drawing Sheets

SEMICONDUCTOR MEMORY DEVICE

CROSS-REFERENCE TO RELATED APPLICATIONS

This application is based upon and claims the benefit of Japanese Patent Application No. 2020-157246, filed on Sep. 18, 2020, the entire contents of which are incorporated herein by reference.

BACKGROUND

Field

Embodiments relate to a semiconductor memory device.

Description of the Related Art

There is known a semiconductor memory device that comprises: a substrate; a plurality of gate electrodes laminated in a direction intersecting a surface of this substrate; a semiconductor layer facing these plurality of gate electrodes; and a gate insulating layer provided between the gate electrodes and the semiconductor layer. The gate insulating layer comprises a memory portion capable of storing data, such as an insulative charge accumulating layer of the likes of silicon nitride ($Si_3N_4$) or a conductive charge accumulating layer such as a floating gate, for example.

DETAILED DESCRIPTION

Figure 1:
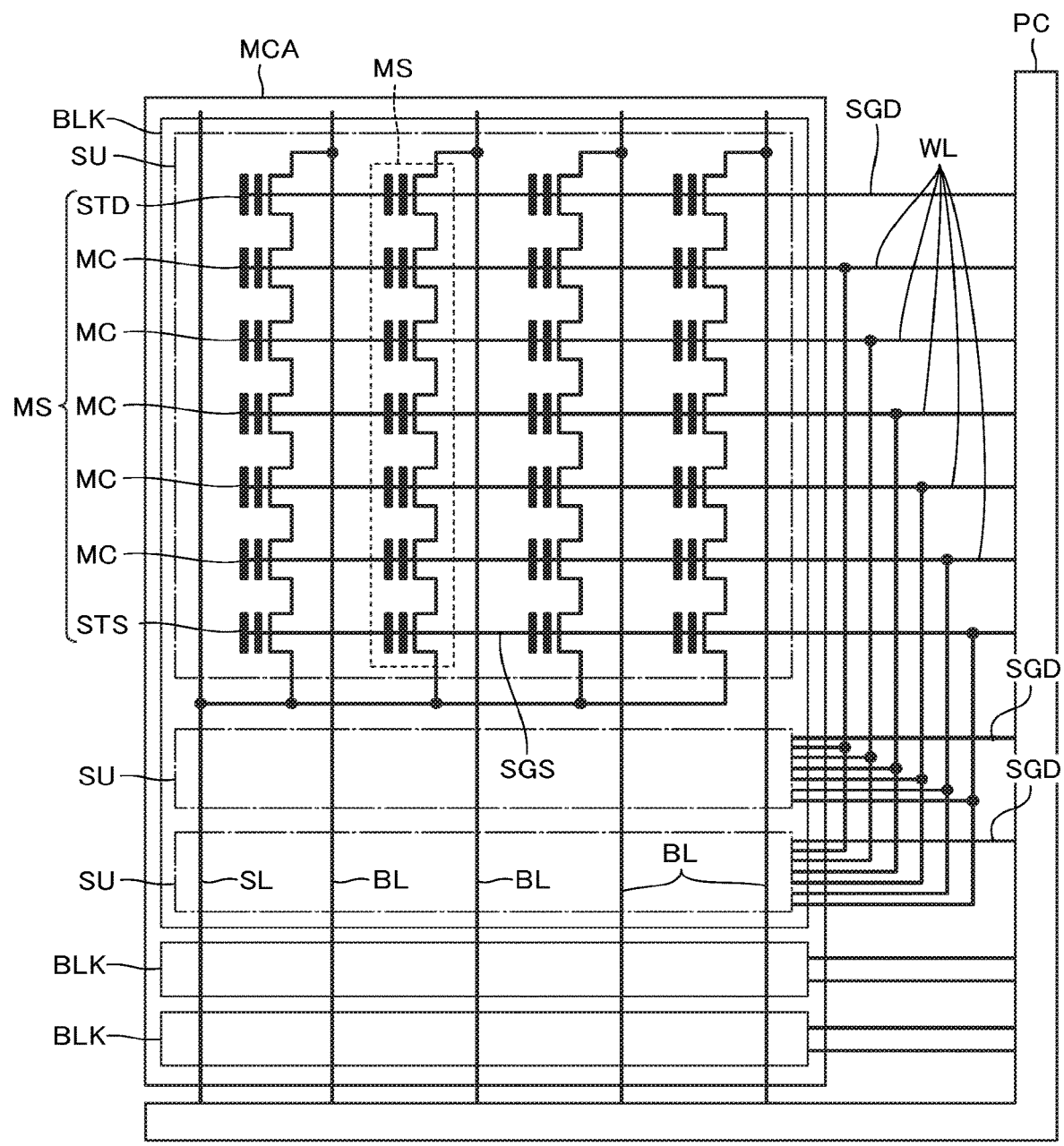
FIG. 1 is a schematic circuit diagram showing a configuration of a semiconductor memory device according to a first embodiment.

A semiconductor memory device according to an embodiment comprises: a substrate; a plurality of first conductive layers that are arranged in a first direction intersecting a surface of the substrate; a first semiconductor layer that extends in the first direction and faces the plurality of first conductive layers; a second semiconductor layer that extends in the first direction, faces the plurality of first conductive layers, and is spaced from the first semiconductor layer in a second direction intersecting the first direction; a plurality of second conductive layers that are provided at a position overlapping the plurality of first conductive layers when viewed from the first direction, and are arranged in the first direction; a plurality of third conductive layers that are provided at a position overlapping the plurality of first conductive layers when viewed from the first direction, are arranged in the first direction, and are arranged with the plurality of second conductive layers in the second direction; a third semiconductor layer that extends in the first direction, faces the plurality of second conductive layers, and includes one end in the first direction connected to the first semiconductor layer; a fourth semiconductor layer that extends in the first direction, faces the plurality of third conductive layers, and includes one end in the first direction connected to the second semiconductor layer; a fourth conductive layer that is provided between the plurality of second conductive layers and the plurality of third conductive layers, and faces part of an outer peripheral surface of the third semiconductor layer; and a fifth conductive layer that is provided between the plurality of second conductive layers and the plurality of third conductive layers, and is connected to the plurality of third conductive layers. When a cross section that extends in the first direction and the second direction and includes part of the first semiconductor layer, part of the second semiconductor layer, part of the third semiconductor layer, and part of the fourth semiconductor layer is assumed to be a first cross section, in the first cross section, a distance from a central axis of the third semiconductor layer to a central axis of the fourth semiconductor layer is larger than a distance from a central axis of the first semiconductor layer to a central axis of the second semiconductor layer.

A semiconductor memory device according to an embodiment comprises: a substrate; a plurality of first conductive layers that are arranged in a first direction intersecting a surface of the substrate; a first semiconductor layer that extends in the first direction and faces the plurality of first conductive layers; a second semiconductor layer that extends in the first direction, faces the plurality of first conductive layers, and is spaced from the first semiconductor layer in a second direction intersecting the first direction; a plurality of second conductive layers that are provided at a position overlapping the plurality of first conductive layers when viewed from the first direction, and are arranged in the first direction; a plurality of third conductive layers that are provided at a position overlapping the plurality of first conductive layers when viewed from the first direction, are arranged in the first direction, and are arranged with the plurality of second conductive layers in the second direction; a third semiconductor layer that extends in the first direction, faces the plurality of second conductive layers, and includes one end in the first direction connected to the first semiconductor layer; a fourth semiconductor layer that extends in the first direction, faces the plurality of third conductive layers, and includes one end in the first direction connected to the second semiconductor layer; a fourth conductive layer that is provided between the plurality of second conductive layers and the plurality of third conductive layers, and faces part of an outer peripheral surface of the third semiconductor layer; and a fifth conductive layer that is provided between the plurality of second conductive layers and the plurality of third conductive layers, and is connected to the plurality of third conductive layers. When a cross section that extends in the first direction and the second direction and includes part of the first semiconductor layer, part of the second semiconductor layer, part of the third semiconductor layer, and part of the fourth semiconductor layer is assumed to be a first cross section, in the first cross section, a position in the first direction of an end portion of the third semiconductor layer that is on an opposite side to the first semiconductor layer in the first direction is assumed to be a first position, in the first cross section, a position in the first direction of an end portion of the fourth conductive layer that is on an opposite side to the first semiconductor layer in the first direction is assumed to be a second position, and in the first cross section, a distance in the second direction from a side surface of the fourth conductive layer on a third conductive layer side in the second direction to a side surface of the fourth conductive layer on a third semiconductor layer side in the second direction is assumed to be a first distance, a distance in the first direction between the first position and the second position is larger than the first distance.

A semiconductor memory device according to an embodiment comprises: a substrate; a plurality of first conductive layers that are arranged in a first direction intersecting a surface of the substrate; a first semiconductor layer that extends in the first direction and faces the plurality of first conductive layers; a second semiconductor layer that extends in the first direction, faces the plurality of first conductive layers, and is spaced from the first semiconductor layer in a second direction intersecting the first direction; a plurality of second conductive layers that are provided at a position overlapping the plurality of first conductive layers when viewed from the first direction, and are arranged in the first direction; a plurality of third conductive layers that are provided at a position overlapping the plurality of first conductive layers when viewed from the first direction, are arranged in the first direction, and are arranged with the plurality of second conductive layers in the second direction; a fourth conductive layer that is provided at a position overlapping the plurality of second conductive layers when viewed from the first direction; a fifth conductive layer that is provided at a position overlapping the plurality of third conductive layers when viewed from the first direction, and is arranged with the fourth conductive layer in the second direction; a third semiconductor layer that extends in the first direction, faces the plurality of second conductive layers and the fourth conductive layer, and includes one end in the first direction connected to the first semiconductor layer; a fourth semiconductor layer that extends in the first direction, faces the plurality of third conductive layers and the fifth conductive layer, and includes one end in the first direction connected to the second semiconductor layer; a sixth conductive layer that is provided between the plurality of second conductive layers and the plurality of third conductive layers, and faces part of an outer peripheral surface of the third semiconductor layer; a seventh conductive layer that is provided between the plurality of second conductive layers and the plurality of third conductive layers, and is connected to the plurality of third conductive layers; an eighth conductive layer that is provided between the fourth conductive layer and the fifth conductive layer, and faces part of the outer peripheral surface of the third semiconductor layer; and a ninth conductive layer that is provided between the fourth conductive layer and the fifth conductive layer, and is connected to the fifth conductive layer. The eighth conductive layer is spaced from the sixth conductive layer in the first direction, and the ninth conductive layer is spaced from the seventh conductive layer in the first direction.

Next, semiconductor memory devices according to embodiments will be described in detail with reference to the drawings. Note that the following embodiments are merely examples, and are not shown with the intention of limiting the present invention. Moreover, the following drawings are schematic, and, for convenience of description, some configurations, and so on, thereof will sometimes be omitted. Moreover, portions that are common to a plurality of embodiments will be assigned with the same symbols, and descriptions thereof will sometimes be omitted.

Moreover, when a "semiconductor memory device" is referred to in the present specification, it will sometimes mean a memory die, and will sometimes mean a memory system including a control die, of the likes of a memory chip, a memory card, or an SSD (Solid State Drive). Furthermore, it will sometimes mean a configuration including a host computer, of the likes of a smartphone, a tablet terminal, or a personal computer.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, even when, in the case of three transistors having been serially connected, the second transistor is in an OFF state, the first transistor is still "electrically connected" to the third transistor.

Moreover, in the present specification, a certain direction parallel to an upper surface of a substrate will be called an X direction, a direction parallel to the upper surface of the substrate and perpendicular to the X direction will be called a Y direction, and a direction perpendicular to the upper surface of the substrate will be called a Z direction.

Moreover, in the present specification, sometimes, a direction lying along a certain plane will be called a first direction, a direction intersecting the first direction along this certain plane will be called a second direction, and a direction intersecting this certain plane will be called a third direction. These first direction, second direction, and third direction may, but need not, correspond to any of the X direction, the Y direction, and the Z direction.

Moreover, in the present specification, expressions such as "up" or "down" will be defined with reference to the substrate. For example, an orientation of moving away from the substrate along the above-described Z direction will be called up, and an orientation of coming closer to the substrate along the Z direction will be called down. Moreover, when a lower surface or a lower end is referred to for a certain configuration, this will be assumed to mean a surface or end portion on a substrate side of this configuration, and when an upper surface or an upper end is referred to for a certain configuration, this will be assumed to mean a surface or end portion on an opposite side to the substrate of this configuration. Moreover, a surface intersecting the X direction or the Y direction will be called a side surface, and so on.

Moreover, in the present specification, when the likes of a "width", a "length", or a "thickness" in a certain direction is referred to for a configuration, a member, and so on, this will sometimes mean a width, a length, or a thickness, and so on, in a cross section observed by the likes of SEM (Scanning Electron Microscopy) or TEM (Transmission Electron Microscopy), and so on.

First Embodiment

[Configuration]

FIG. 1 is a schematic circuit diagram showing a configuration of a semiconductor memory device according to a first embodiment.

As shown in FIG. 1, the semiconductor memory device comprises: a memory cell array MCA that stores data; and a peripheral circuit PC connected to the memory cell array MCA.

The memory cell array MCA comprises a plurality of memory blocks BLK. These plurality of memory blocks BLK each comprise a plurality of string units SU. These plurality of string units SU each comprise a plurality of memory strings MS. One ends of these plurality of memory strings MS are respectively connected to the peripheral circuit PC via bit lines BL. Moreover, the other ends of these plurality of memory strings MS are each connected to the peripheral circuit PC via a common source line SL.

The memory string MS comprises a drain side select transistor STD, a plurality of memory cells MC (memory transistors), and a source side select transistor STS that are connected in series between the bit line BL and the source line SL. Hereafter, the drain side select transistor STD and the source side select transistor STS will sometimes simply be called select transistors (STD, STS).

The memory cell MC is a field effect type of transistor that comprises: a semiconductor layer functioning as a channel region; a gate insulating film including a charge accumulating film; and a gate electrode. A threshold voltage of the memory cell MC changes according to an amount of charge in the charge accumulating film. The memory cell MC stores 1 bit or a plurality of bits of data. Note that the gate electrodes of the plurality of memory cells MC corresponding to one memory string MS are respectively connected to word lines WL. These word lines WL are respectively commonly connected to all of the memory strings MS in one memory block BLK.

The select transistor (STD, STS) is a field effect type of transistor that comprises: a semiconductor layer functioning as a channel region; a gate insulating film; and a gate electrode. The gate electrodes of the select transistors (STD, STS) are respectively connected with select gate lines (SGD, SGS). A drain side select gate line SGD is provided correspondingly to the string unit SU and is commonly connected to all of the memory strings MS in one string unit SU. A source side select gate line SGS is commonly connected to all of the memory strings MS in a plurality of the string units SU.

The peripheral circuit PC comprises, for example, the likes of: a voltage generating circuit that generates an operation voltage and outputs the generated operation voltage to a voltage supply line; a decode circuit that makes a desired voltage supply line electrically continuous with the bit line BL, the source line SL, the word line WL, and the select gate line (SGD, SGS); and a sense amplifier that detects a current or voltage of the bit line BL.

Figure 2:
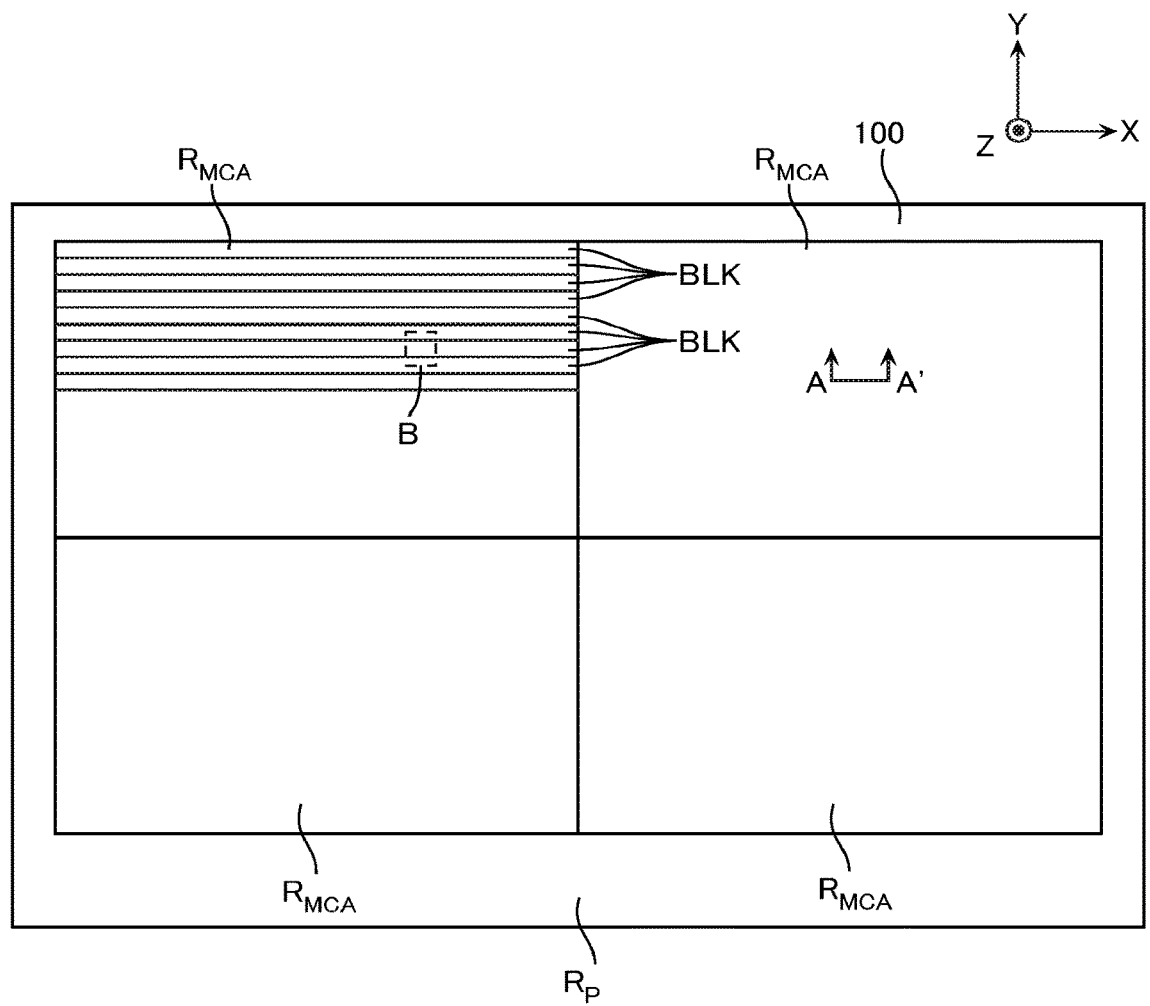
FIG. 2 is a schematic plan view showing a configuration of same semiconductor memory device.
Figure 3:
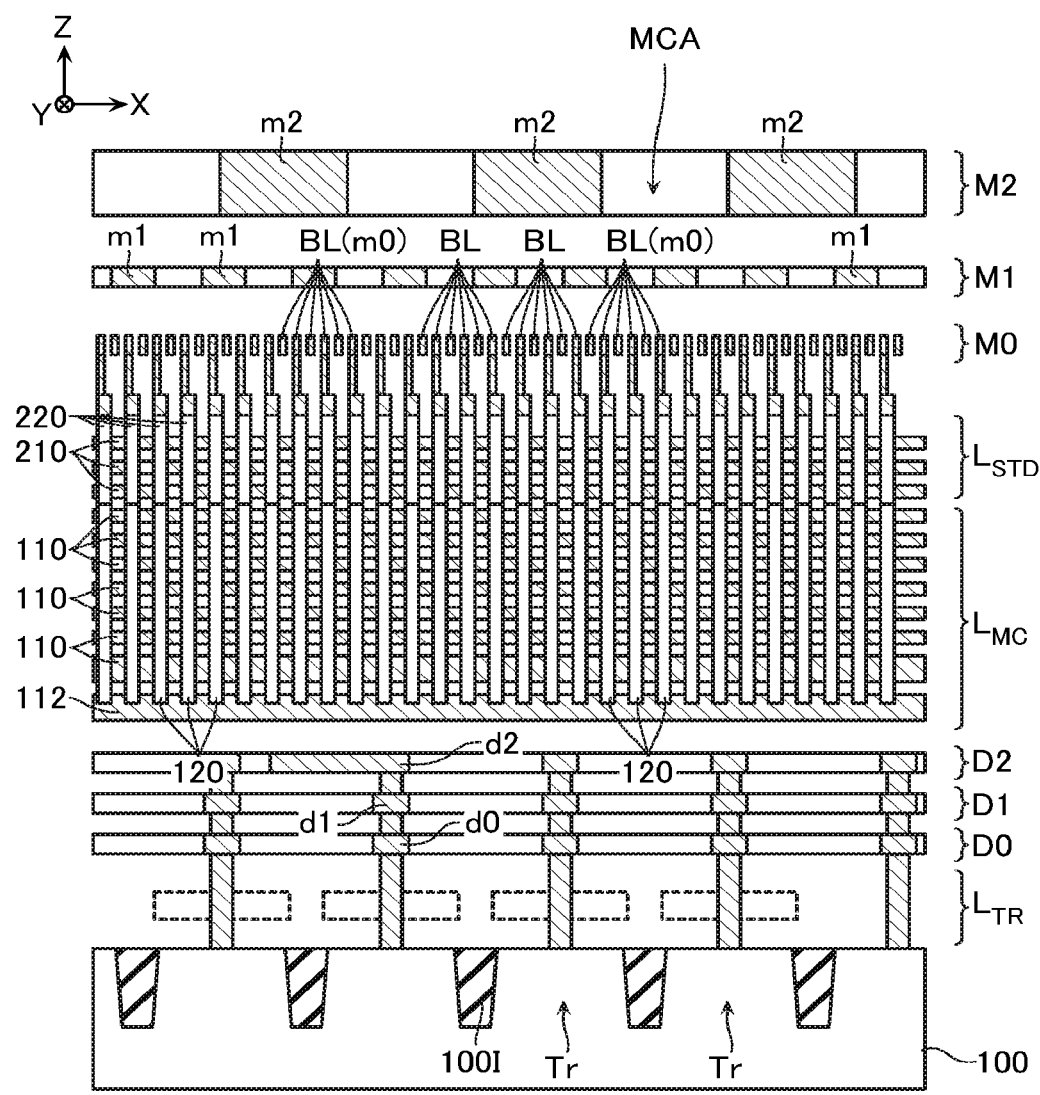
FIG. 3 is a schematic cross-sectional view showing a configuration of same semiconductor memory device.
Figure 4:
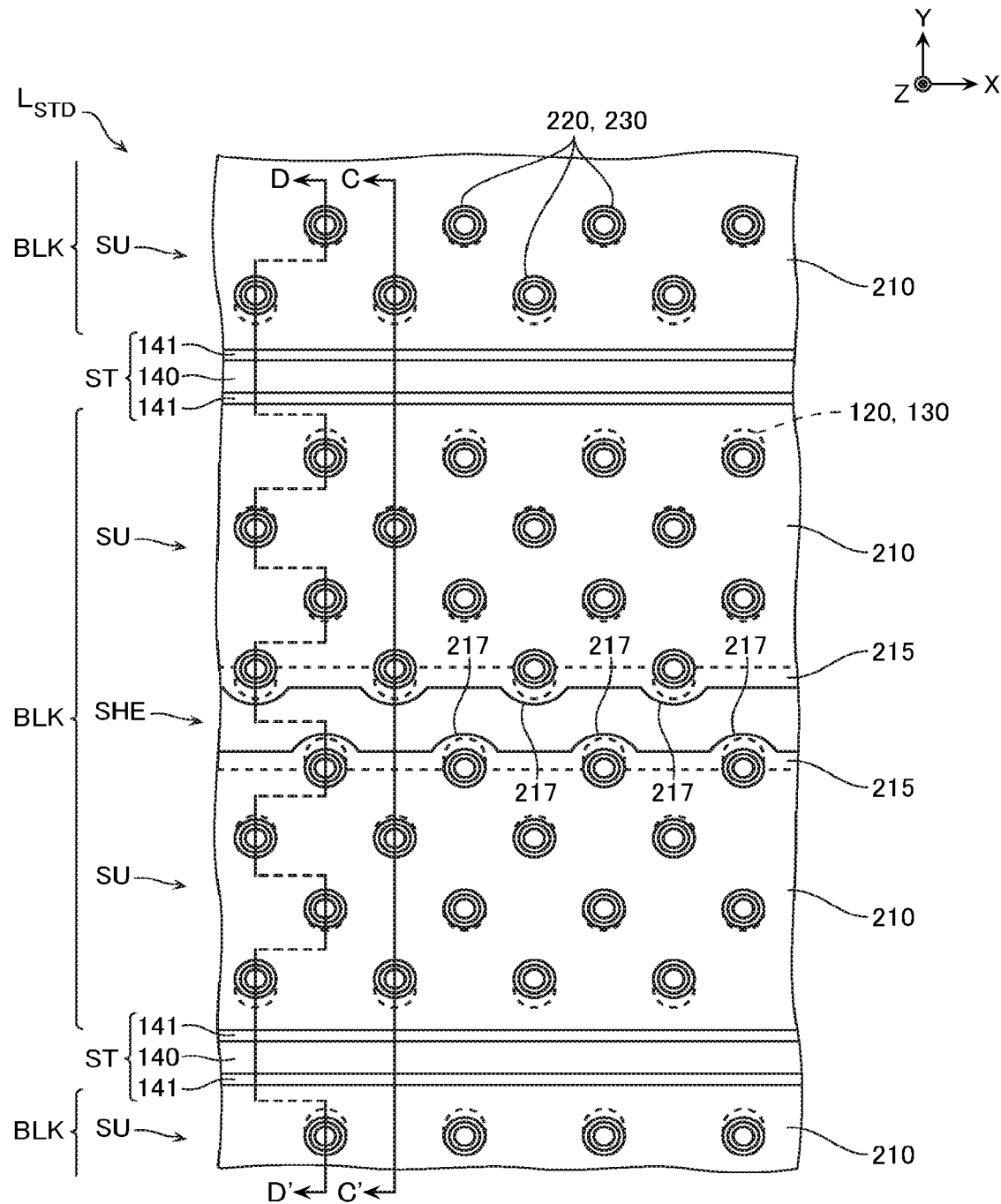
FIG. 4 is a schematic plan view showing a configuration of same semiconductor memory device.
Figure 5:
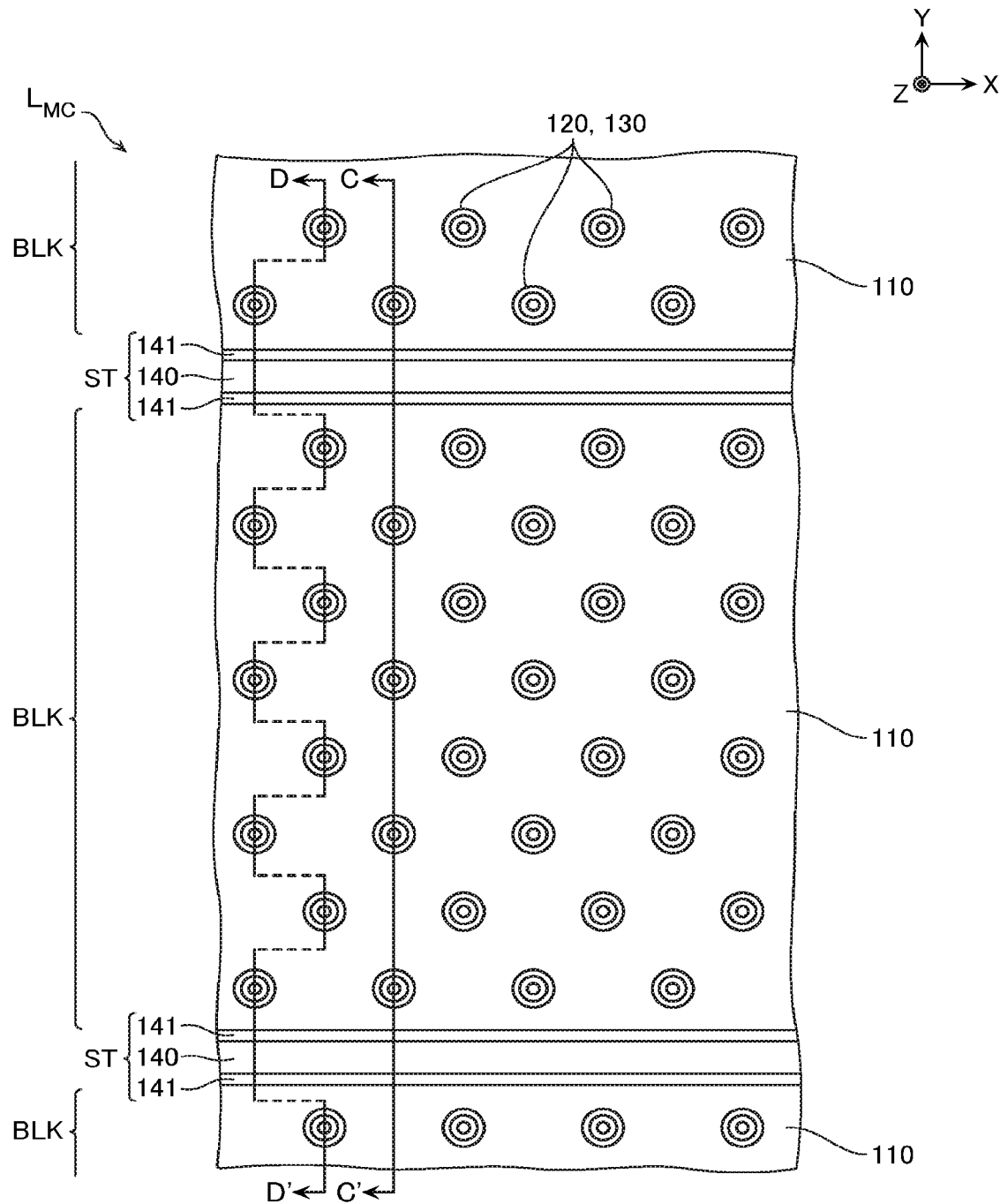
FIG. 5 is a schematic plan view showing a configuration of same semiconductor memory device.
Figure 6:
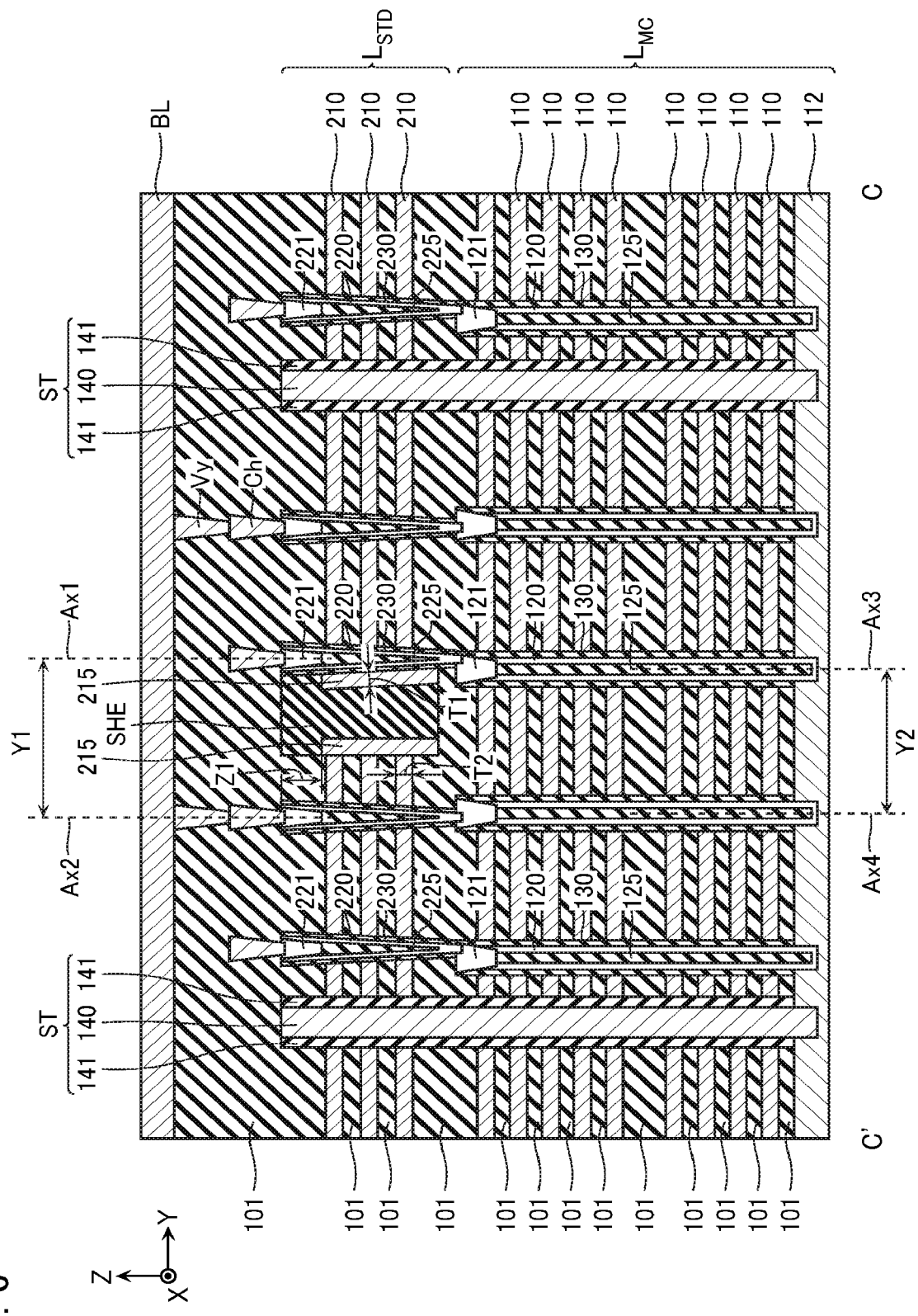
FIG. 6 is a schematic cross-sectional view showing a configuration of same semiconductor memory device.
Figure 7:
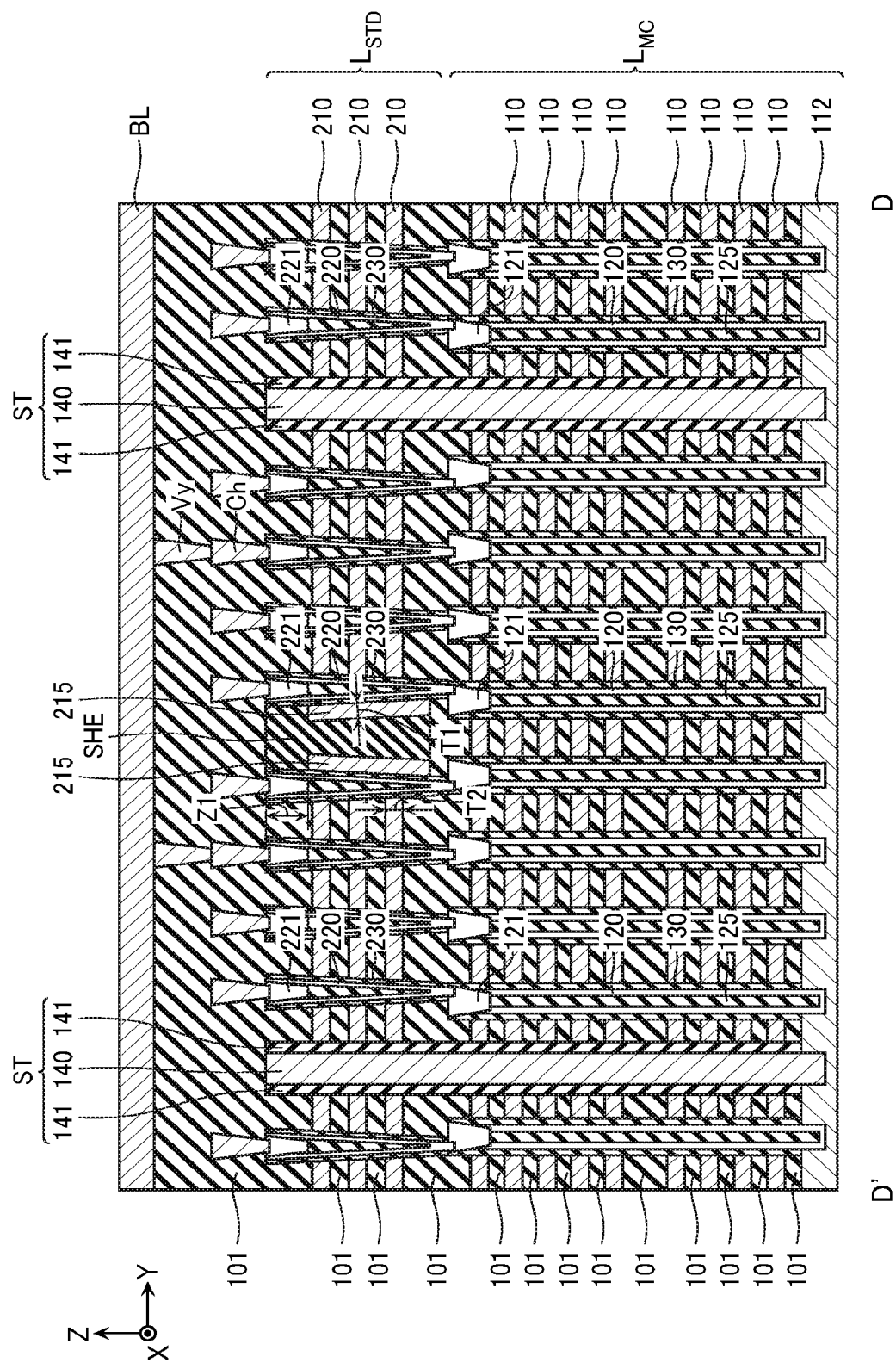
FIG. 7 is a schematic cross-sectional view showing a configuration of same semiconductor memory device.
Figure 8:
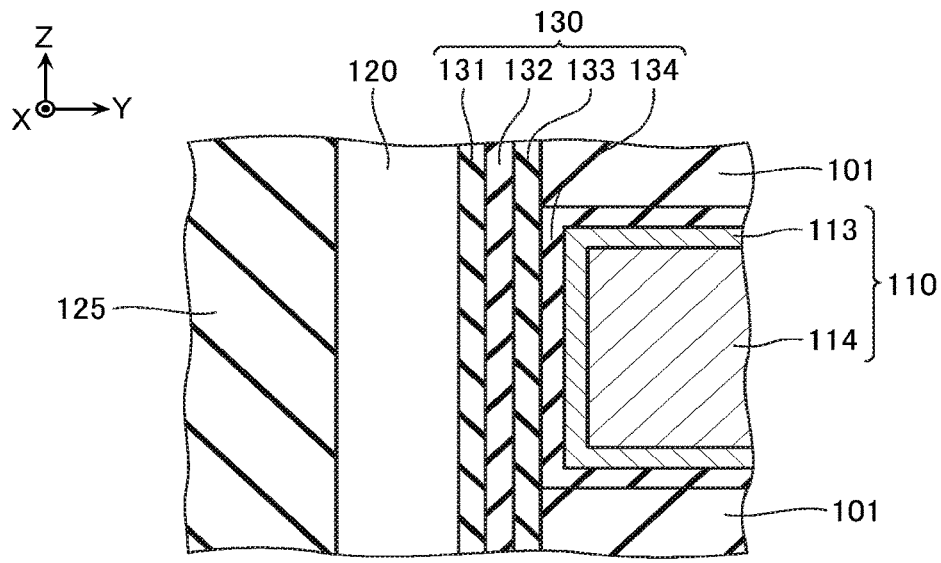
FIG. 8 is a schematic cross-sectional view showing a configuration of same semiconductor memory device.
Figure 9:
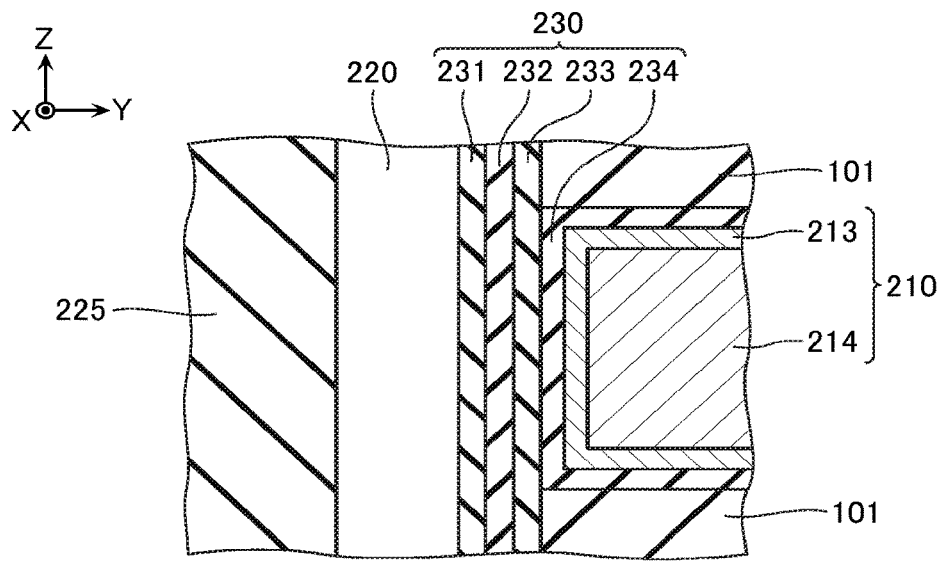
FIG. 9 is a schematic cross-sectional view showing a configuration of same semiconductor memory device.
Figure 10:
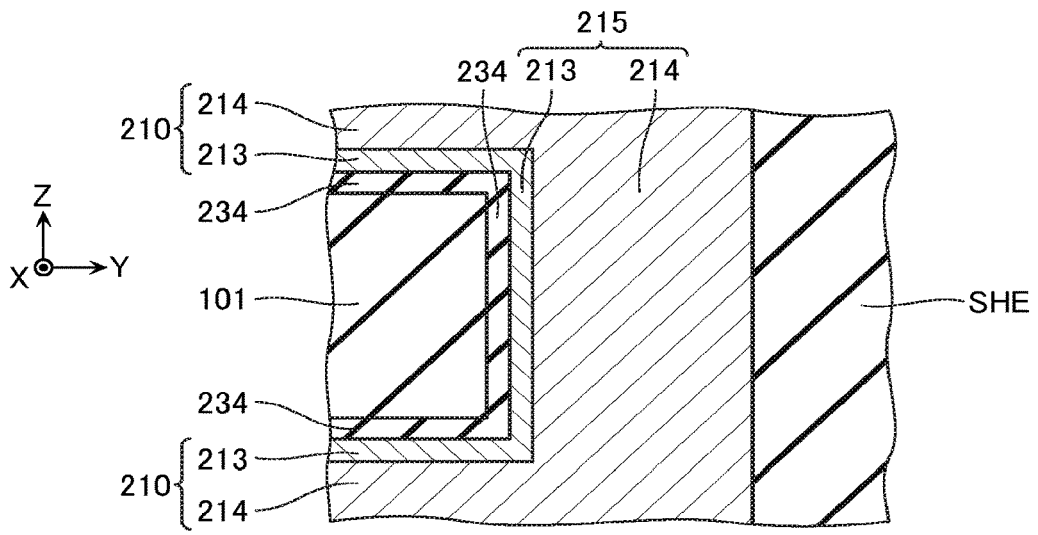
FIG. 10 is a schematic cross-sectional view showing a configuration of same semiconductor memory device.

FIG. 2 is a schematic plan view of the semiconductor memory device according to the present embodiment. FIG. 3 is a schematic cross-sectional view in which the structure shown in FIG. 2 has been cut along the line A-A' and viewed along the direction of the arrows. FIGS. 4 and 5 are schematic plan views (XY cross-sectional views) corresponding to the portion indicated by B of FIG. 2. FIGS. 4 and 5 show XY cross sections at height positions that differ from each other. FIG. 6 is a schematic cross-sectional view in which the structure shown in FIGS. 4 and 5 has been cut along the line C-C' and viewed along the direction of the arrows. FIG. 7 is a schematic cross-sectional view in which the structure shown in FIGS. 4 and 5 has been cut along the line D-D' and viewed along the direction of the arrows. FIGS. 8, 9, and 10 are schematic enlarged views of parts of the structure shown in FIG. 6.

The semiconductor memory device according to the present embodiment comprises a semiconductor substrate 100, as shown in FIG. 2, for example. In the example illustrated, the semiconductor substrate 100 is provided with four memory cell array regions $R_{MCA}$ arranged in the X direction and the Y direction. Moreover, an end portion in the Y direction of the semiconductor substrate 100 is provided with a peripheral region $R_P$.

In addition, as shown in FIG. 3, for example, the semiconductor memory device according to the present embodiment comprises: the semiconductor substrate 100; a transistor layer $L_{TR}$ provided on the semiconductor substrate 100; wiring layers D0, D1, D2 provided above the transistor layer $L_{TR}$; a memory cell layer $L_{MC}$ provided above the wiring layers D0, D1, D2; a drain side select transistor layer $L_{STD}$ provided above the memory cell layer $L_{MC}$; and wiring layers M0, M1, M2 provided above the drain side select transistor layer $L_{STD}$.

The semiconductor substrate 100 is a semiconductor substrate configured from P type silicon (Si) including a P type impurity such as boron (B), for example. A surface of the semiconductor substrate 100 is provided with the likes of: an N type well region including an N type impurity such as phosphorus (P); a P type well region including a P type impurity such as boron (B); a semiconductor substrate region where the N type well region and the P type well region are not provided; and an insulating region 100I.

The transistor layer $L_{TR}$ comprises a plurality of transistors Tr. These plurality of transistors Tr are each a field effect type of transistor adopting the surface of the semiconductor substrate 100 as its channel region. These plurality of transistors Tr configure the peripheral circuit PC.

The wiring layers D0, D1, D2 respectively comprise pluralities of wirings d0, d1, d2. These pluralities of wirings d0, d1, d2 may each include, for example, a laminated film of a barrier conductive film of the likes of titanium nitride (TiN) and a metal film of the likes of tungsten (W), or the like.

The memory cell layer $L_{MC}$ comprises parts of the plurality of memory blocks BLK arranged in the Y direction, as shown in FIG. 2, for example. Part of an inter-block structure ST is provided between two of the memory blocks BLK adjacent in the Y direction, as shown in FIG. 5, for example.

As shown in FIG. 6, for example, the memory cell layer $L_{MC}$ comprises: a plurality of conductive layers 110 arranged in the Z direction; a plurality of semiconductor layers 120 extending in the Z direction; and a plurality of gate insulating films 130 respectively provided between the plurality of conductive layers 110 and the plurality of semiconductor layers 120.

The conductive layer 110 is a substantially plate-like conductive layer extending in the X direction. The conductive layer 110 may include a laminated film of a barrier conductive film 113 of the likes of titanium nitride (TiN) and a metal film 114 of the likes of tungsten (W), or the like, as shown in FIG. 8, for example. An insulating layer 101 of the likes of silicon oxide ($SiO_2$) is provided between the plurality of conductive layers 110 arranged in the Z direction, as shown in FIG. 6.

One or a plurality of the conductive layers 110 positioned in a lowermost layer, of the plurality of conductive layers 110 function as the source side select gate line SGS (FIG. 1) and as the gate electrodes of the plurality of source side select transistors STS connected to this source side select gate line SGS. These plurality of conductive layers 110 are electrically independent every memory block BLK.

Moreover, the plurality of conductive layers 110 positioned more upwardly than these lowermost layer-positioned conductive layers 110 function as the word lines WL (FIG. 1) and as the gate electrodes of the pluralities of memory cells MC (FIG. 1) connected to these word lines WL. These plurality of conductive layers 110 are each electrically independent every memory block BLK.

A conductive layer 112 is provided below the conductive layers 110. The conductive layer 112 may include the likes of polycrystalline silicon including an impurity such as phosphorus (P) or boron (B), for example. Moreover, the conductive layer 112 may include a conductive layer of the likes of a metal such as tungsten (W), or of the likes of tungsten silicide, or may include another conductive layer, for example. The conductive layer 112 functions as the source line SL (FIG. 1).

The semiconductor layers 120 are arranged in a certain pattern in the X direction and the Y direction, as shown in FIG. 5, for example. The semiconductor layer 120 functions as the channel regions of the plurality of memory cells MC and the source side select transistor STS included in one memory string MS (FIG. 1). The semiconductor layer 120 is a semiconductor layer of the likes of polycrystalline silicon (Si), for example. The semiconductor layer 120 has a substantially bottomed cylindrical shape, and has its central portion provided with an insulating layer 125 of the likes of silicon oxide, as shown in FIG. 6, for example. Moreover, an outer circumferential surface of the semiconductor layer 120 is surrounded by respective ones of the conductive layers 110, and faces the conductive layers 110.

An upper end portion of the semiconductor layer 120 is provided with an impurity region 121 that includes an N type impurity of the likes of phosphorus (P), or a P type impurity of the likes of boron (B). The impurity region 121 is connected to an upper end of the insulating layer 125.

The gate insulating film 130 has a substantially cylindrical shape covering the outer circumferential surface of the semiconductor layer 120. The gate insulating film 130 comprises a tunnel insulating film 131, a charge accumulating film 132, a block insulating film 133, and a high-dielectric-constant insulating film 134 that are laminated between the semiconductor layer 120 and the conductive layer 110, as shown in FIG. 8, for example. The tunnel insulating film 131 and the block insulating film 133 are insulating films of the likes of silicon oxide ($SiO_2$), for example. The charge accumulating film 132 is a film capable of accumulating a charge, of the likes of silicon nitride ($Si_3N_4$), for example. The high-dielectric-constant insulating film 134 is a metal oxide film of the likes of alumina ($Al_2O_3$), for example. The tunnel insulating film 131, the charge accumulating film 132, and the block insulating film 133 have substantially cylindrical shapes, and extend in the Z direction along the outer circumferential surface of the semiconductor layer 120. The high-dielectric-constant insulating films 134 are arranged in the Z direction correspondingly to the conductive layers 110.

As shown in FIGS. 5 and 6, for example, the inter-block structure ST comprises: a conductive layer 140 extending in the Z direction and the X direction; and an insulating layer 141 of the likes of silicon oxide ($SiO_2$) provided on a side surface of the conductive layer 140. A lower end of the conductive layer 140 is connected to the conductive layer 112. The conductive layer 140 may include, for example, a laminated film of a barrier conductive film of the likes of titanium nitride (TiN) and a metal film of the likes of tungsten (W), or the like. The conductive layer 140 functions as the source line SL (FIG. 1), for example.

The drain side select transistor layer $L_{STD}$ comprises parts of the plurality of memory blocks BLK arranged in the Y direction, as shown in FIG. 4, for example. Part of the inter-block structure ST is provided between two of the memory blocks BLK adjacent in the Y direction. The memory block BLK comprises two of the string units SU arranged in the Y direction. An inter-string unit insulating layer SHE is provided between the two string units SU adjacent in the Y direction.

As shown in FIG. 6, for example, the drain side select transistor layer $L_{STD}$ comprises: a plurality of conductive layers 210 arranged in the Z direction; a conductive layer 215 connected to one ends in the Y direction of these plurality of conductive layers 210; a plurality of semiconductor layers 220 extending in the Z direction; and a plurality of gate insulating films 230 respectively provided between the plurality of conductive layers 210 and the plurality of semiconductor layers 220.

The conductive layer 210 is a substantially plate-like conductive layer extending in the X direction. The conductive layer 210 may include a laminated film of a barrier conductive film 213 of the likes of titanium nitride (TiN) and a metal film 214 of the likes of tungsten (W), or the like, as shown in FIG. 9, for example. The insulating layer 101 of the likes of silicon oxide ($SiO_2$) is provided between the plurality of conductive layers 210 arranged in the Z direction, as shown in FIG. 6.

The conductive layer 210 functions as the drain side select gate line SGD and as the gate electrodes of the plurality of drain side select transistors STD (FIG. 5) connected to this drain side select gate line SGD. These plurality of conductive layers 210 are each electrically independent every string unit SU.

A width in the Y direction of the conductive layer 210 is smaller than a width in the Y direction of the conductive layer 110. For example, in the example of FIG. 6, two conductive layers 210 arranged in the Y direction and one inter-string unit insulating layer SHE provided therebetween are provided correspondingly to one conductive layer 110. Hence, in the example illustrated, the width in the Y direction of the conductive layer 210 is smaller than ½ (half) of the width in the Y direction of the conductive layer 110.

An end portion on one side in the Y direction of the conductive layer 210 is formed substantially linearly along the inter-block structure ST extending linearly in the X direction, as shown in FIG. 4, for example. Moreover, an end portion on the other side in the Y direction of the conductive layer 210 is connected to the gate insulating films 230 and the conductive layer 215.

The conductive layer 215 is a substantially plate-like conductive layer extending in the X direction. The conductive layer 215 may include a laminated film of the barrier conductive film 213 of the likes of titanium nitride (TiN) and the metal film 214 of the likes of tungsten (W), or the like, as shown in FIG. 10, for example. Note that the barrier conductive film 213 and the metal film 214 in the conductive layer 215 are respectively formed continuously with the barrier conductive film 213 and the metal film 214 in the conductive layer 210. The conductive layer 215 comprises a plurality of portions 217 that are provided correspondingly to the plurality of semiconductor layers 220 arranged in the X direction, as shown in FIG. 4, for example. The portion 217 is formed in a shape of a curved surface extending in the Z direction along an outer circumferential surface of the semiconductor layer 220. The plurality of portions 217 are provided in the X direction correspondingly to an arrangement period of the plurality of the semiconductor layers 220 arranged in the X direction.

A thickness T1 (FIG. 6) in the Y direction of the conductive layer 215 is at least larger than half the thickness (T2/2) of a thickness T2 (FIG. 6) in the Z direction of the conductive layer 210. The thickness T1 may be of the same degree as the thickness T2, or may be larger than the thickness T2. Note that the thickness T1 in the Y direction of the conductive layer 215 may be a shortest distance between a contact surface with the gate insulating film 230 of the conductive layer 215 and a contact surface with the inter-string unit insulating layer SHE of the conductive layer 215, in a cross section of the kind exemplified in FIG. 6, for example.

In the example of FIG. 6, for example, a lower end of the conductive layer 215 is positioned more upwardly than a lower end of the semiconductor layer 220 and more downwardly than a lower surface of the most downwardly positioned conductive layer 210. Moreover, an upper end of the conductive layer 215 is positioned more downwardly than an upper end of the semiconductor layer 220 and more upwardly than an upper surface of the most upwardly positioned conductive layer 210. However, a position in the Z direction of the upper end of the conductive layer 215 may coincide with a position in the Z direction of the upper surface of the most upwardly positioned conductive layer 210, for example. Note that in the example of FIG. 6, a difference Z1 between the position in the Z direction of the upper end of the conductive layer 215 and a position in the Z direction of an upper surface of an impurity region 221 is larger than the thickness T1 of the conductive layer 215.

The semiconductor layers 220 are arranged in a certain pattern in the X direction and the Y direction, as shown in FIG. 4, for example. The semiconductor layer 220 functions as the channel regions of the plurality of drain side select transistors STD included in one memory string MS (FIG. 5). The semiconductor layer 220 is a semiconductor layer of the likes of polycrystalline silicon (Si), for example. The semiconductor layer 220 has a substantially bottomed cylindrical shape, and has its central portion provided with an insulating layer 225 of the likes of silicon oxide, as shown in FIG. 6, for example. Moreover, the outer circumferential surface of the semiconductor layer 220 is surrounded by respective ones of the conductive layers 210 and 215, and faces the conductive layers 210 and 215.

An upper end portion of the semiconductor layer 220 is provided with the impurity region 221 that includes an N type impurity of the likes of phosphorus (P). The impurity region 221 is connected to an upper end of the insulating layer 225. Moreover, the impurity region 221 is connected to the bit line BL via a contact Ch and a contact Vy (FIG. 6). Note that a lower end portion of the semiconductor layer 220 is connected to an impurity region 121.

Note that in the present embodiment, a central position in the XY plane of the semiconductor layer 220 does not coincide with a central position in the XY plane of the semiconductor layer 120.

For example, as shown in FIG. 5, the semiconductor layers 120 are provided over eight columns correspondingly to one memory block BLK. These columns each include a plurality of the semiconductor layers 120 arranged in the X direction. Moreover, distances in the Y direction between fellow ones of these columns are substantially uniform.

Moreover, as shown in FIG. 4, for example, the semiconductor layers 220 too are similarly provided over eight columns correspondingly to one memory block BLK. These columns each include a plurality of the semiconductor layers 220 arranged in the X direction. Now, as shown in FIG. 7, for example, the semiconductor layers 220 corresponding to the first and eighth columns counting from one side in the Y direction are provided at positions closer to the inter-string unit insulating layer SHE than the semiconductor layers 120 connected to them are. Moreover, the semiconductor layers 220 corresponding to the fourth and fifth columns counting from one side in the Y direction are provided at positions further from the inter-string unit insulating layer SHE than the semiconductor layers 120 connected to them are. Hence, in the cross section of the kind shown in FIG. 6, for example, when a distance in the Y direction from a central axis Ax1 of the third (in FIG. 7, the fifth) semiconductor layer 220 counting from one side in the Y direction (for example, the left side of FIG. 6) to a central axis Ax2 of the second (in FIG. 7, the third) semiconductor layer 220 counting from one side in the Y direction is assumed to be Y1, and a distance in the Y direction from a central axis Ax3 of the third (in FIG. 7, the fifth) semiconductor layer 120 counting from one side in the Y direction to a central axis Ax4 of the second (in FIG. 7, the third) semiconductor layer 120 counting from one side in the Y direction is assumed to be Y2, Y1 is larger than Y2.

The gate insulating film 230 has a substantially cylindrical shape covering the outer circumferential surface of the semiconductor layer 220. The gate insulating film 230 comprises a tunnel insulating film 231, a charge accumulating film 232, a block insulating film 233, and a high-dielectric-constant insulating film 234 that are laminated between the semiconductor layer 220 and the conductive layers 210 and 215, as shown in FIG. 9, for example. The tunnel insulating film 231 and the block insulating film 233 are insulating films of the likes of silicon oxide ($SiO_2$), for example. The charge accumulating film 232 is a film capable of accumulating a charge, of the likes of silicon nitride ($Si_3N_4$), for example. The high-dielectric-constant insulating film 234 is a metal oxide film of the likes of alumina ($Al_2O_3$), for example. The tunnel insulating film 231, the charge accumulating film 232, and the block insulating film 233 have substantially cylindrical shapes, and extend in the Z direction along the outer circumferential surface of the semiconductor layer 220. The high-dielectric-constant insulating films 234 are arranged in the Z direction correspondingly to the conductive layers 210. Note that, as shown in FIG. 10, for example, the high-dielectric-constant insulating film 234 is formed too on an upper surface, a lower surface, and a surface facing the conductive layer 215, of the insulating layer 101.

The wiring layers M0, M1, M2 respectively comprise pluralities of wirings m0, m1, m2, as shown in FIG. 3, for example. These pluralities of wirings m0, m1, m2 may each include, for example, a laminated film of a barrier conductive film of the likes of titanium nitride (TiN) and a metal film of the likes of copper (Cu) or aluminum (Al), or the like. Note that in the example illustrated, part of the wiring m0 functions as the bit line BL. The bit lines BL are arranged in the X direction, and extend in the Y direction.

[Manufacturing Method]

Next, a manufacturing method of the semiconductor memory device according to the present embodiment will be described with reference to FIGS. 11 to 38. FIGS. 11 to 38, which are schematic cross-sectional views for explaining same manufacturing method, each show a cross section corresponding to FIG. 7.

When manufacturing the semiconductor memory device according to the present embodiment, first, the transistor layer $L_{TR}$, the wiring layer D0, the wiring layer D1, and the wiring layer D2 are formed on the semiconductor substrate 100 described with reference to FIG. 3.

Figure 11:
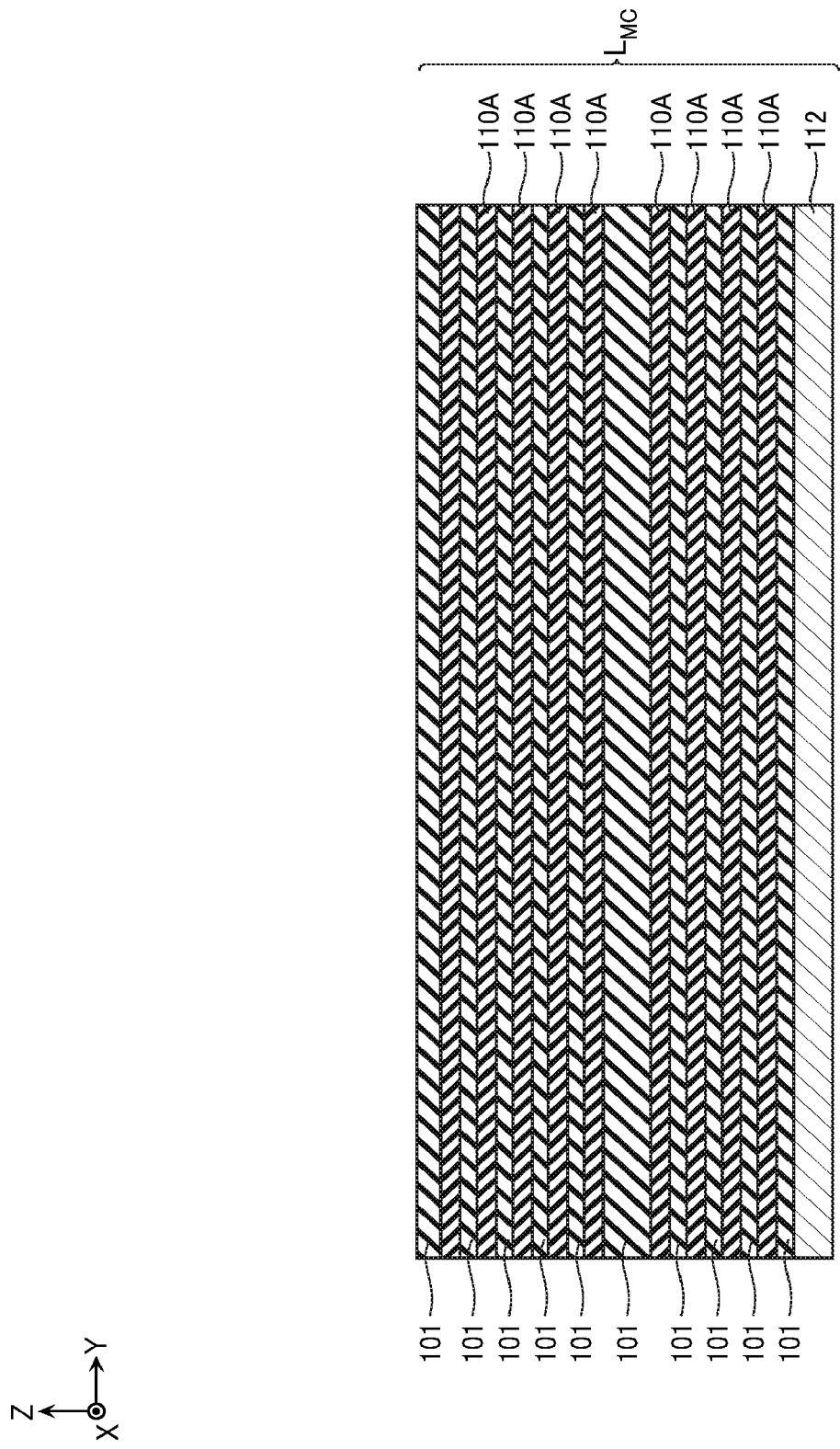
FIG. 11 is a schematic cross-sectional view for explaining a manufacturing method of the semiconductor memory device according to the first embodiment.

Next, as shown in FIG. 11, for example, the conductive layer 112 is formed above the wiring layer D2. In addition, a plurality of the insulating layers 101 and a plurality of sacrifice layers 110A are alternately formed. The sacrifice layer 110A is an insulating layer configured from the likes of silicon nitride ($Si_3N_4$), for example. This step is performed by a method such as CVD (Chemical Vapor Deposition), for example.

Figure 12:
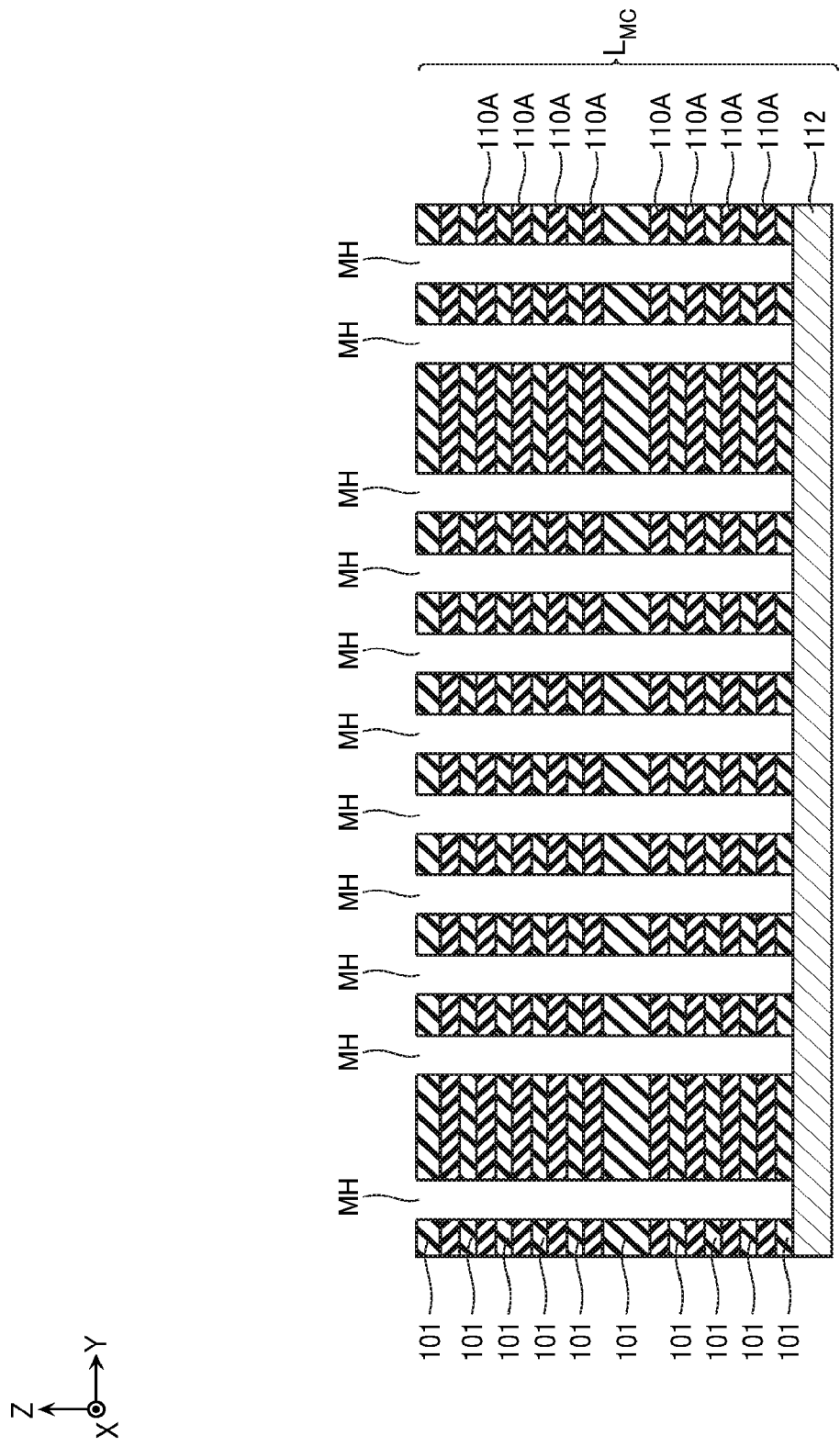
FIG. 12 is a schematic cross-sectional view for explaining same manufacturing method.

Next, as shown in FIG. 12, for example, a plurality of memory holes MH are formed at positions corresponding to the semiconductor layers 120. The memory hole MH is a through-hole that extends in the Z direction, penetrates the plurality of insulating layers 101 and sacrifice layers 110A, and exposes an upper surface of the conductive layer 112. This step is performed by a method such as RIE (Reactive Ion Etching), for example.

Figure 13:
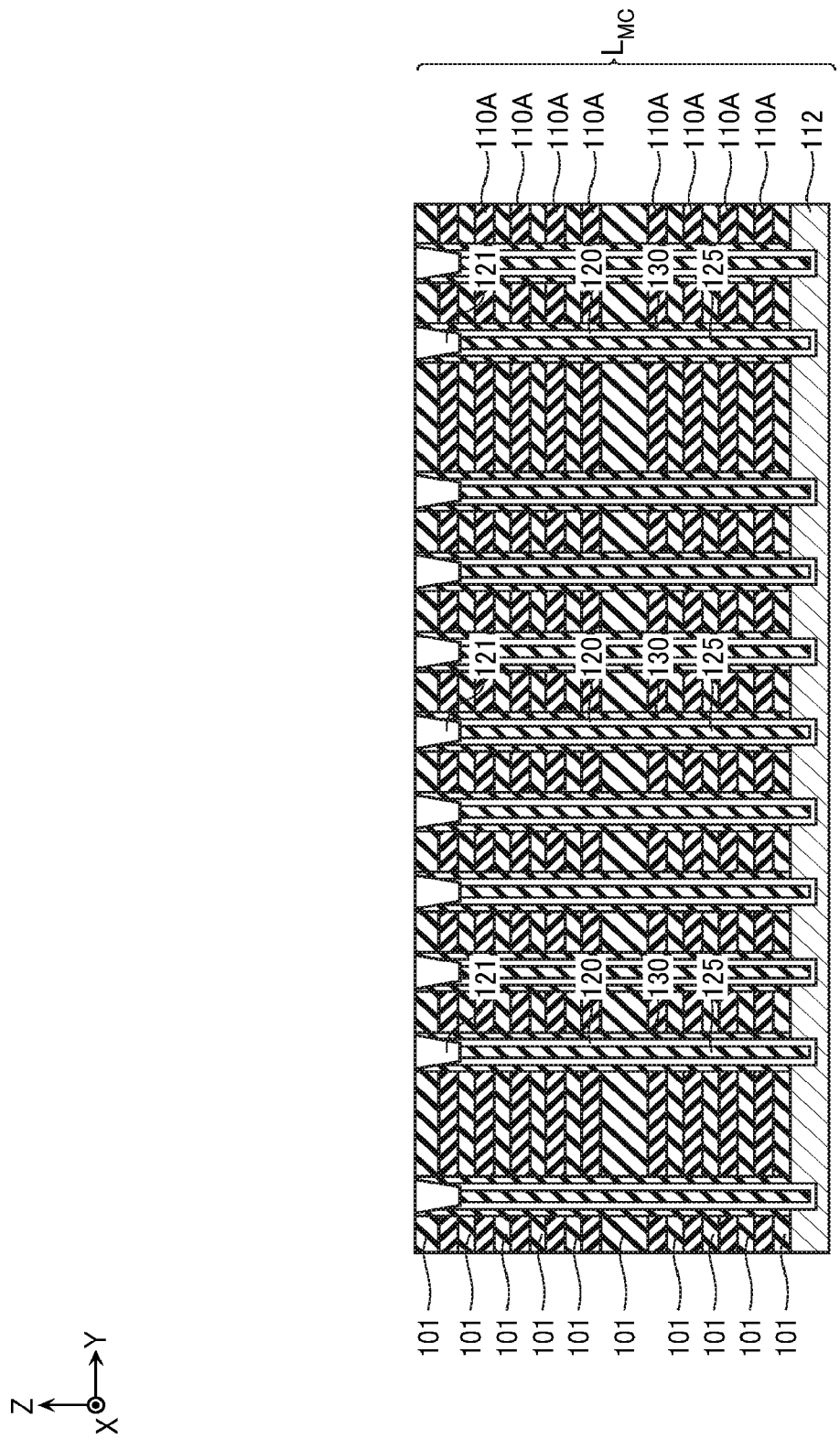
FIG. 13 is a schematic cross-sectional view for explaining same manufacturing method.

Next, as shown in FIG. 13, for example, part (the tunnel insulating film 131, the charge accumulating film 132, and the block insulating film 133) of the gate insulating film 130, the semiconductor layer 120, and the insulating layer 125 are formed on an inner circumferential surface of the memory hole MH. This step is performed by methods such as CVD and RIE, for example.

Figure 14:
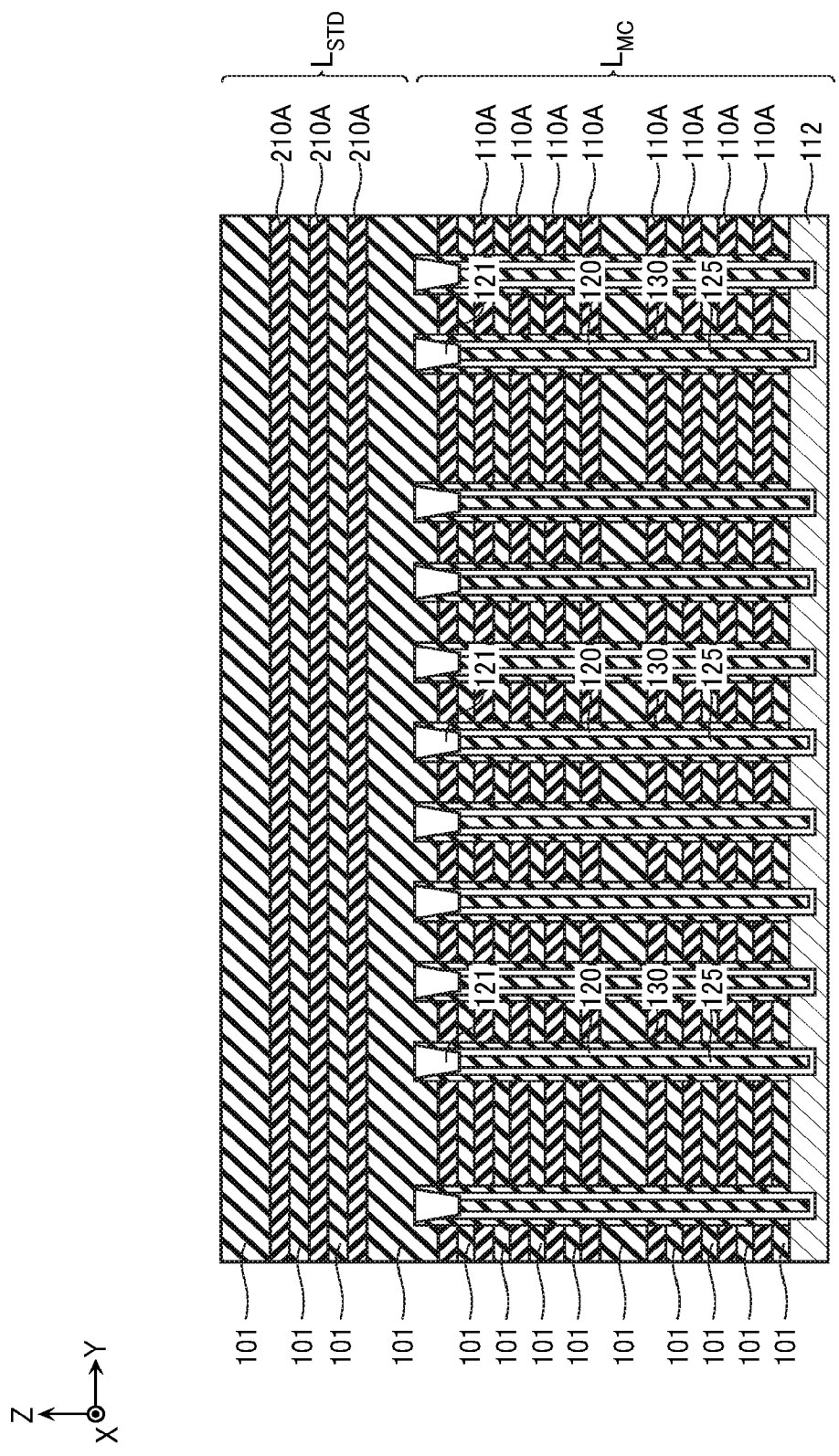
FIG. 14 is a schematic cross-sectional view for explaining same manufacturing method.

Next, as shown in FIG. 14, for example, a plurality of the insulating layers 101 and a plurality of sacrifice layers 210A are alternately formed on an upper surface of the structure described with reference to FIG. 13. The sacrifice layer 210A is an insulating layer configured from the likes of silicon nitride ($Si_3N_4$), for example. This step is performed by a method such as CVD, for example.

Figure 15:
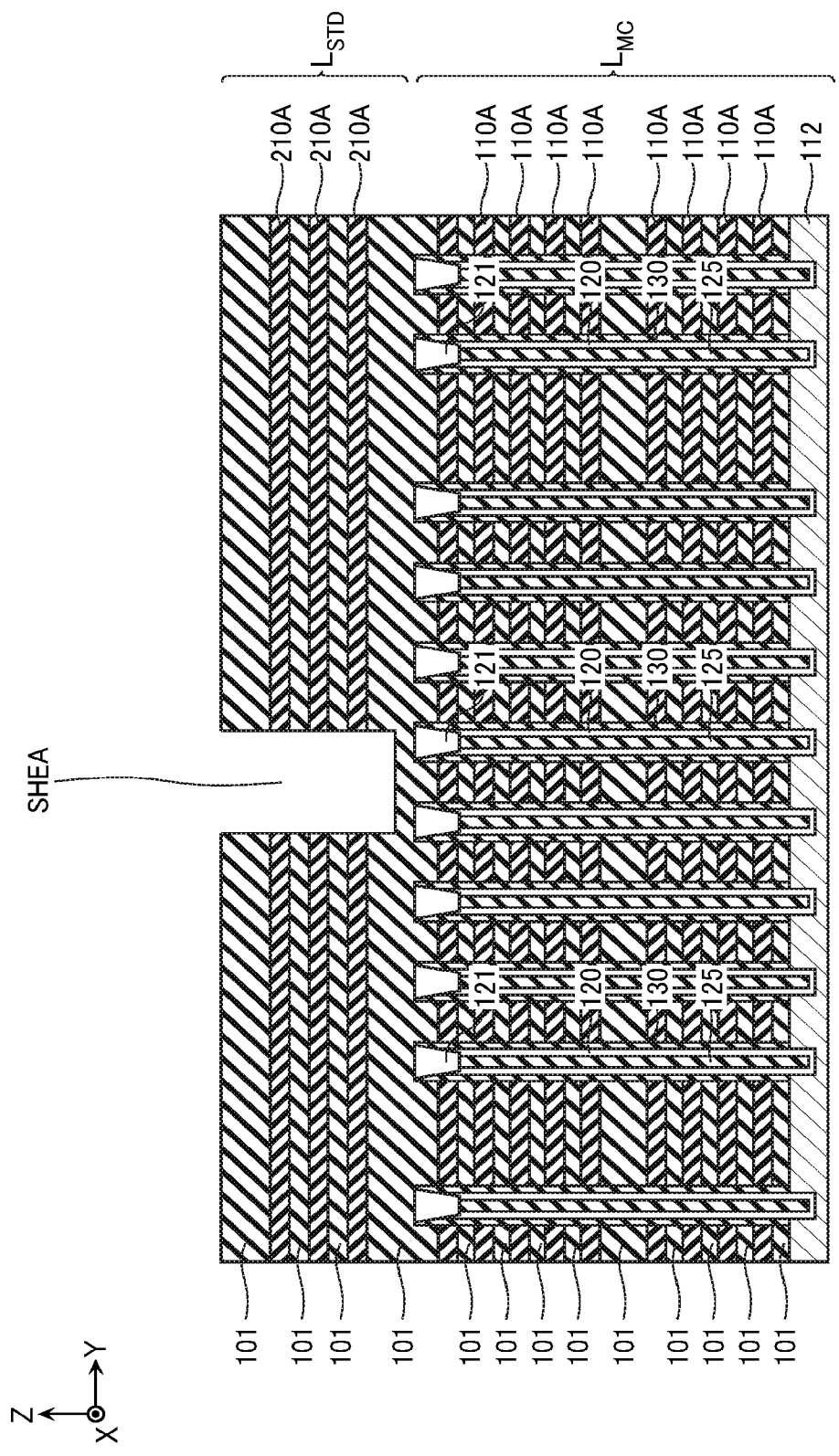
FIG. 15 is a schematic cross-sectional view for explaining same manufacturing method.

Next, as shown in FIG. 15, for example, a trench SHEA is formed at a position corresponding to the inter-string unit insulating layer SHE. The trench SHEA is a trench that extends in the Z direction and the X direction, and divides the insulating layers 101 and the sacrifice layers 210A in the Y direction. This step is performed by a method such as RIE, for example.

Figure 16:
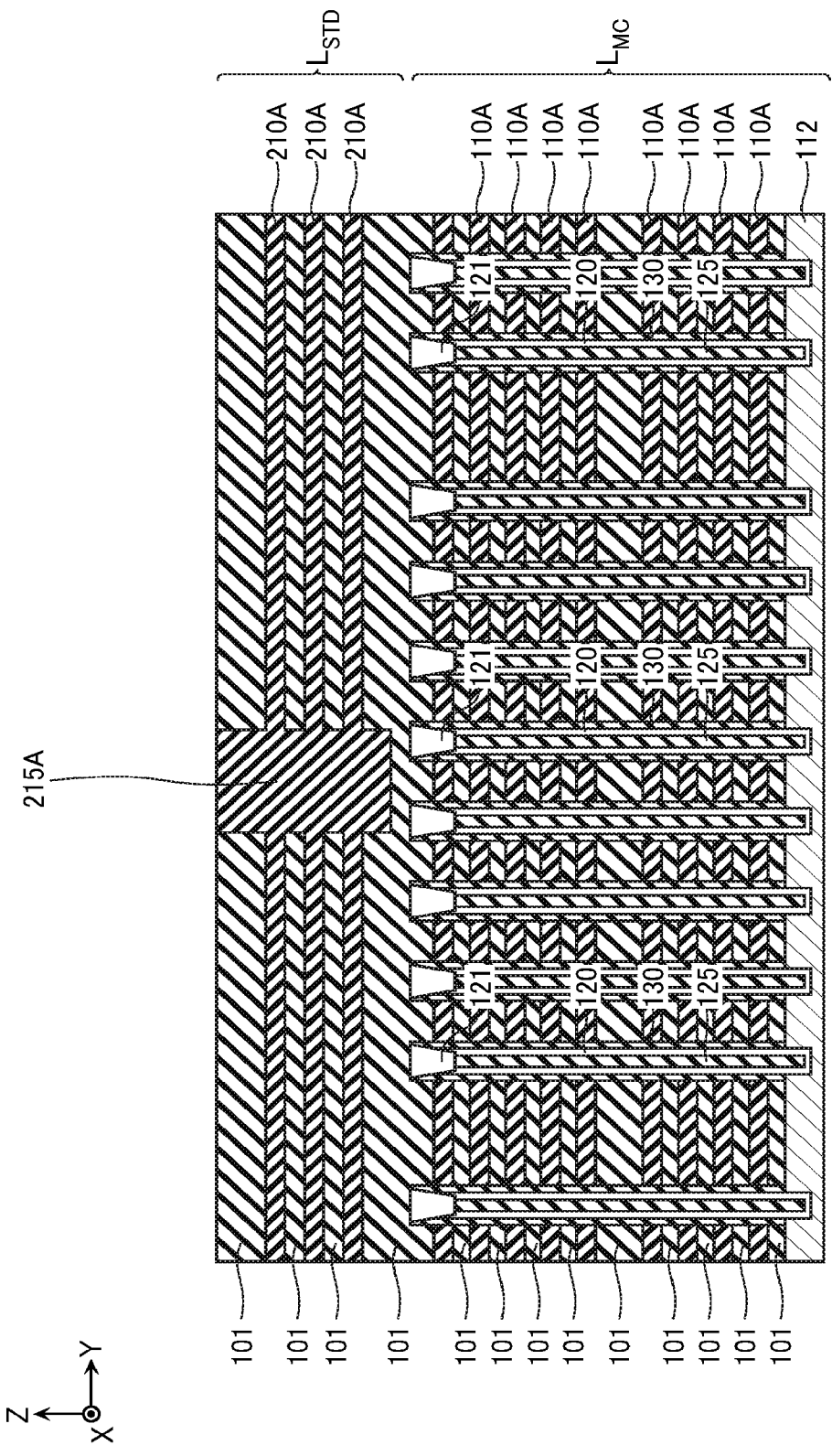
FIG. 16 is a schematic cross-sectional view for explaining same manufacturing method.

Next, as shown in FIG. 16, for example, a sacrifice layer 215A is formed inside the trench SHEA. The sacrifice layer 215A is an insulating layer configured from the likes of silicon nitride ($Si_3N_4$), for example. This step is performed by a method such as CVD, for example.

Figure 17:
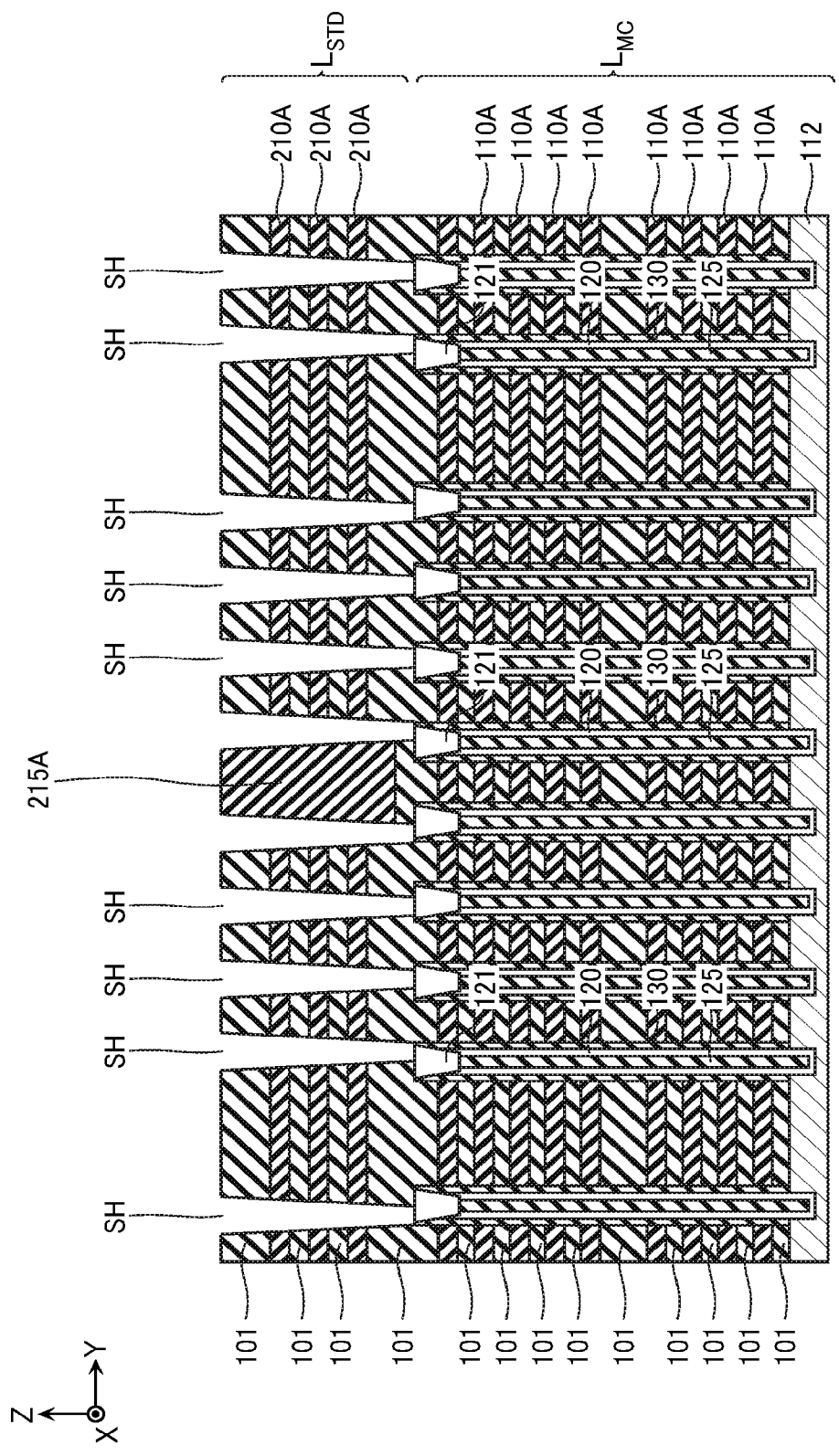
FIG. 17 is a schematic cross-sectional view for explaining same manufacturing method.

Next, as shown in FIG. 17, for example, a plurality of transistor holes SH are formed at positions corresponding to the semiconductor layers 220. The transistor hole SH is a through-hole that extends in the Z direction, and penetrates the plurality of insulating layers 101 and sacrifice layers 210A. This step is performed by a method such as RIE, for example.

Figure 18:
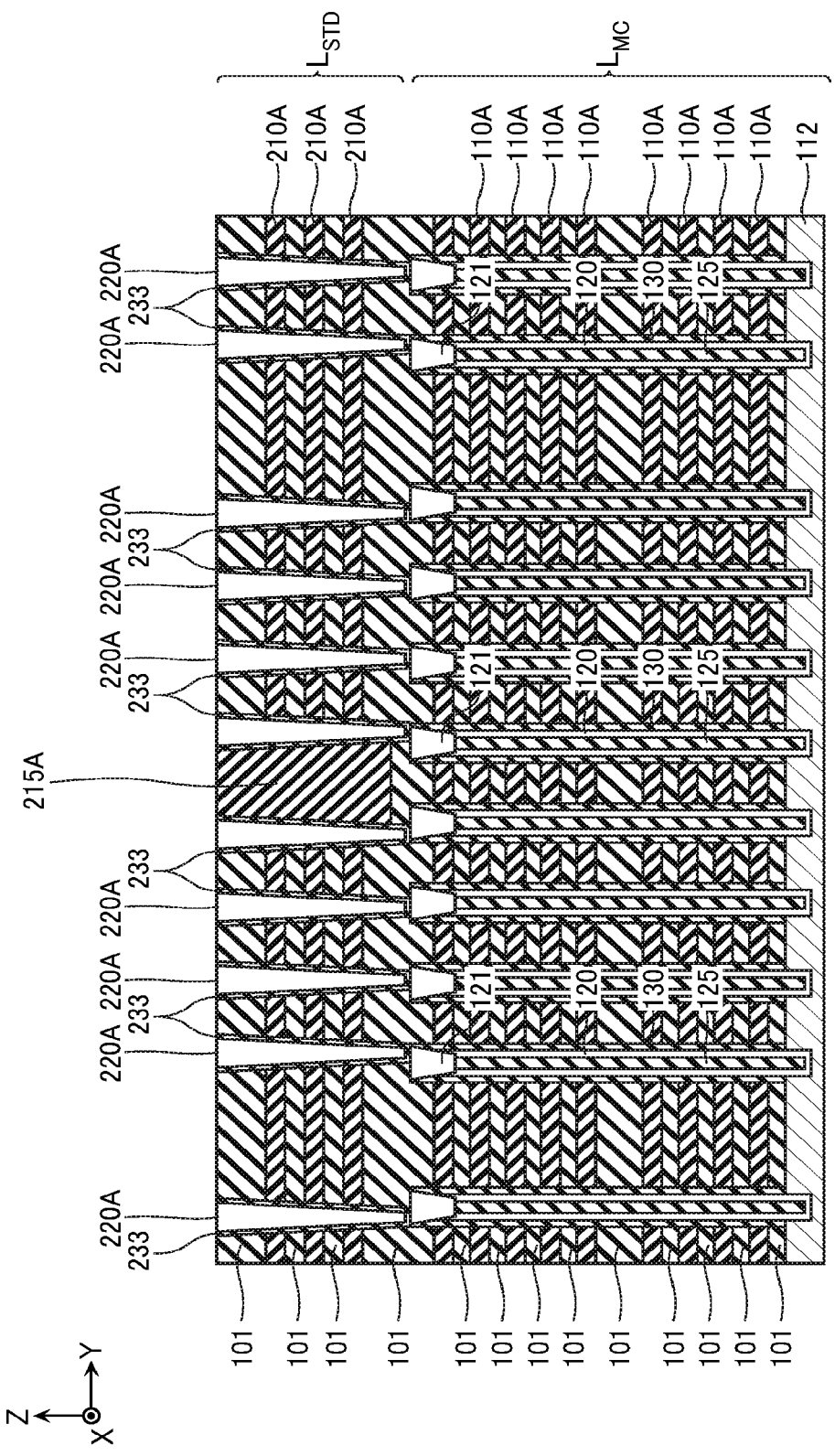
FIG. 18 is a schematic cross-sectional view for explaining same manufacturing method.

Next, as shown in FIG. 18, for example, the block insulating film 233 and a sacrifice layer 220A are formed on an inner circumferential surface of the transistor hole SH. The sacrifice layer 220A is of the likes of carbon (C), for example. This step is performed by methods such as CVD, and RIE or CMP (Chemical Mechanical Polishing), for example.

Figure 19:
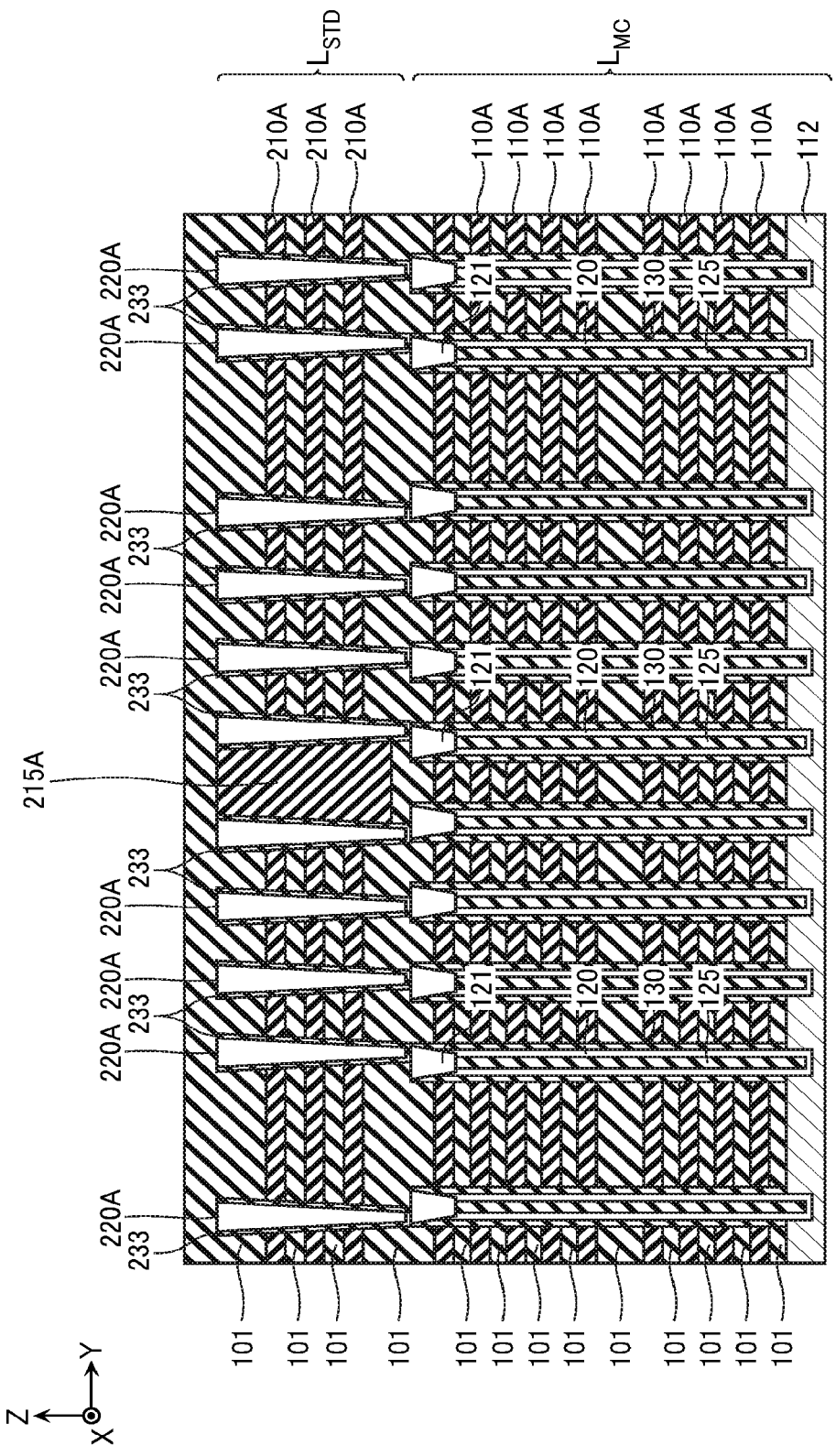
FIG. 19 is a schematic cross-sectional view for explaining same manufacturing method.

Next, as shown in FIG. 19, for example, the insulating layer 101 is formed on an upper surface of the structure described with reference to FIG. 18. This step is performed by a method such as CVD, for example.

Figure 20:
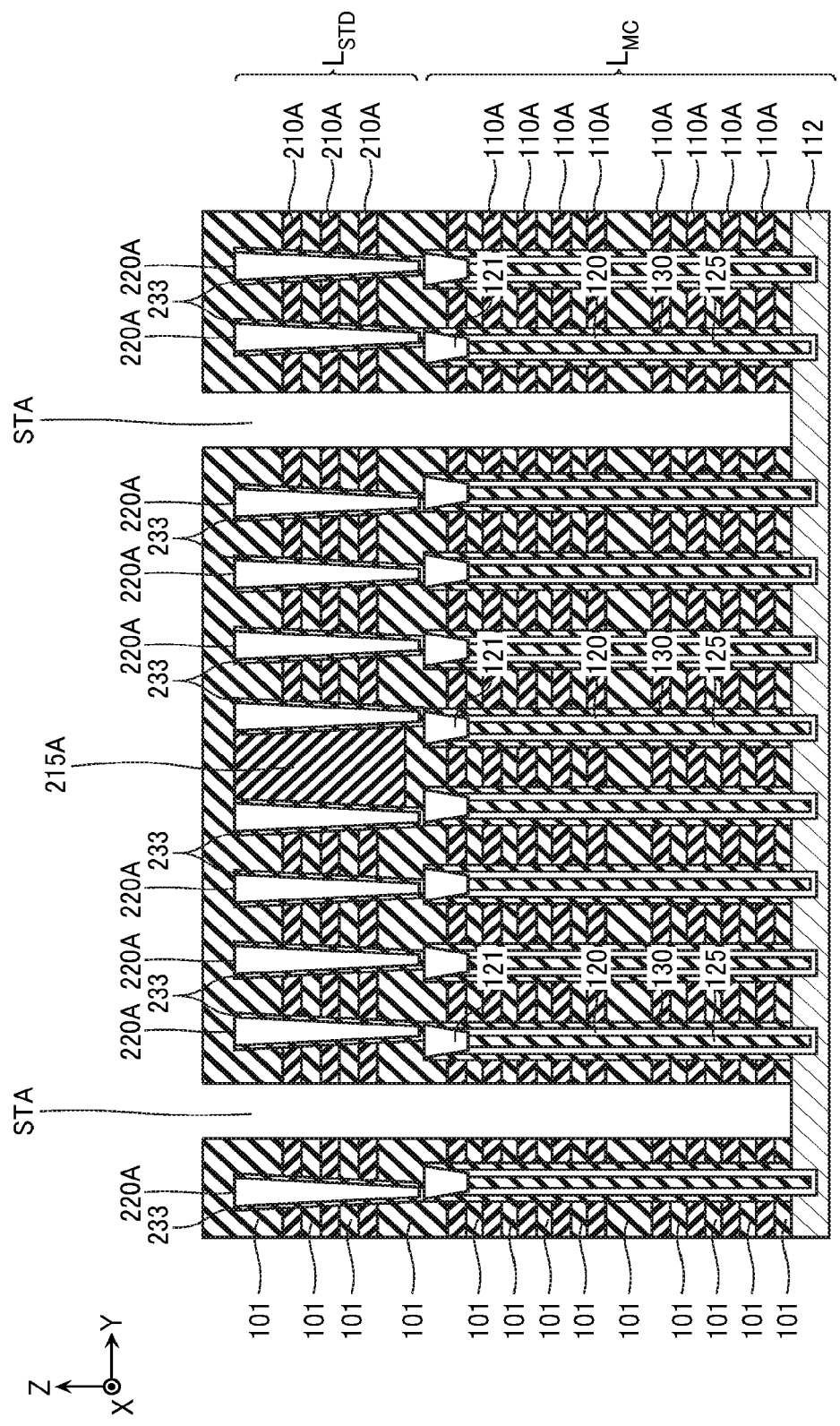
FIG. 20 is a schematic cross-sectional view for explaining same manufacturing method.

Next, as shown in FIG. 20, for example, a trench STA is formed at a position corresponding to the inter-block structure ST. The trench STA is a trench that extends in the Z direction and the X direction, divides the plurality of insulating layers 101, sacrifice layers 110A, and sacrifice layers 210A in the Y direction, and exposes the upper surface of the conductive layer 112. This step is performed by a method such as RIE, for example.

Figure 21:
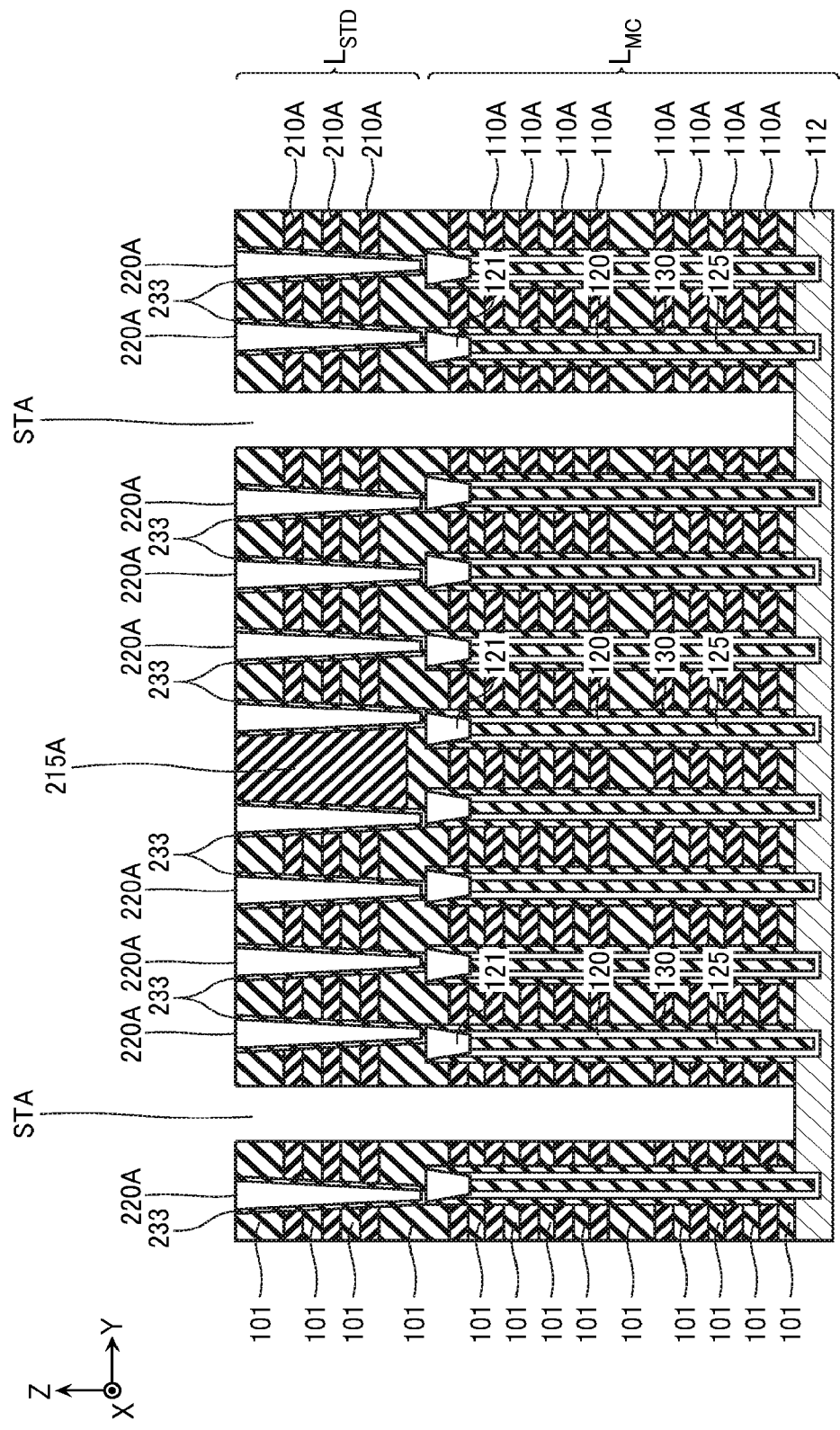
FIG. 21 is a schematic cross-sectional view for explaining same manufacturing method.

Next, as shown in FIG. 21, for example, part of the insulating layer 101 is removed to expose an upper surface of the sacrifice layer 215A. This step is performed by a method such as etching-back-by-RIE, for example.

Figure 22:
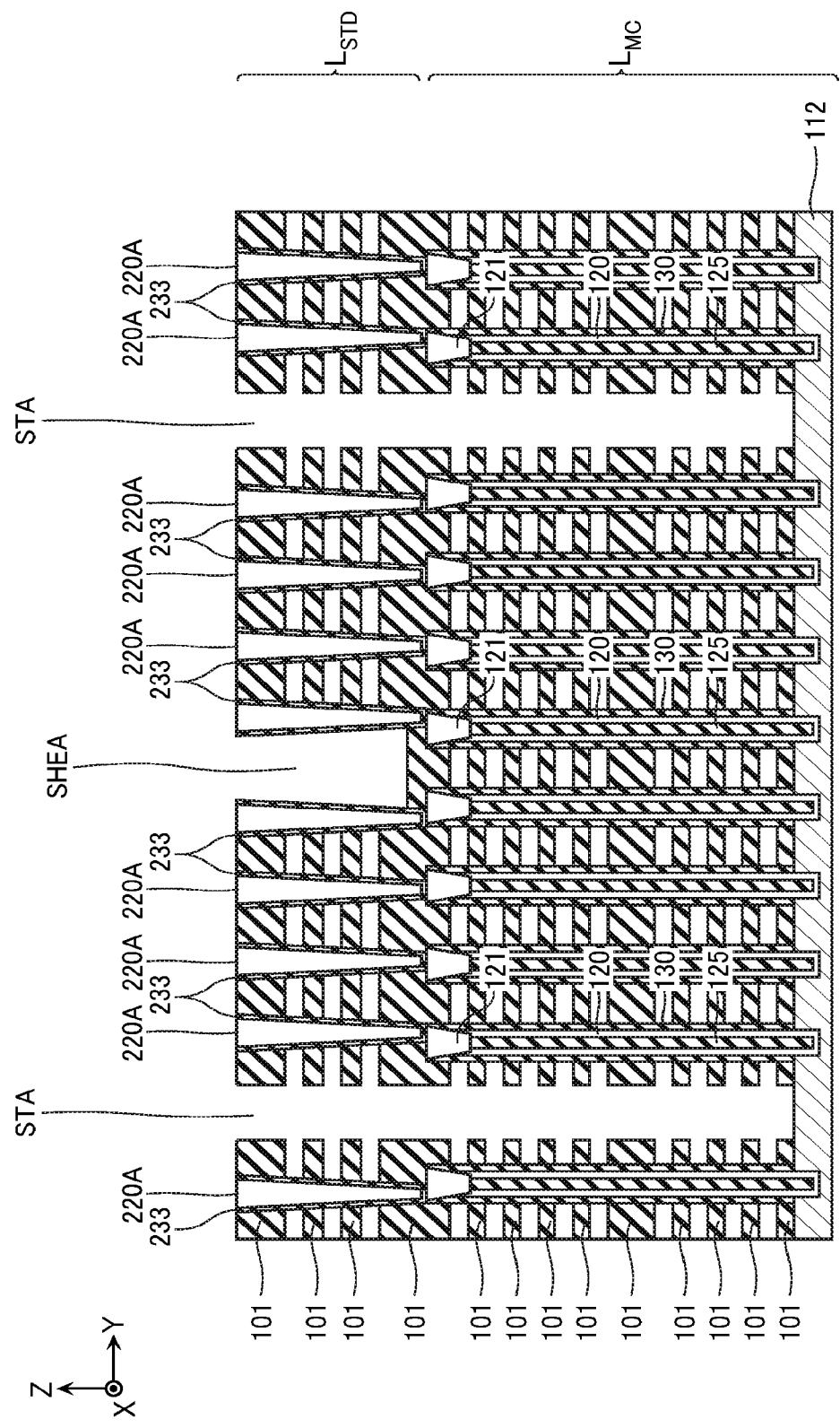
FIG. 22 is a schematic cross-sectional view for explaining same manufacturing method.

Next, as shown in FIG. 22, for example, the sacrifice layers 110A, the sacrifice layers 210A, and the sacrifice layer 215A are removed. As a result, there is formed a hollow structure that includes: the plurality of insulating layers 101 arranged in the Z direction; and structures within the memory holes MH (the semiconductor layer 120, part of the gate insulating film 130, and the insulating layer 125) and structures within the transistor holes SH (the sacrifice layer 220A and the block insulating film 233) that support these insulating layers 101. This step is performed by a method such as wet etching, for example.

Figure 23:
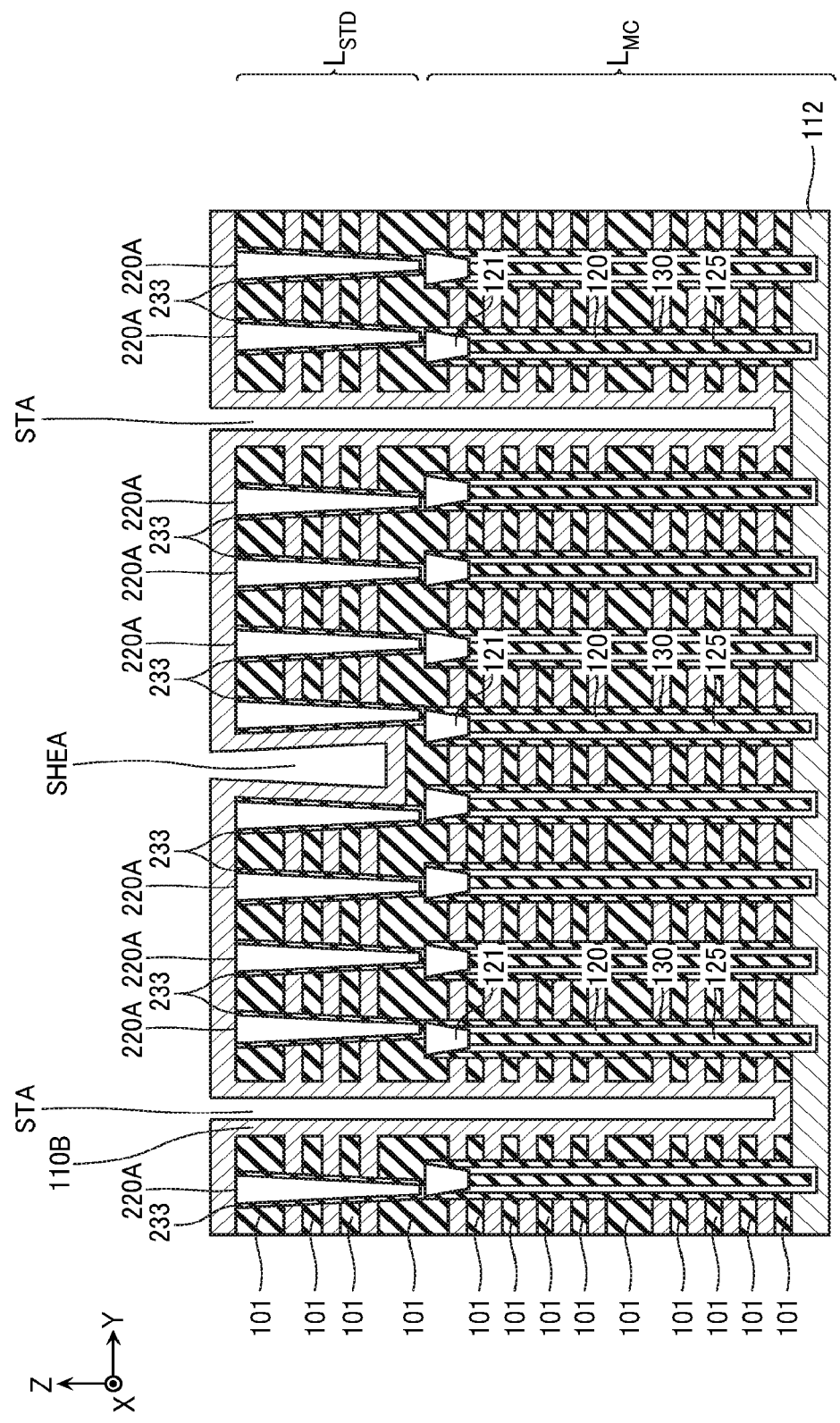
FIG. 23 is a schematic cross-sectional view for explaining same manufacturing method.

Next, as shown in FIG. 23, for example, the high-dielectric-constant insulating films 134, 234 that are not illustrated, and a conductive layer 110B are formed on upper surfaces, lower surfaces, and side surfaces in the Y direction of the insulating layers 101, and on the upper surface of the conductive layer 112. This step is performed by a method such as CVD, for example.

Figure 24:
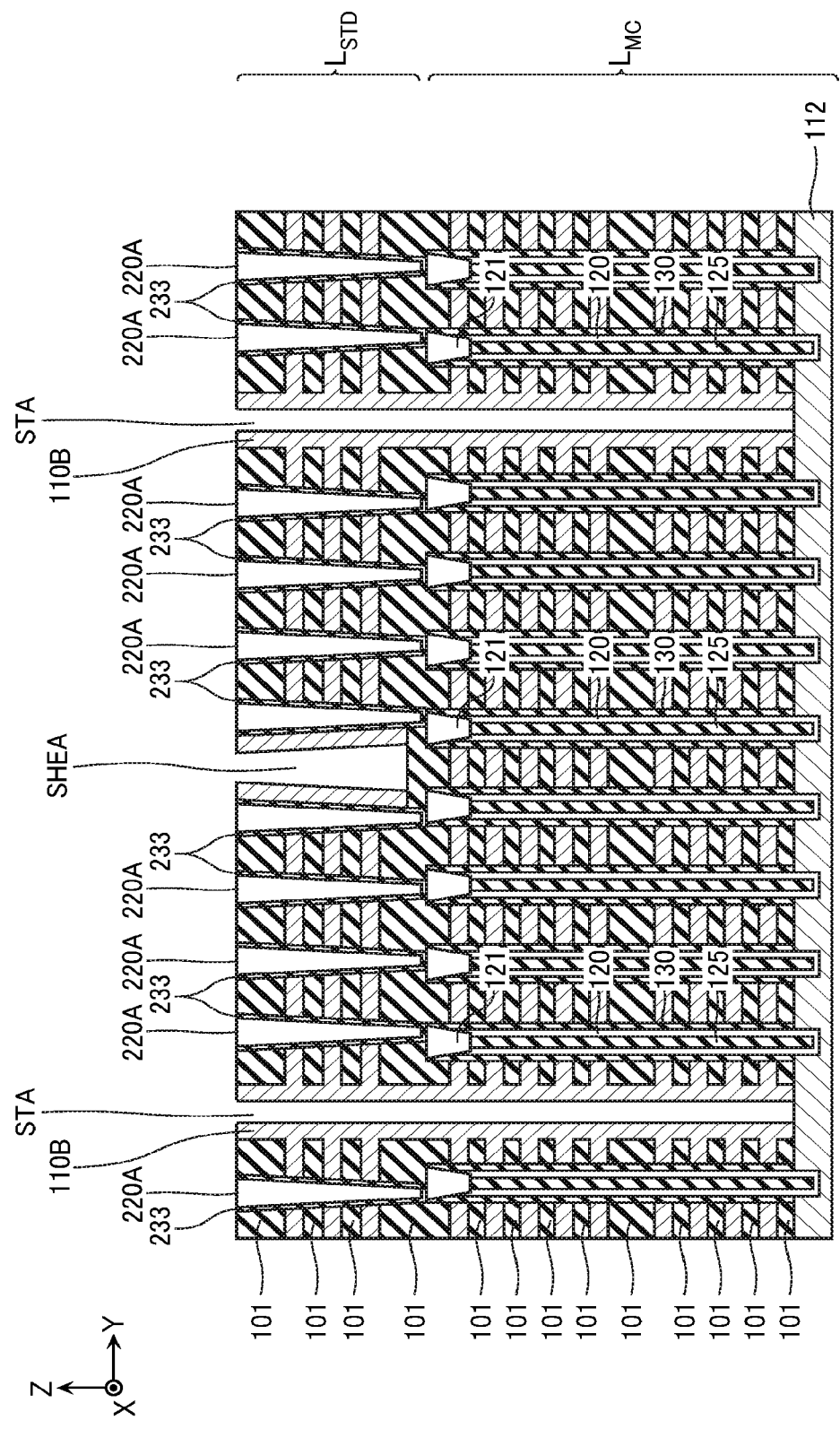
FIG. 24 is a schematic cross-sectional view for explaining same manufacturing method.

Next, as shown in FIG. 24, for example, a portion covering the upper surface of the uppermost-layer insulating layer 101, a portion covering a bottom surface of the trench SHEA, and a portion covering a bottom surface of the trench STA, of the conductive layer 110B, are removed. This step is performed by a method such as RIE, for example.

Figure 25:
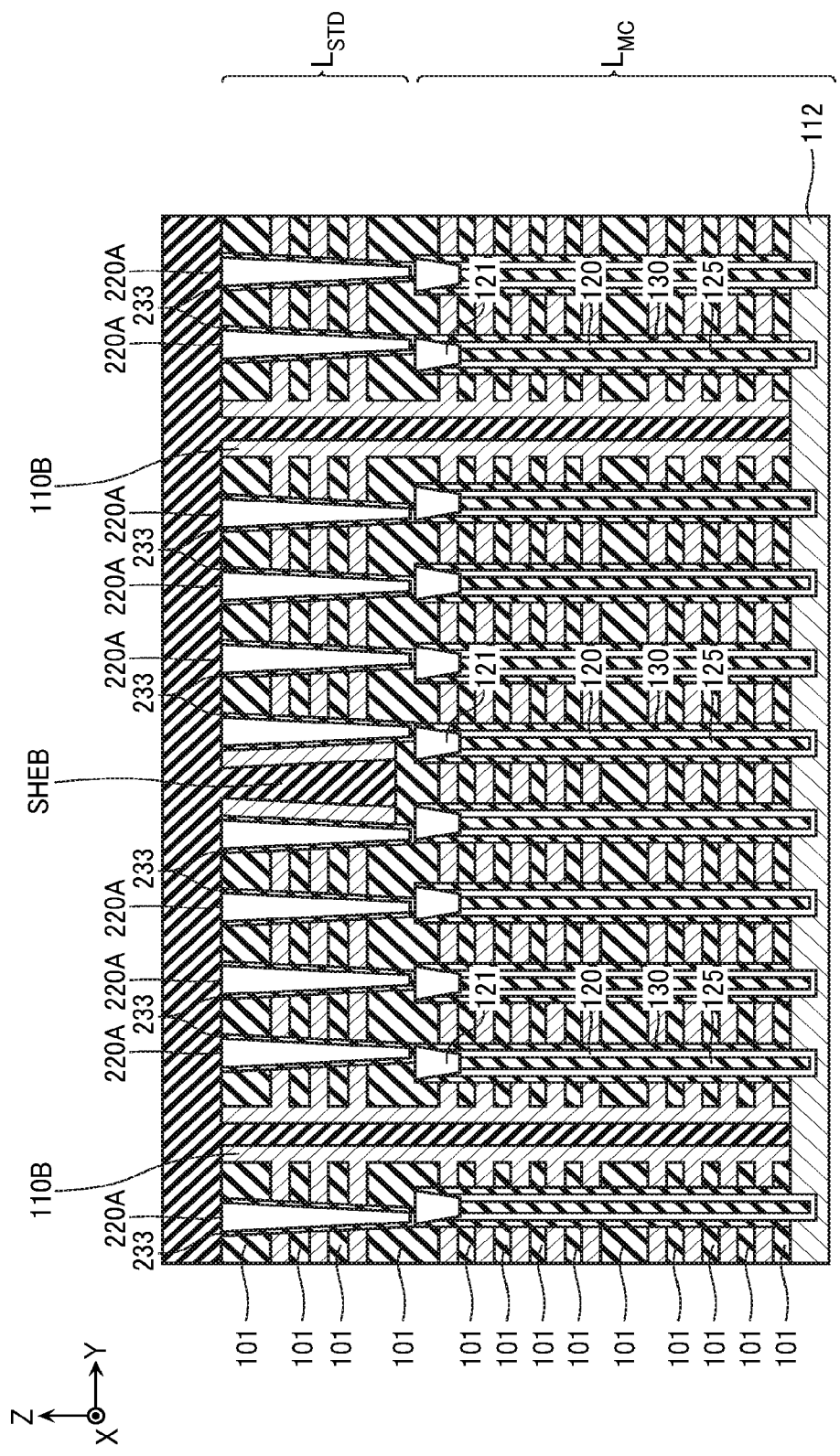
FIG. 25 is a schematic cross-sectional view for explaining same manufacturing method.

Next, as shown in FIG. 25, for example, a sacrifice layer SHEB is formed on the upper surface of the uppermost-layer insulating layer 101, inside the trench SHEA, and inside the trench STA. The sacrifice layer SHEB is an insulating layer of the likes of silicon nitride ($Si_3N_4$), for example. This step is performed by a method such as CVD, for example.

Figure 26:
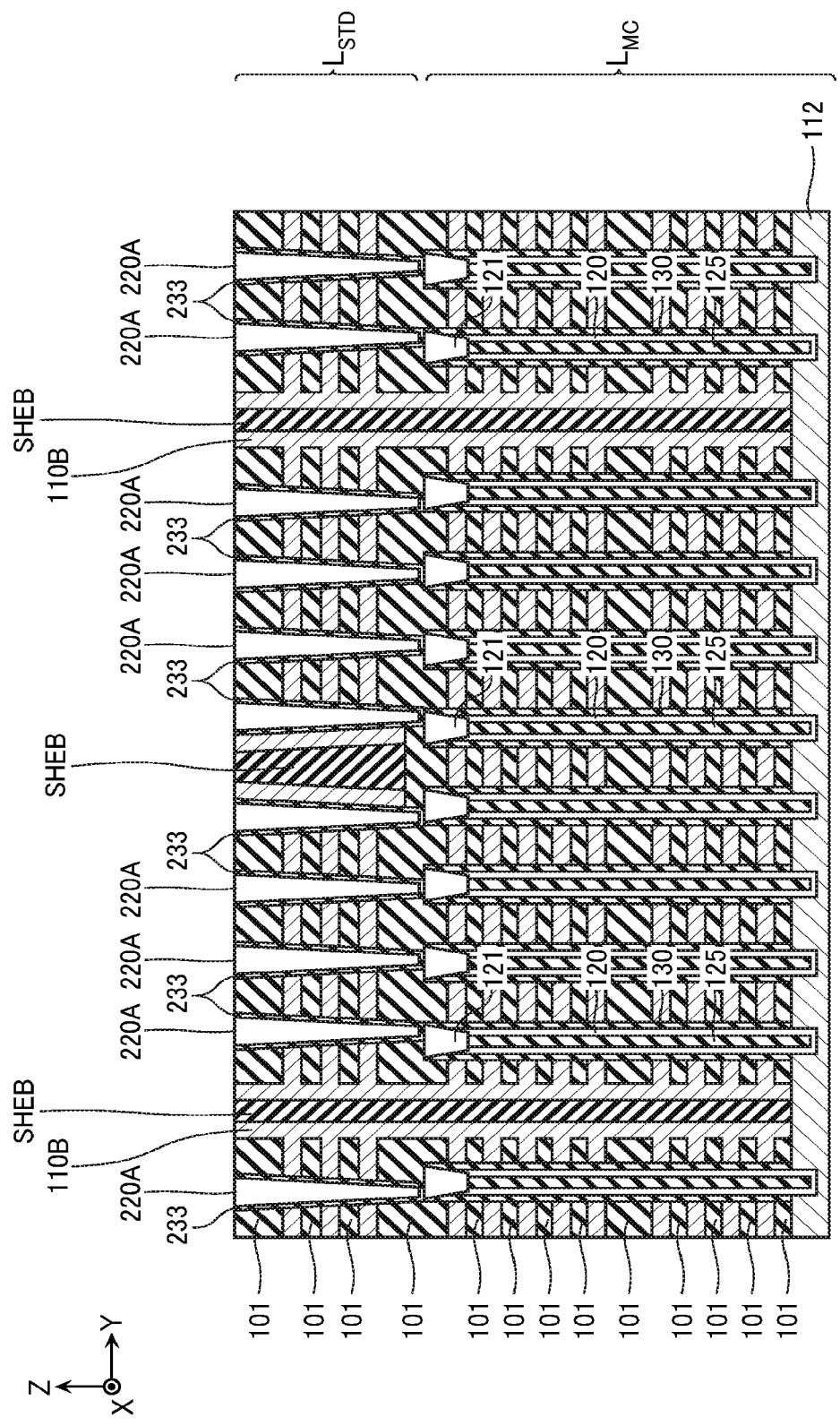
FIG. 26 is a schematic cross-sectional view for explaining same manufacturing method.
Figure 27:
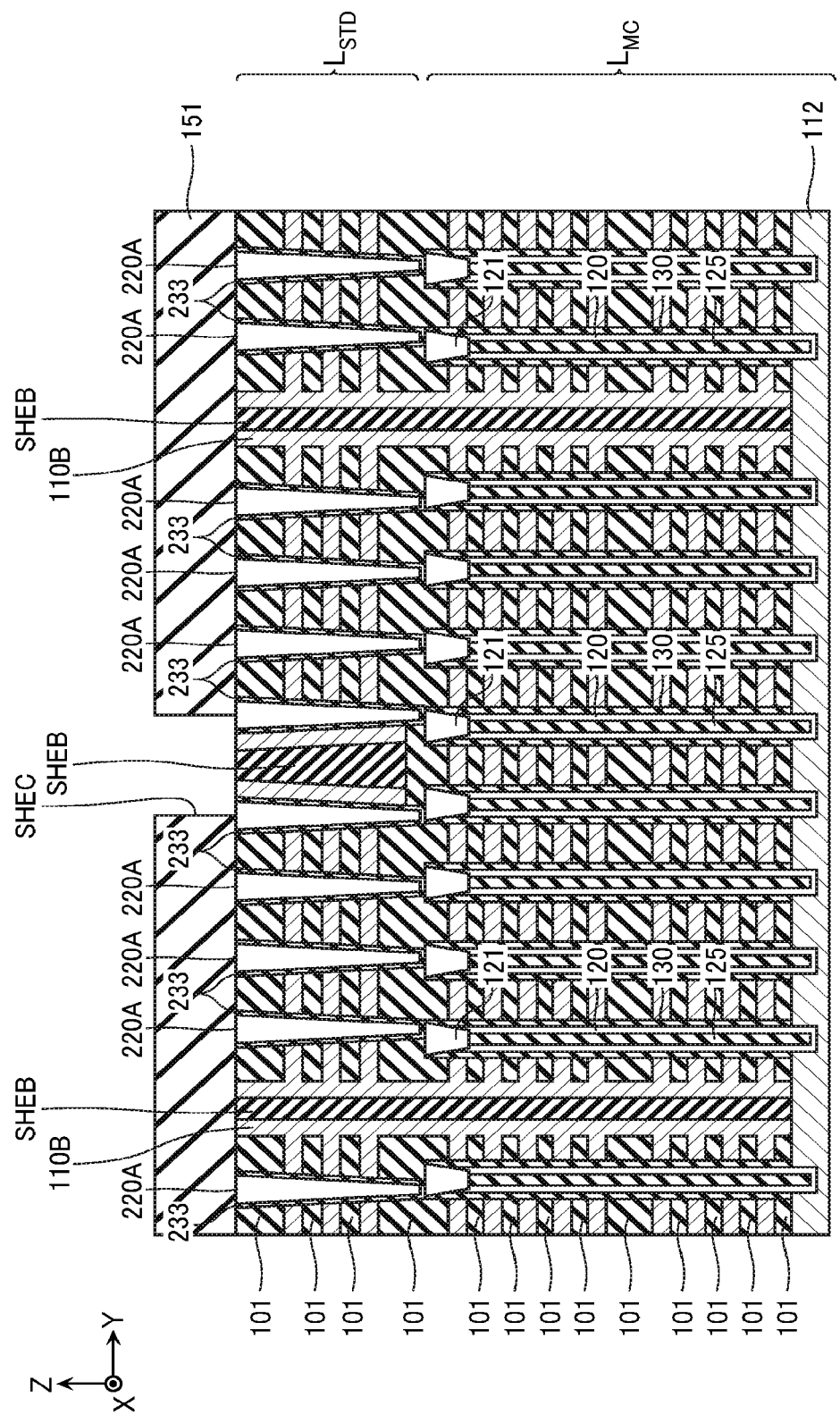
FIG. 27 is a schematic cross-sectional view for explaining same manufacturing method.

Next, as shown in FIG. 26, for example, part of the sacrifice layer SHEB is removed to expose the upper surface of the uppermost-layer insulating layer 101. This step is performed by a method such as etching-back-by-RIE, for example. Next, as shown in FIG. 27, for example, an insulating layer 151 of the likes of silicon oxide ($SiO_2$) is formed on the uppermost-layer insulating layer 101. This step is performed by a method such as CVD, for example.

In addition, a trench SHEC is formed at a position corresponding to the inter-string unit insulating layer SHE of the insulating layer 151. The trench SHEC is a trench that extends in the Z direction and the X direction, divides the insulating layer 151 in the Y direction, and exposes upper surfaces of the sacrifice layer SHEB and some of the sacrifice layers 220A. This step is performed by a method such as RIE, for example.

Figure 28:
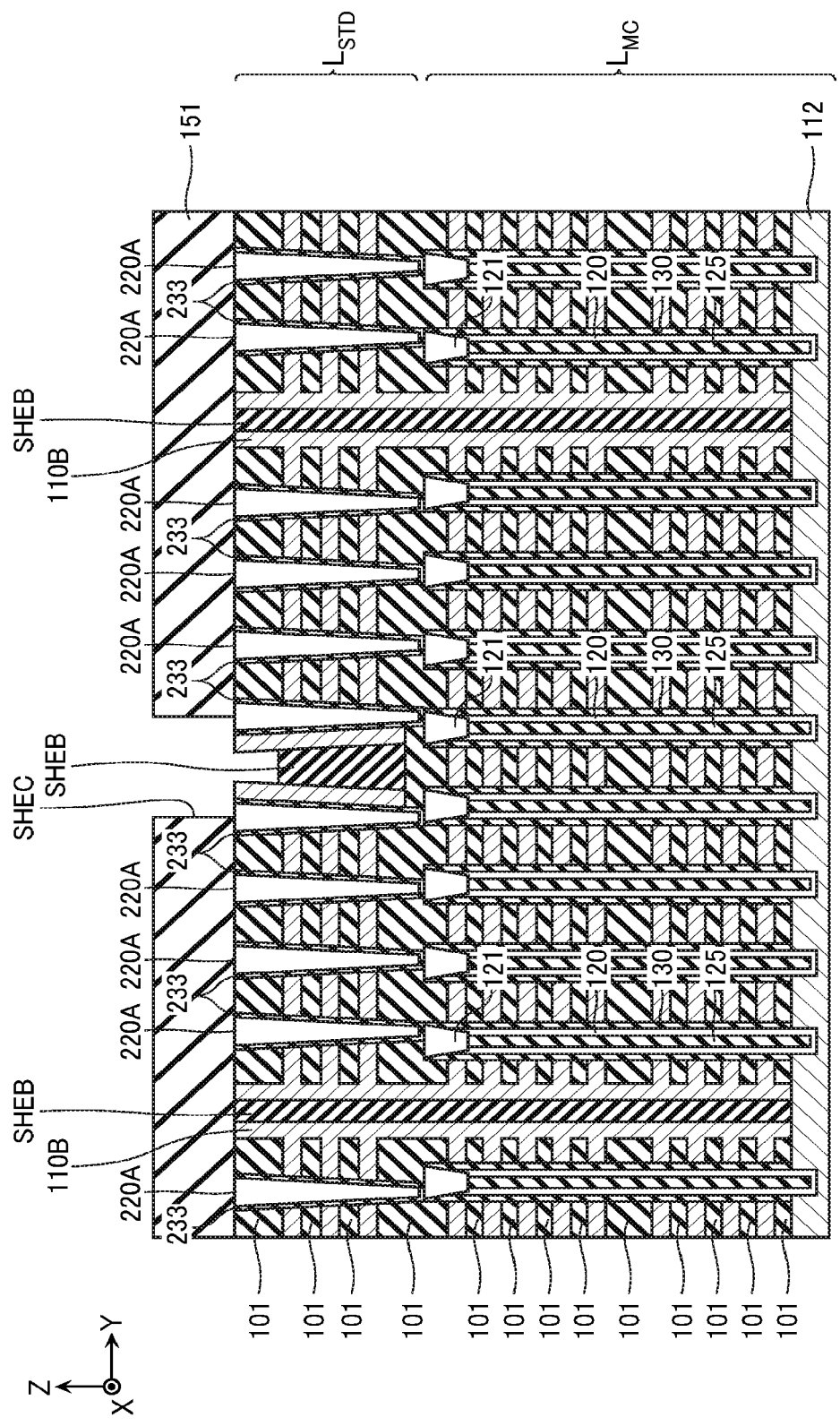
FIG. 28 is a schematic cross-sectional view for explaining same manufacturing method.

Next, as shown in FIG. 28, for example, part of the sacrifice layer SHEB is removed to expose a side surface in the Y direction of part of the conductive layer 110B. This step is performed by a method such as RIE, for example. Moreover, this step is performed in such a manner that the upper surface of the sacrifice layer SHEB will be positioned at a position corresponding to downward of the upper end of the semiconductor layer 220 (FIG. 6) and upward of the upper surface of the uppermost-layer conductive layer 210.

Figure 29:
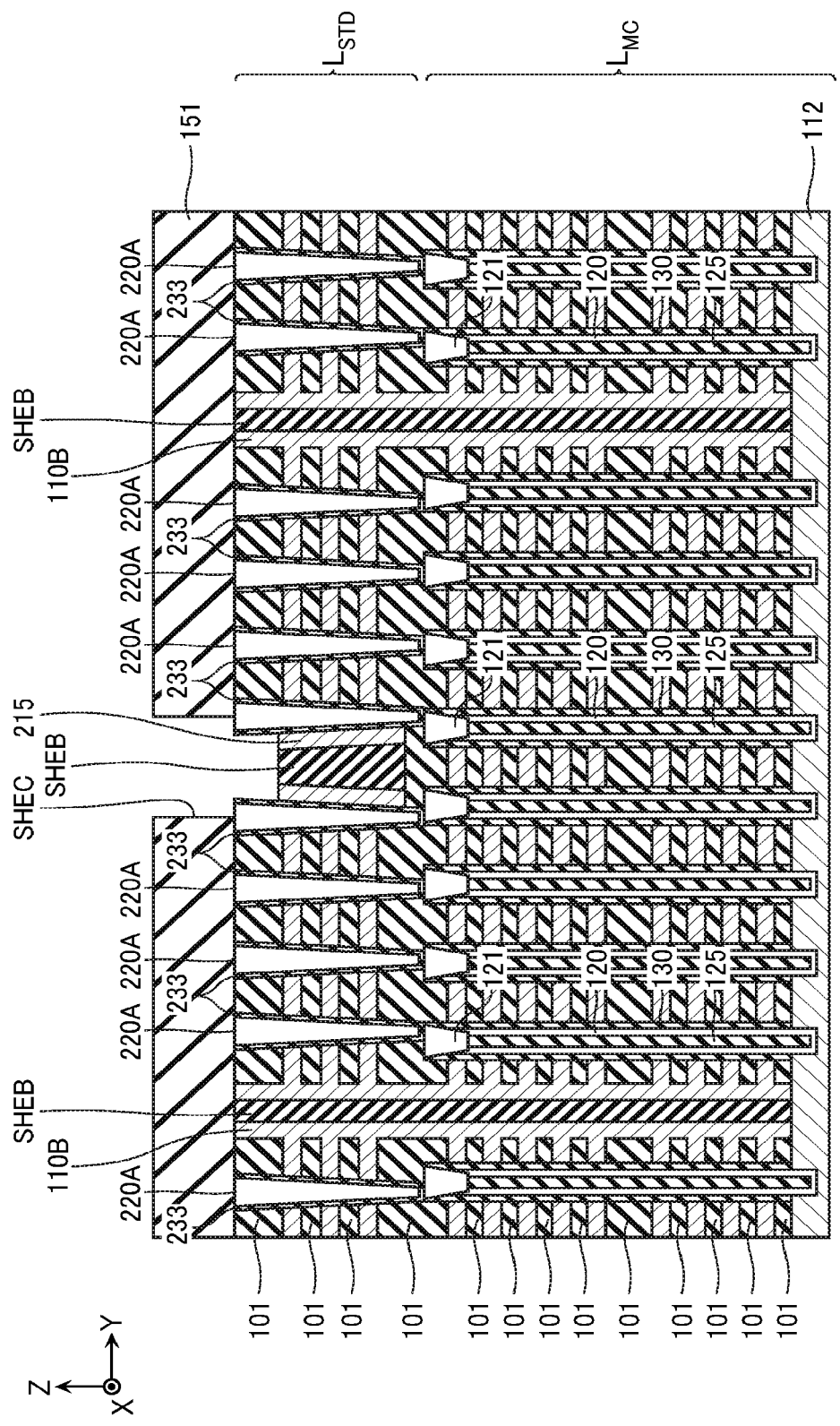
FIG. 29 is a schematic cross-sectional view for explaining same manufacturing method.

Next, as shown in FIG. 29, for example, a portion provided on part of a side surface of the block insulating film 233, of the conductive layer 110B, is removed. As a result of this step, the conductive layer 215 is formed. This step is performed by a method such as wet etching, for example.

Figure 30:
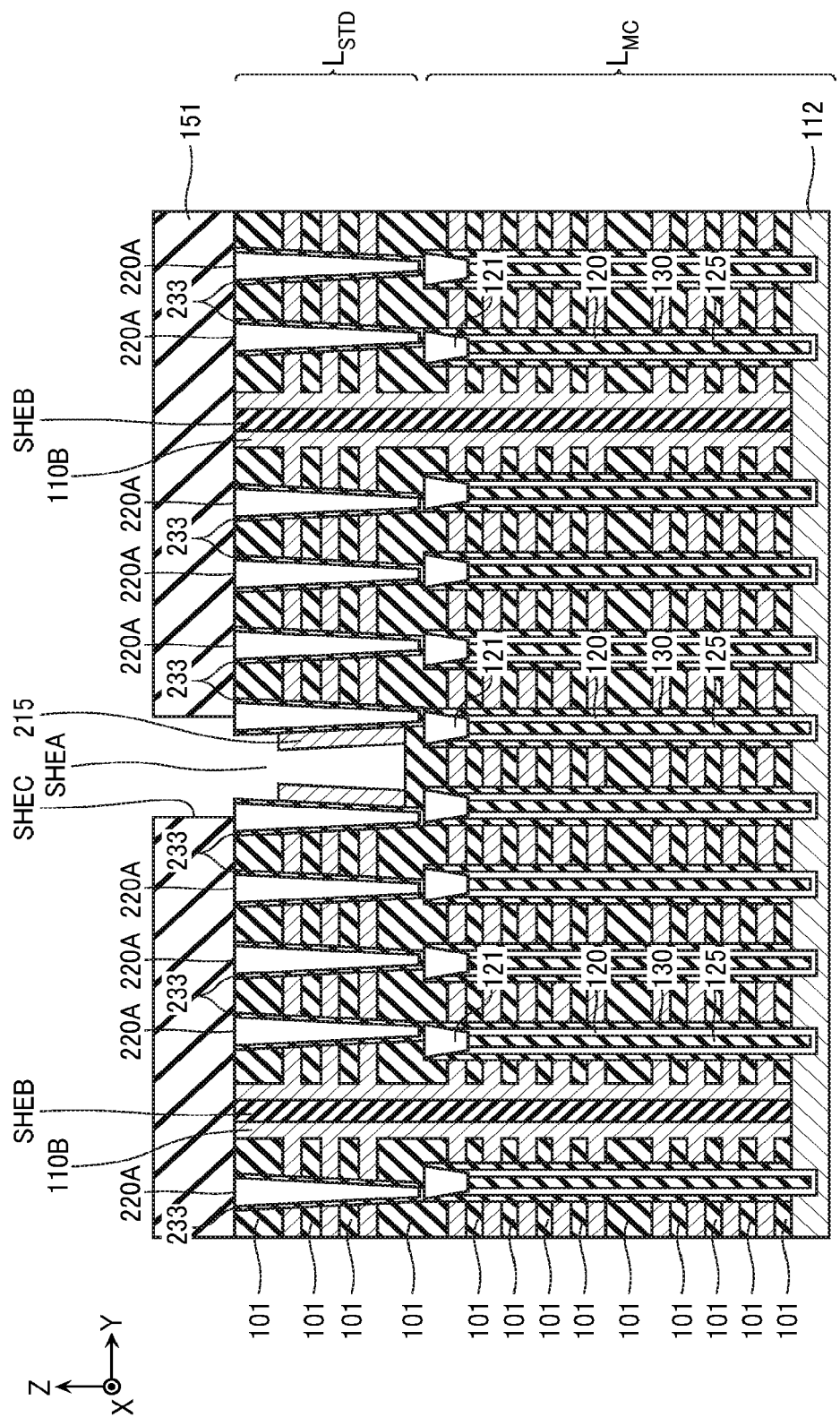
FIG. 30 is a schematic cross-sectional view for explaining same manufacturing method.

Next, as shown in FIG. 30, for example, the sacrifice layer SHEB formed inside the trench SHEA is removed. This step is performed by a method such as wet etching, for example.

Figure 31:
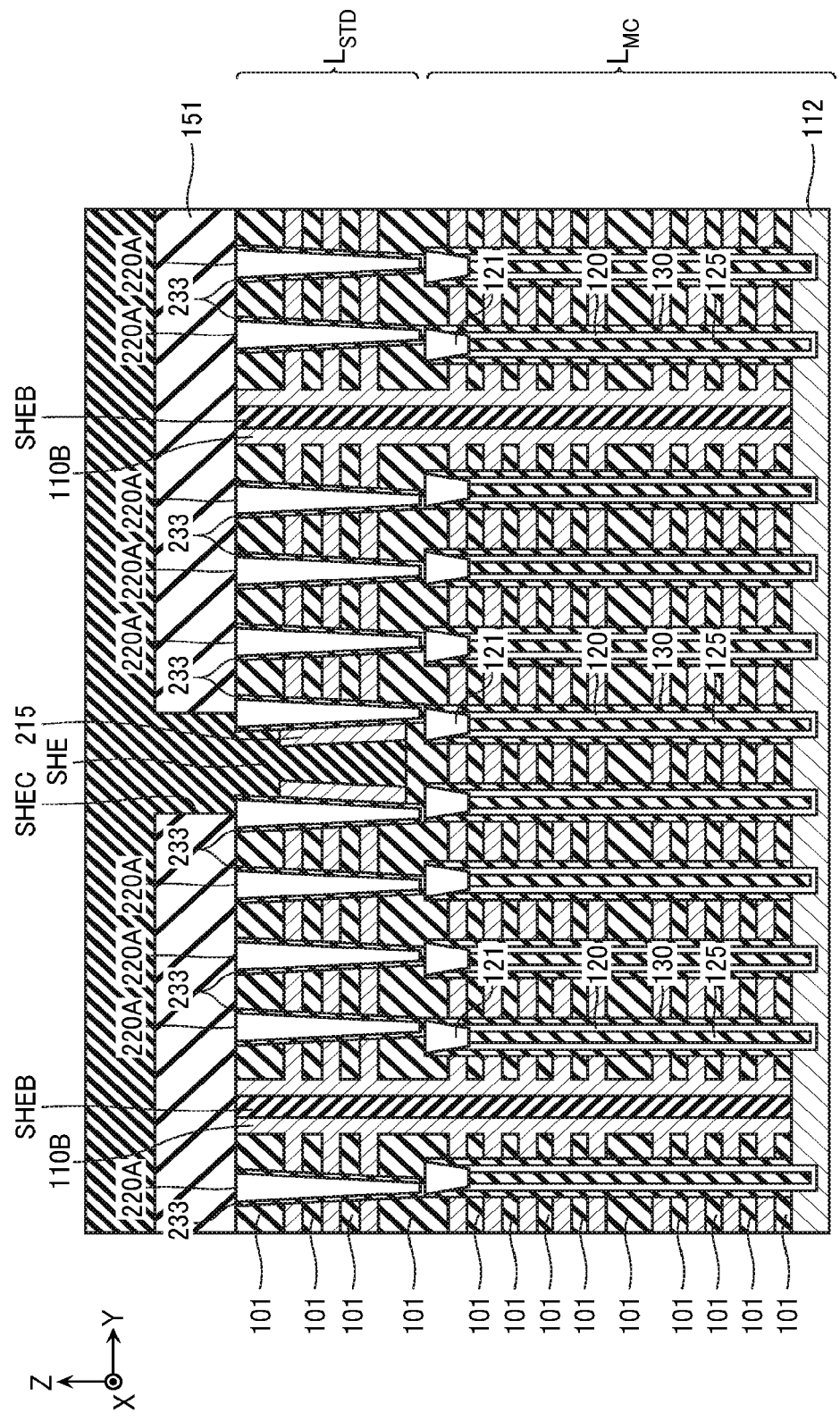
FIG. 31 is a schematic cross-sectional view for explaining same manufacturing method.

Next, as shown in FIG. 31, for example, the inter-string unit insulating layer SHE is formed inside the trench SHEA. This step is performed by a method such as CVD, for example.

Figure 32:
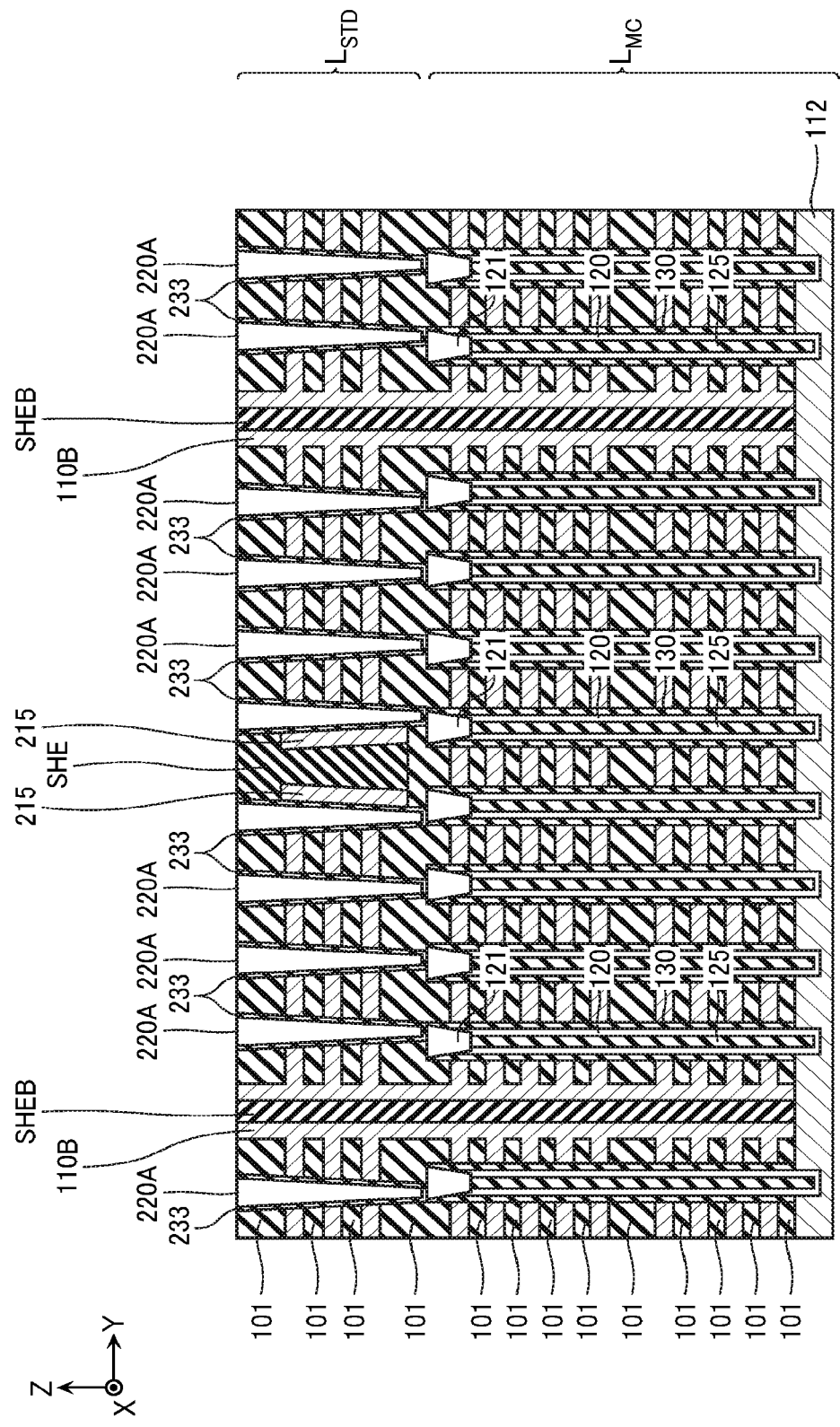
FIG. 32 is a schematic cross-sectional view for explaining same manufacturing method.

Next, as shown in FIG. 32, for example, the insulating layer 151 and part of the inter-string unit insulating layer SHE are removed to expose upper surfaces of the block insulating film 233 and the sacrifice layer 220A. This step is performed by a method such as etching-back-by-RIE or CMP, for example.

Figure 33:
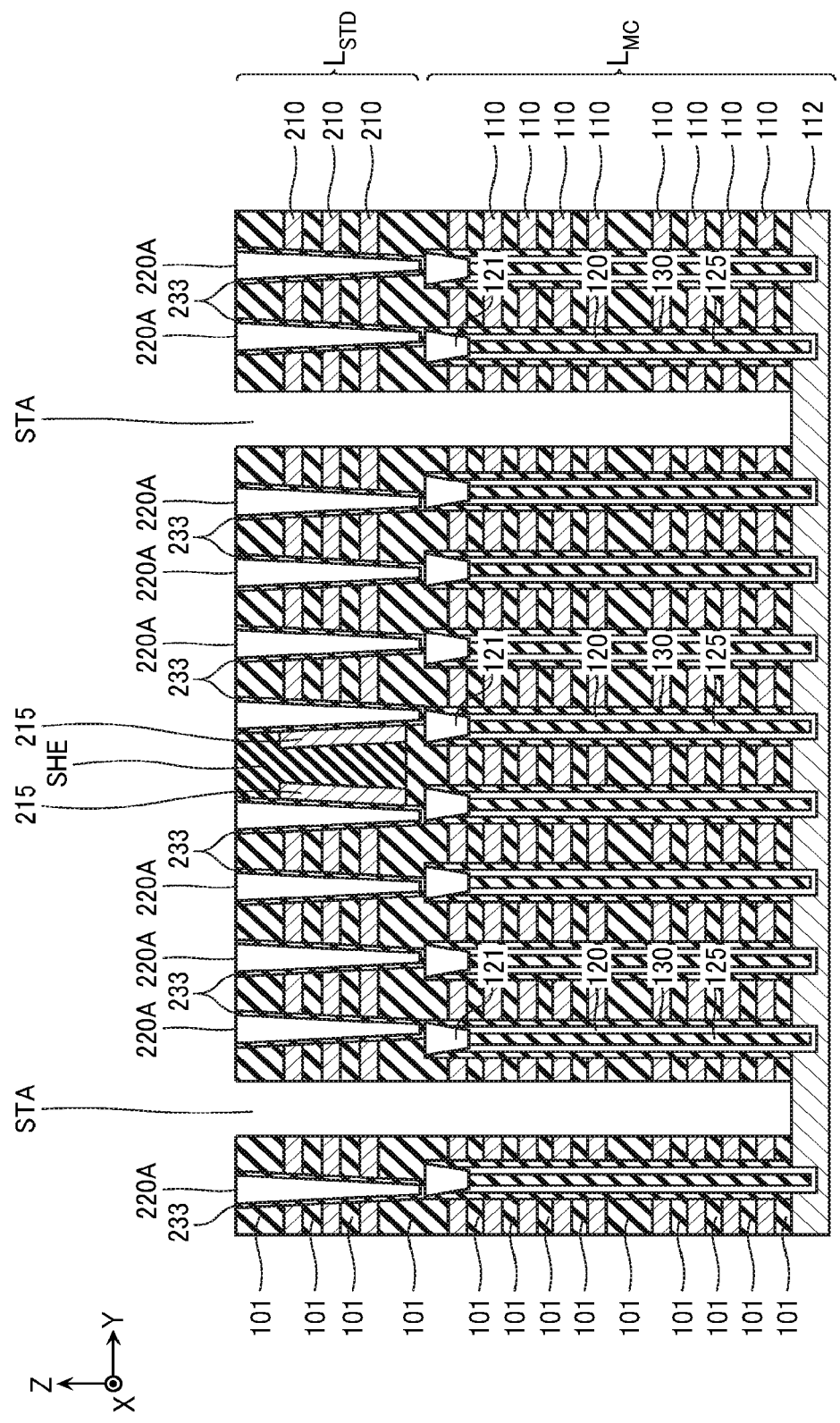
FIG. 33 is a schematic cross-sectional view for explaining same manufacturing method.

Next, as shown in FIG. 33, for example, the sacrifice layer SHEB formed inside the trench STA is removed. This step is performed by a method such as wet etching, for example.

In addition, a portion formed on the side surfaces in the Y direction of the insulating layers 101, of the conductive layer 110B, is removed. As a result of this step, the plurality of conductive layers 110 and the plurality of conductive layers 210 are formed. This step is performed by a method such as wet etching, for example.

Figure 34:
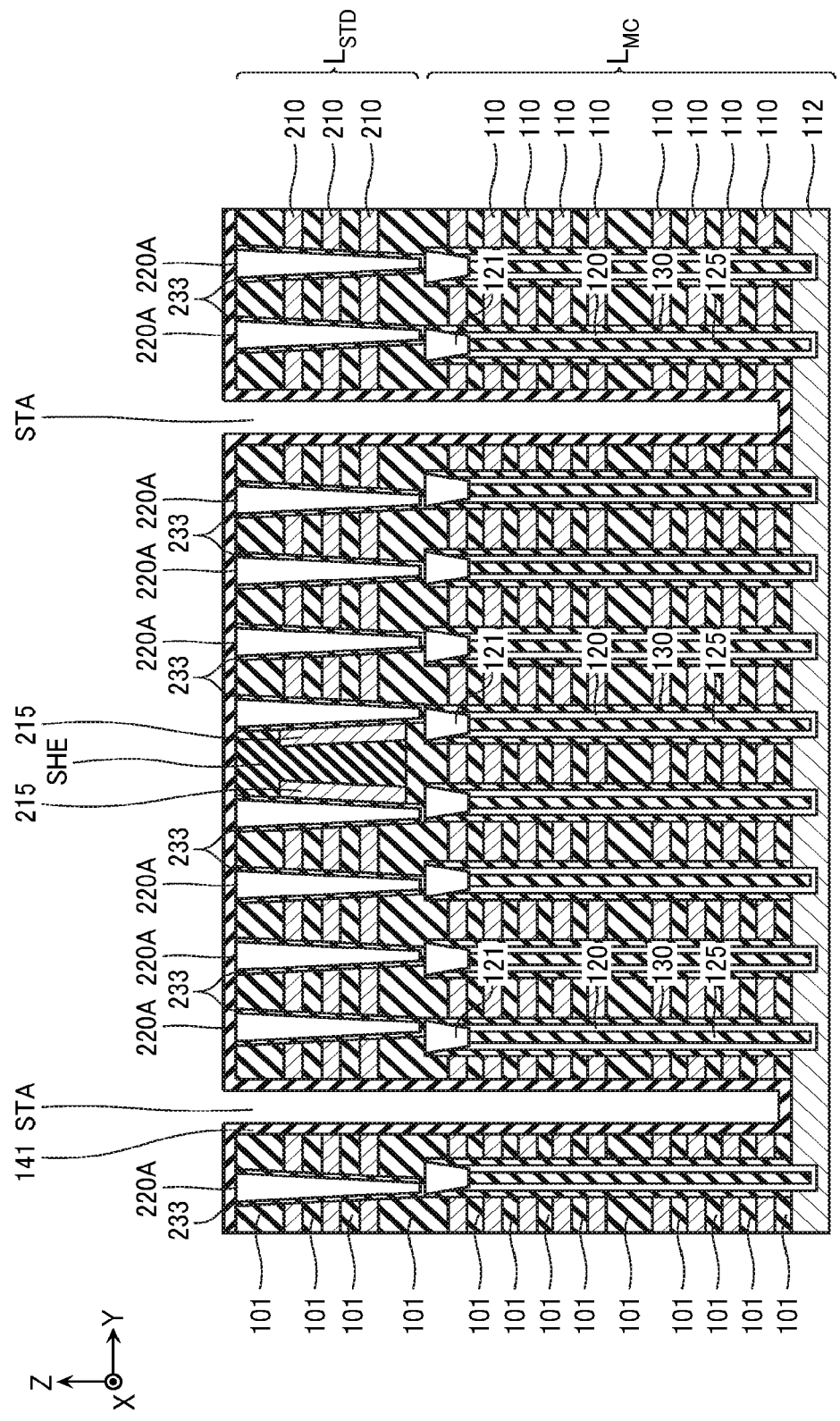
FIG. 34 is a schematic cross-sectional view for explaining same manufacturing method.

Next, as shown in FIG. 34, for example, the insulating layer 141 is formed on a side surface in the Y direction and a bottom surface of the trench STA. This step is performed by a method such as CVD, for example.

Figure 35:
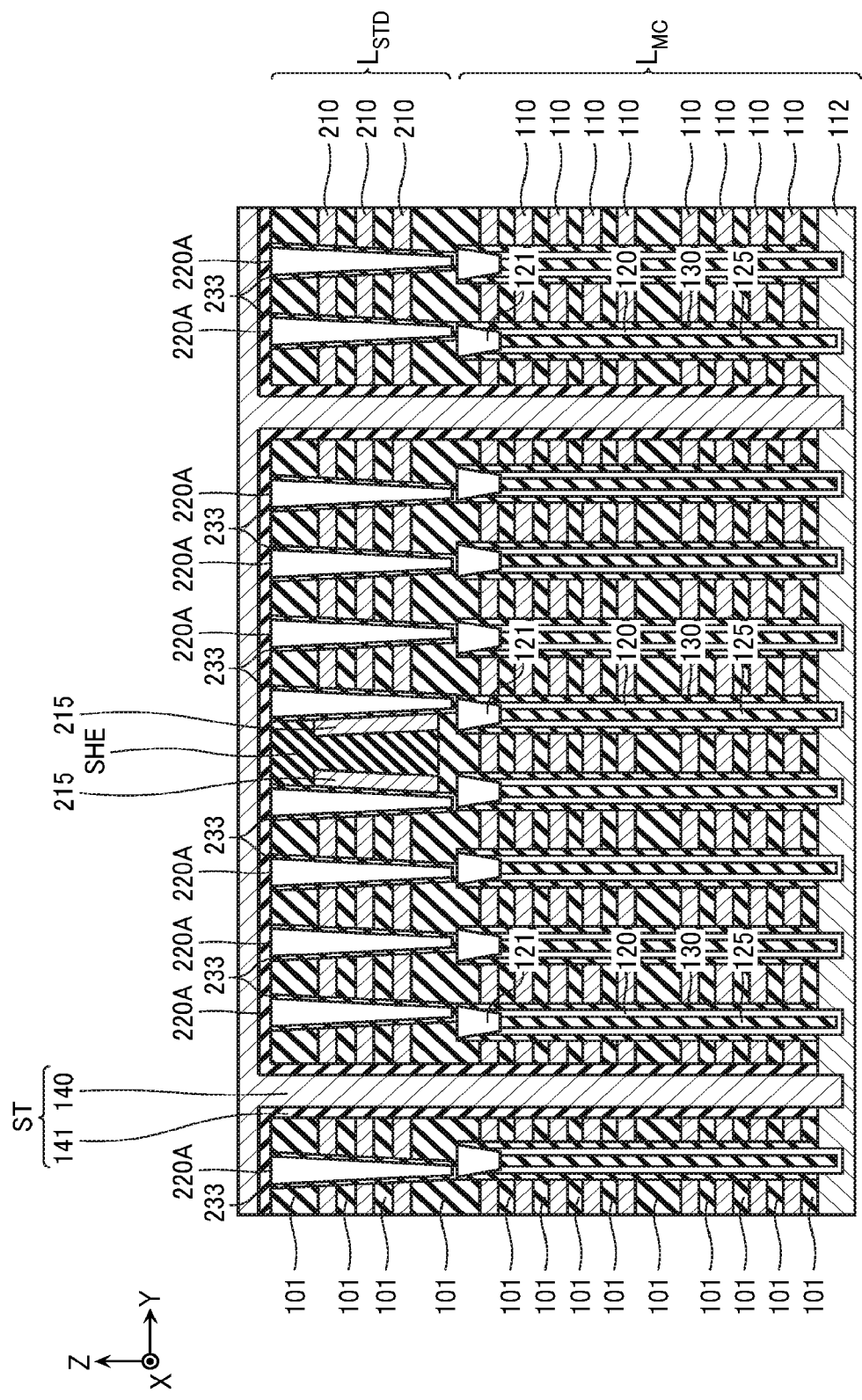
FIG. 35 is a schematic cross-sectional view for explaining same manufacturing method.

Next, as shown in FIG. 35, for example, a portion formed on the bottom surface of the trench STA of the insulating layer 141 is removed. This step is performed by a method such as RIE, for example.

In addition, the conductive layer 140 is formed inside the trench STA, for example. This step is performed by a method such as CVD, for example.

Figure 36:
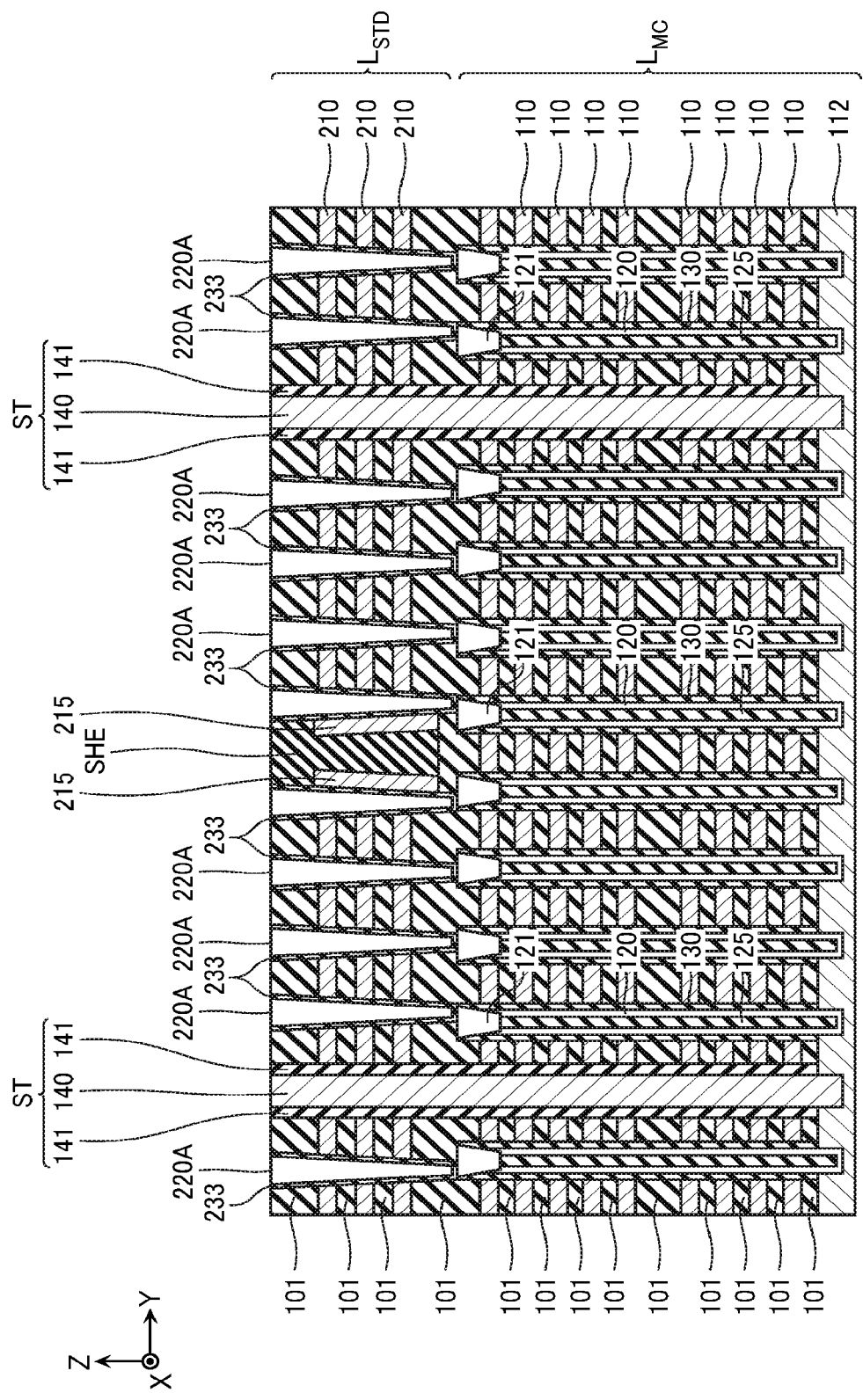
FIG. 36 is a schematic cross-sectional view for explaining same manufacturing method.

Next, as shown in FIG. 36, for example, part of the conductive layer 140 and part of the insulating layer 141 are removed to expose the upper surfaces of the uppermost-layer insulating layer 101 and the sacrifice layers 220A. This step is performed by a method such as CMP, for example.

Figure 37:
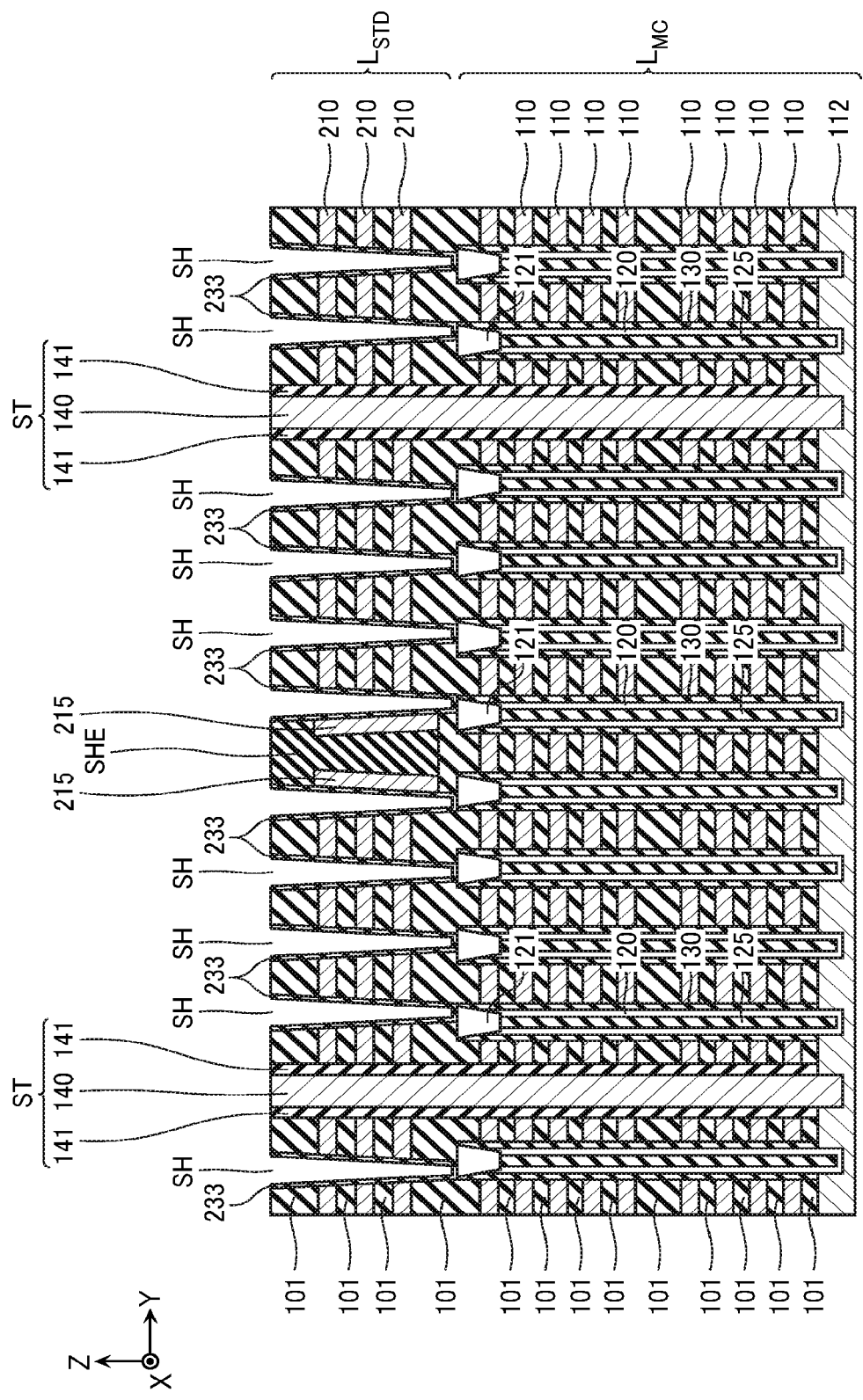
FIG. 37 is a schematic cross-sectional view for explaining same manufacturing method.

Next, as shown in FIG. 37, for example, the sacrifice layer 220A is removed. This step is performed by a method such as ashing, for example.

Figure 38:
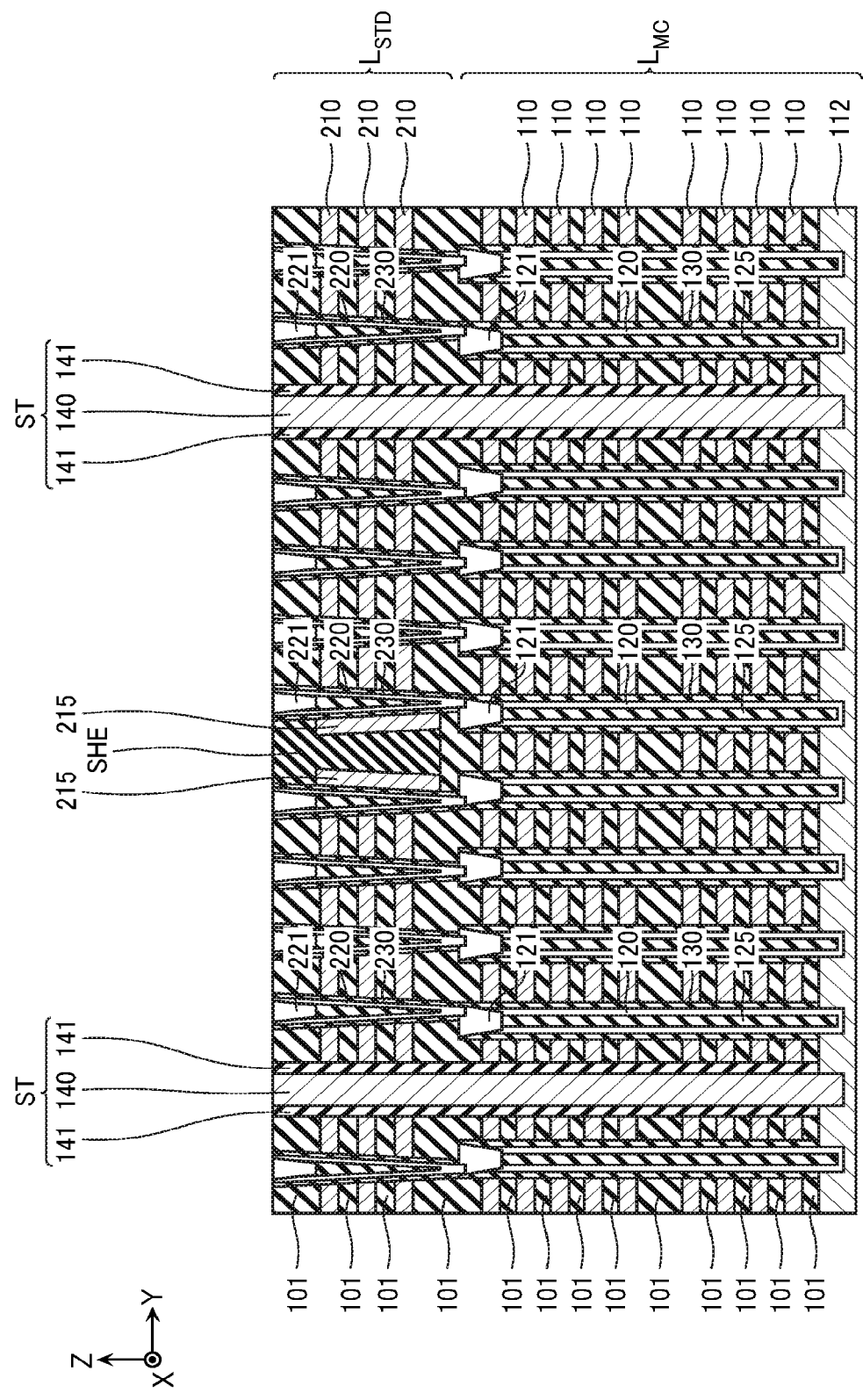
FIG. 38 is a schematic cross-sectional view for explaining same manufacturing method.

Next, as shown in FIG. 38, for example, the gate insulating film 230, the semiconductor layer 220, and the insulating layer 225 are formed inside the transistor holes SH. This step is performed by methods such as CVD and RIE, for example.

Subsequently, wirings, and so on, are formed and a wafer is divided by dicing, whereby the semiconductor memory device of the kind described with reference to FIGS. 2 to 10 is formed.

First Comparative Example

Figure 39:
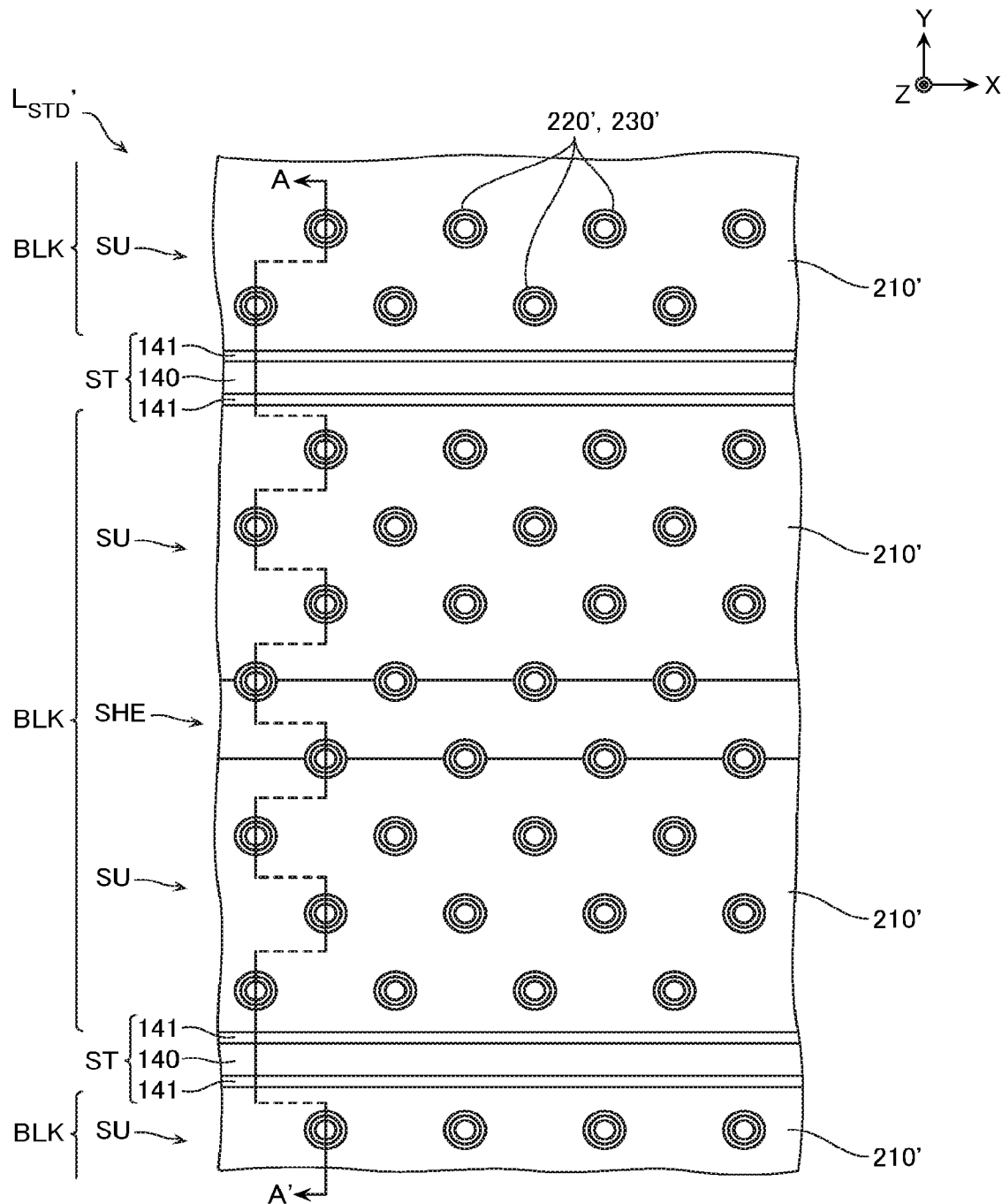
FIG. 39 is a schematic plan view showing a configuration of a semiconductor memory device according to a first comparative example.
Figure 40:
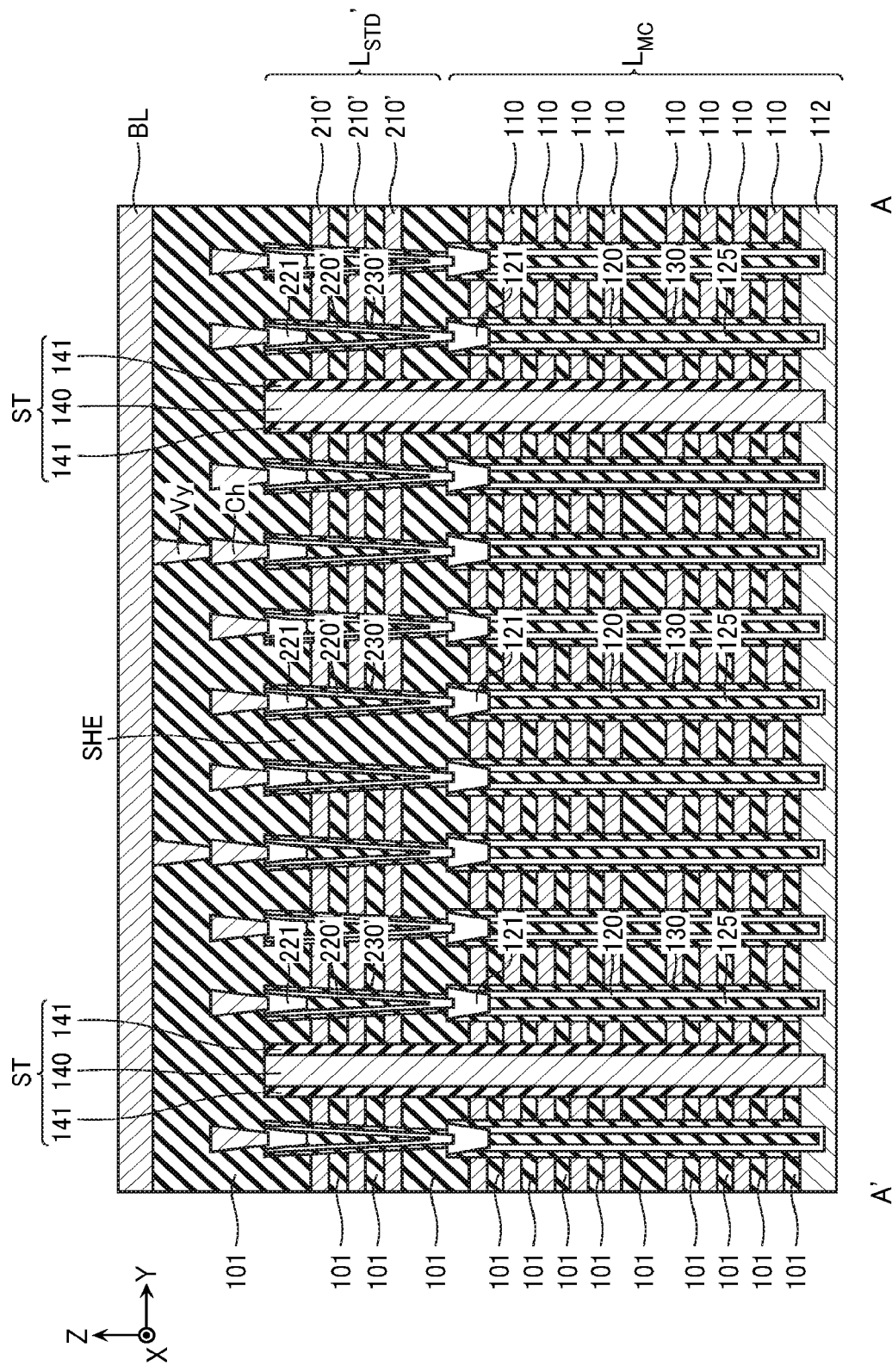
FIG. 40 is a schematic cross-sectional view showing a configuration of the semiconductor memory device according to the first comparative example.

Next, a semiconductor memory device according to a first comparative example will be described with reference to FIGS. 39 and 40. FIG. 39 is a schematic plan view showing a configuration of part of the semiconductor memory device according to the first comparative example. FIG. 40 is a schematic cross-sectional view in which the structure shown in FIG. 39 has been cut along the line A-A' and viewed along the direction of the arrows.

The semiconductor memory device according to the first comparative example comprises a drain side select transistor layer $L_{STD}$' instead of the drain side select transistor layer $L_{STD}$. As shown in FIG. 40, for example, the drain side select transistor layer $L_{STD}$' comprises: a plurality of conductive layers 210' arranged in the Z direction; a plurality of semiconductor layers 220' extending in the Z direction; and a plurality of gate insulating films 230' respectively provided between the plurality of conductive layers 210' and the plurality of semiconductor layers 220'.

As mentioned above, an end portion on an inter-string unit insulating layer SHE side of the conductive layer 210 according to the first embodiment is connected to the gate insulating film 230 and the conductive layer 215. On the other hand, an end portion on an inter-string unit insulating layer SHE side of the conductive layer 210' according to the first comparative example is connected to the gate insulating film 230' and the inter-string unit insulating layer SHE, as shown in FIG. 39, for example.

Moreover, as mentioned above, in the first embodiment, a central position in the XY plane of the semiconductor layer 220 did not coincide with a central position in the XY plane of the semiconductor layer 120. On the other hand, in the first comparative example, a central position in the XY plane of the semiconductor layer 220' coincides with a central position in the XY plane of the semiconductor layer 120 (refer to FIG. 40).

Second Comparative Example

Figure 41:
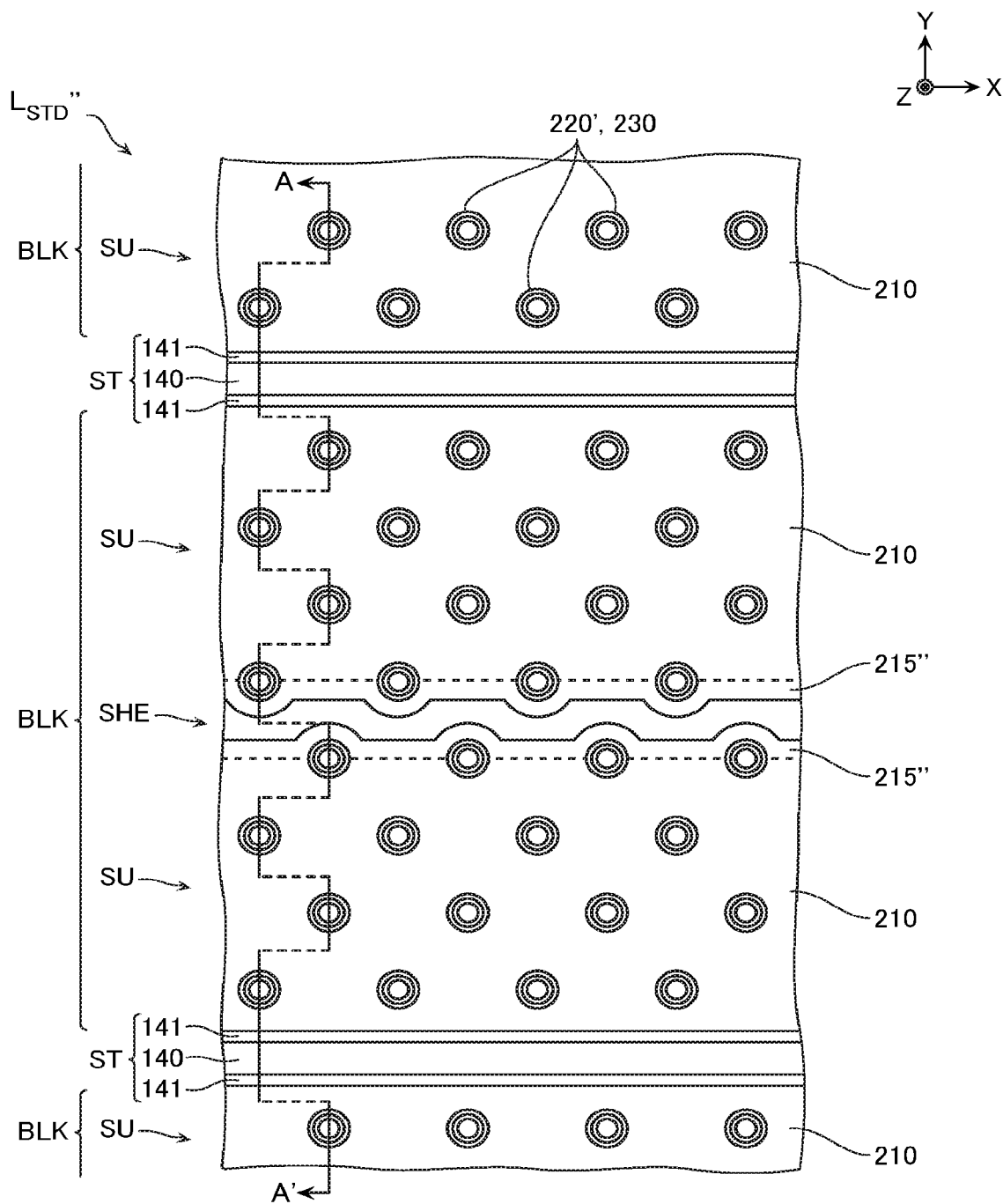
FIG. 41 is a schematic plan view showing a configuration of a semiconductor memory device according to a second comparative example.
Figure 42:
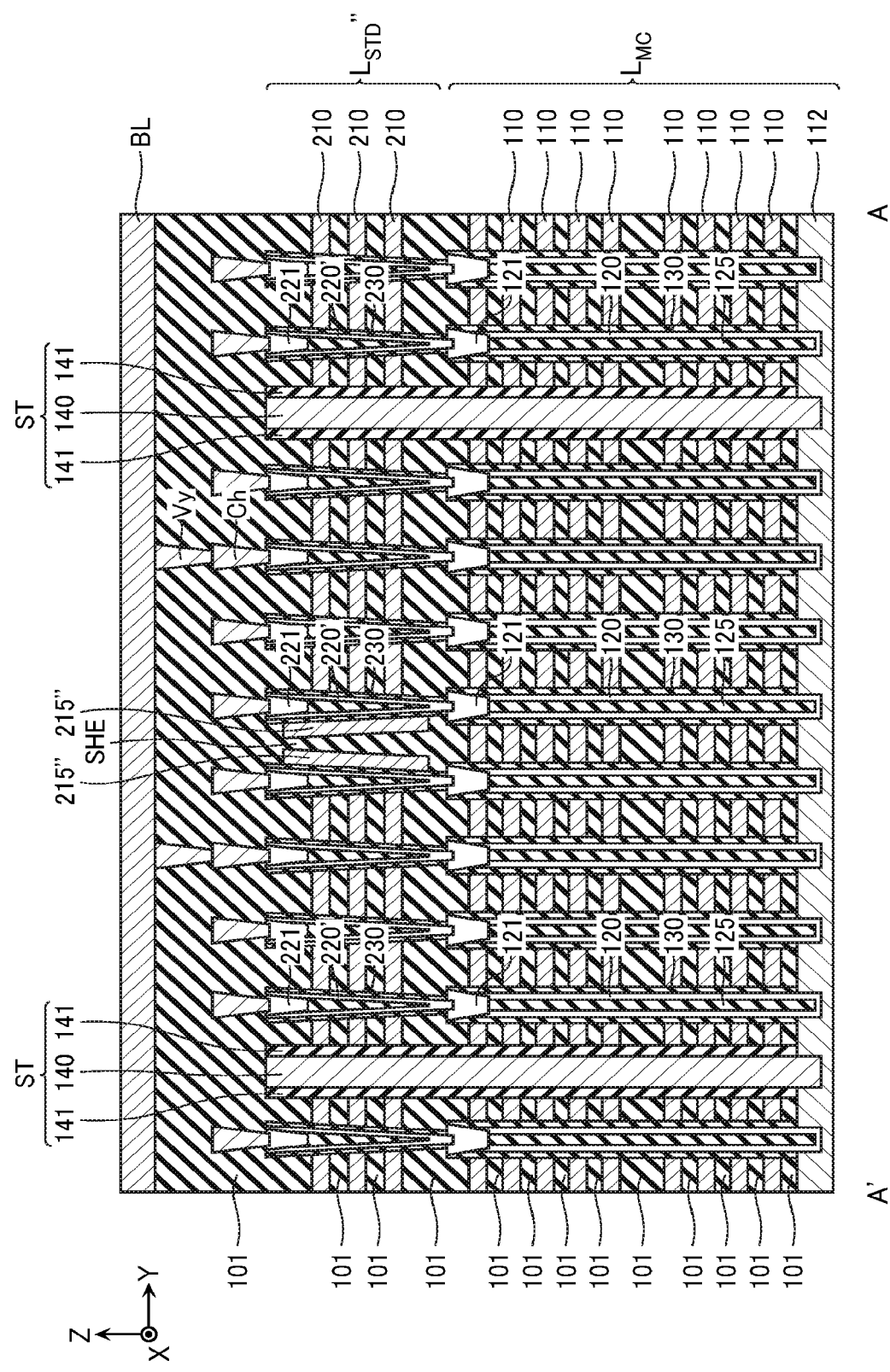
FIG. 42 is a schematic cross-sectional view showing a configuration of the semiconductor memory device according to the second comparative example.

Next, a semiconductor memory device according to a second comparative example will be described with reference to FIGS. 41 and 42. FIG. 41 is a schematic plan view showing a configuration of part of the semiconductor memory device according to the second comparative example. FIG. 42 is a schematic cross-sectional view in which the structure shown in FIG. 41 has been cut along the line A-A' and viewed along the direction of the arrows.

The semiconductor memory device according to the second comparative example comprises a drain side select transistor layer $L_{STD}$" instead of the drain side select transistor layer $L_{STD}$. As shown in FIG. 42, for example, the drain side select transistor layer $L_{STD}$" comprises: the plurality of conductive layers 210 arranged in the Z direction; a conductive layer 215" connected to one ends in the Y direction of these plurality of conductive layers 210; a plurality of semiconductor layers 220' extending in the Z direction; and the plurality of gate insulating films 230 respectively provided between the plurality of conductive layers 210 and the plurality of semiconductor layers 220'.

In the second comparative example, similarly to in the first comparative example, the central position in the XY plane of the semiconductor layer 220' coincides with the central position in the XY plane of the semiconductor layer 120.

Advantages

In the semiconductor memory device according to the first comparative example, as shown in FIG. 39, for example, the plurality of semiconductor layers 220' included in the fourth and fifth columns counting from one side in the Y direction face the conductive layer 210' with part of their outer circumferential surfaces, and face the inter-string unit insulating layer SHE with part of their outer circumferential surfaces. If, in such a configuration, a voltage is supplied to the conductive layer 210', a channel of electrons will not be formed in the outer circumferential surfaces of parts of the semiconductor layers 220'. As a result, there is a risk that an ON current will end up being insufficient in the plurality of drain side select transistors STD (FIG. 1) corresponding to the plurality of semiconductor layers 220' included in the fourth and fifth columns counting from one side in the Y direction.

Accordingly, in the semiconductor memory device according to the second comparative example, as shown in FIG. 41, for example, the drain side select transistor layer $L_{STD}$" is provided with the conductive layer 215". Due to such a configuration, all of the semiconductor layers 220' will have a channel of electrons formed in their outer circumferential surfaces over the whole circumference. As a result, it is conceivably possible to suppress that, as mentioned above, the ON current is insufficient in some of the drain side select transistors STD (FIG. 1).

However, in the semiconductor memory device according to the second comparative example, the central position in the XY plane of the semiconductor layer 220' coincides with the central position in the XY plane of the semiconductor layer 120. In such a configuration, when a pair of the conductive layers 215' and the inter-string unit insulating layer SHE were provided between two of the conductive layers 210 adjacent in the Y direction, thicknesses of the conductive layers 215" and the inter-string unit insulating layer SHE sometimes ended up decreasing. As a result, there is a risk that a voltage cannot be suitably supplied to the conductive layers 215". In addition, there is risk that dielectric breakdown, or the like, will end up occurring between two of the conductive layers 215" adjacent in the Y direction.

Now, in the semiconductor memory device according to the first embodiment, as shown in FIGS. 4 and 7, for example, the central position in the XY plane of the semiconductor layer 220 does not coincide with the central position in the XY plane of the semiconductor layer 120, and the semiconductor layer 220 provided in a vicinity of the inter-string unit insulating layer SHE is provided at a position further from the inter-string unit insulating layer SHE than the semiconductor layer 120 connected to this semiconductor layer 220 is.

Due to such a configuration, it is possible for a distance between the semiconductor layers 220 to be increased, compared to in the second comparative example. Hence, it is possible for thicknesses of the conductive layer 215 and the inter-string unit insulating layer SHE to be increased. Hence, it is possible for a voltage to be suitably supplied to the conductive layer 215. In addition, it is possible to suppress that dielectric breakdown, or the like, will end up occurring between two of the conductive layers 215 adjacent in the Y direction.

Moreover, in the first embodiment, in the step shown in FIG. 18, the sacrifice layer 220A of carbon (C) is formed inside the transistor hole SH. Moreover, in the step shown in FIG. 27, the trench SHEC that exposes the upper surfaces of the sacrifice layer SHEB and some of the sacrifice layers 220A of the likes of silicon nitride ($Si_3N_4$), is formed in the insulating layer 151. Moreover, in the step shown in FIG. 28, part of the sacrifice layer SHEB is removed, using the insulating layer 151 as a mask. Moreover, in the step shown in FIG. 29, part of the conductive layer 110B is removed.

Due to such a method, an upper end position of the conductive layer 215 is suitably adjustable. As a result, it is possible for the position of the upper end of the conductive layer 215 to be adjusted to a position lower than a position of the upper end of the semiconductor layer 220, and thereby suppress that the contact Ch and the conductive layer 215 end up contacting each other. In addition, capacitive coupling between the contact Ch and the conductive layer 215 can be reduced.

Moreover, in the first embodiment, in the step shown in FIG. 18, the sacrifice layer 220A of carbon (C) is formed inside the transistor hole SH. Moreover, the sacrifice layer 220A is removed in the step shown in FIG. 37, and the semiconductor layer 220, the gate insulating film 230, and so on, are formed inside the transistor hole SH in the step shown in FIG. 38.

Now, it is conceivable too for the semiconductor layer 220, the gate insulating film 230, and so on, and not the sacrifice layer 220A, to be formed in the step shown in FIG. 18, for example. In such a case, it results in there being included on the inside of the transistor hole SH a film of silicon nitride ($Si_3N_4$) functioning as the charge accumulation film. However, in such a case, there ends up arising a need to expose the sacrifice layer SHEB by the trench SHEC, and cover the semiconductor layer 220 and the gate insulating film 230 inside the transistor hole SH by the insulating layer 151. This is because if the charge accumulating film inside the transistor hole SH ends up being exposed, the charge accumulating film inside the transistor hole SH will end up being removed in the step shown in FIG. 30. Hence, there will end up arising a need for the trench SHEC to be configured in a complicated shape. Moreover, exact positioning will end up becoming necessary in patterning of the trench SHEC. On the other hand, due to the manufacturing method according to the first embodiment, in the step shown in FIG. 30, a film of silicon nitride ($Si_3N_4$) is not included inside the transistor hole SH. Hence, it is possible for the trench SHEC to be formed linearly. Moreover, misalignment margin of the trench SHEC increases over the comparative examples. Hence, it is possible for the semiconductor memory device according to the first embodiment to be more easily manufactured.

Second Embodiment

[Configuration]

Figure 43:
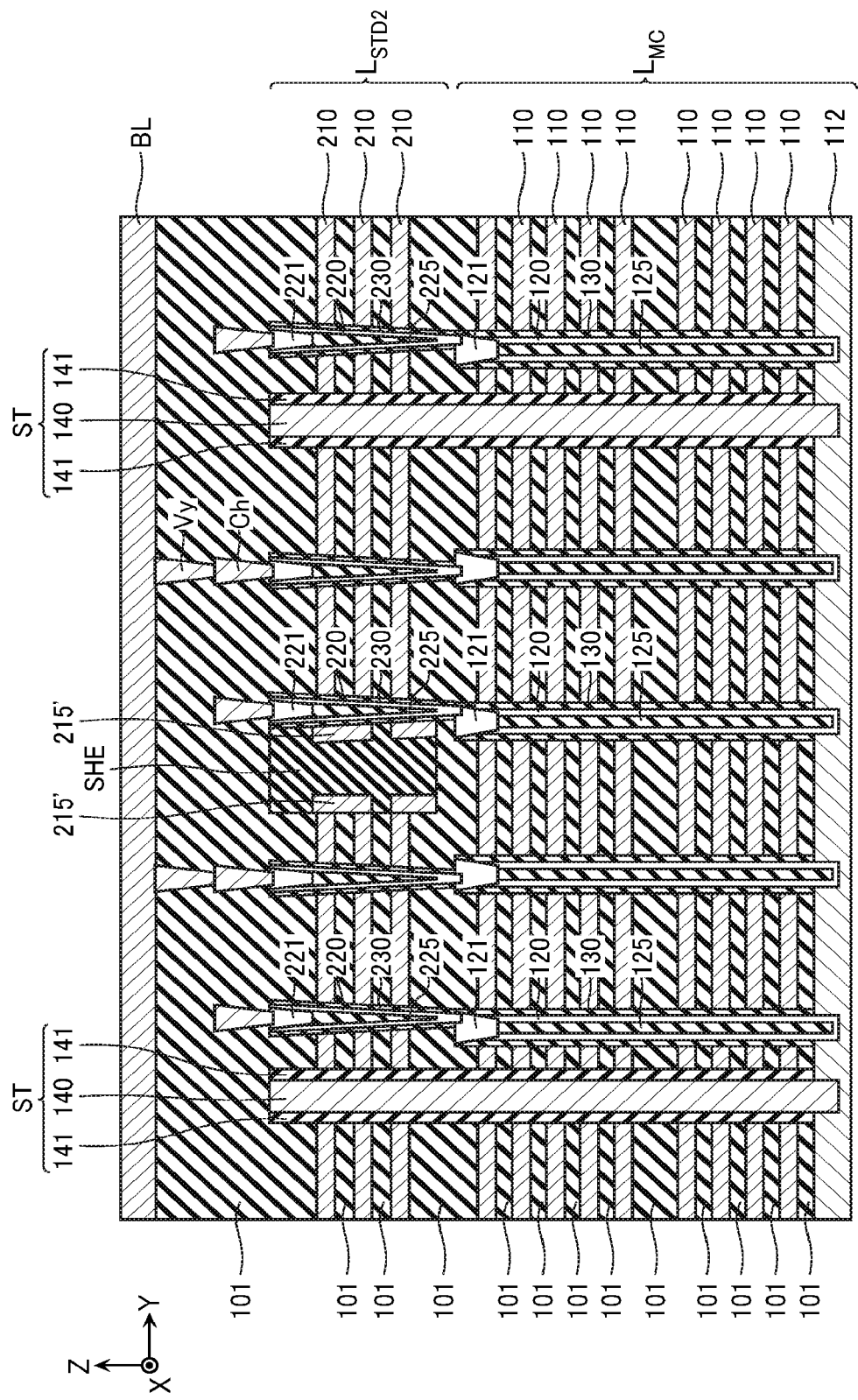
FIG. 43 is a schematic cross-sectional view showing a configuration of a semiconductor memory device according to a second embodiment.
Figure 44:
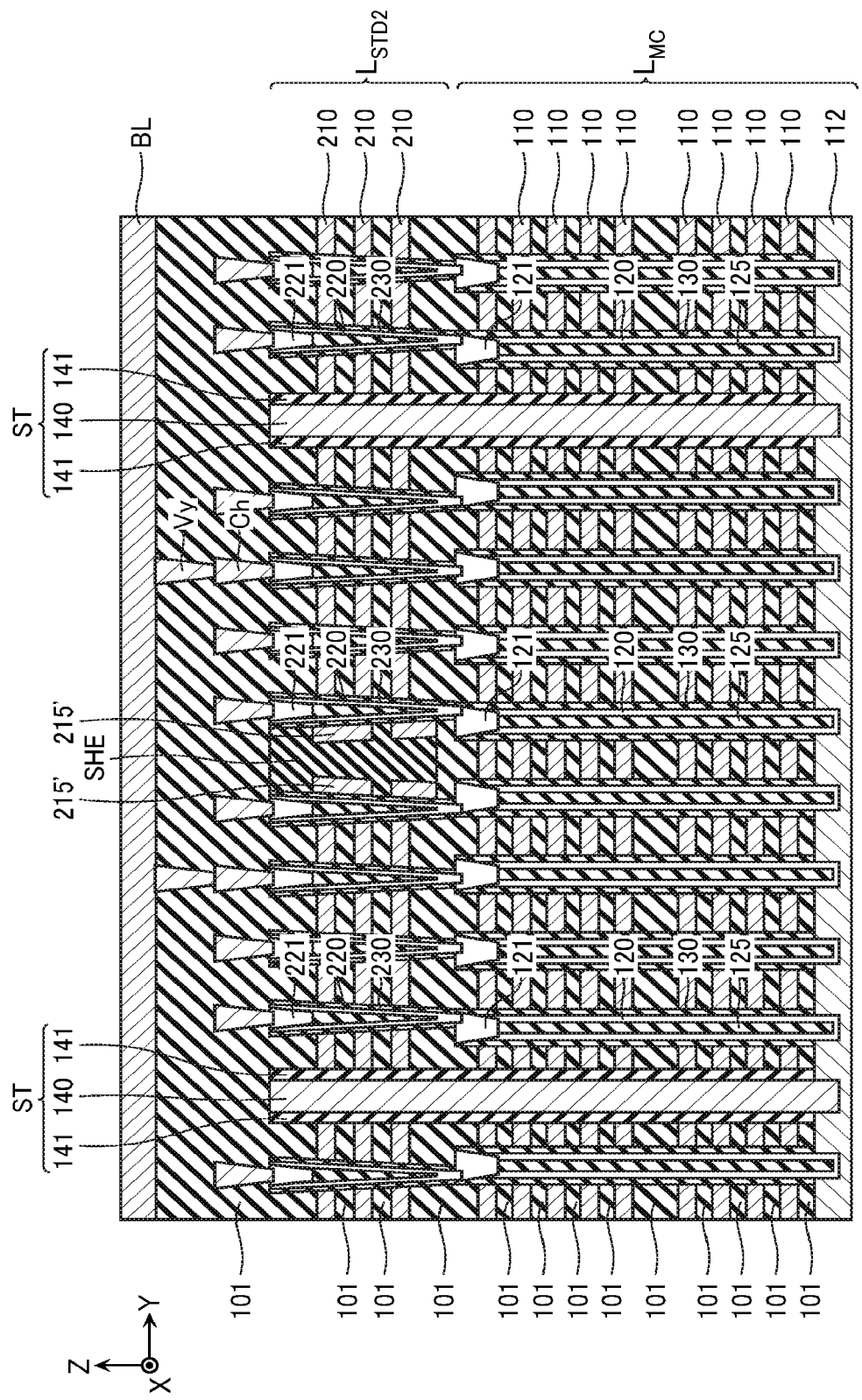
FIG. 44 is a schematic cross-sectional view showing a configuration of the semiconductor memory device according to the second embodiment.

Next, a semiconductor memory device according to a second embodiment will be described with reference to FIGS. 43 and 44. FIG. 43, which is a schematic cross-sectional view showing a configuration of part of the semiconductor memory device according to the second embodiment, shows a configuration of the portion corresponding to FIG. 6. FIG. 44, which is a schematic cross-sectional view showing a configuration of part of same semiconductor memory device, shows a configuration of the portion corresponding to FIG. 7.

The semiconductor memory device according to the second embodiment is basically configured similarly to the semiconductor memory device according to the first embodiment. However, the semiconductor memory device according to the second embodiment comprises a drain side select transistor layer $L_{STD2}$ instead of the drain side select transistor layer $L_{STD}$.

The drain side select transistor layer $L_{STD2}$ according to the second embodiment is basically configured similarly to the drain side select transistor layer $L_{STD}$ according to the first embodiment. However, the drain side select transistor layer $L_{STD2}$ according to the second embodiment comprises two conductive layers 215' arranged in the Z direction, instead of the conductive layer 215.

The conductive layer 215' according to the second embodiment is basically configured similarly to the conductive layer 215 according to the first embodiment. However, the conductive layer 215 according to the first embodiment was provided more downwardly than the lower surface of the conductive layer 210 the position of whose lower end is most downwardly positioned, and was provided more upwardly than the upper surface of the conductive layer 210 the position of whose upper end is most upwardly positioned. Moreover, one conductive layer 215 was connected to all of the conductive layers 210 arranged in the Z direction. On the other hand, in the second embodiment, an upper end of the downwardly positioned conductive layer 215' is provided more downwardly than the lower surface of the most upwardly positioned conductive layer 210, and such a conductive layer 215' is connected to a downwardly positioned one or plurality of the conductive layers 210. Moreover, a lower end of the upwardly positioned conductive layer 215' is provided more upwardly than the upper surface of the most downwardly positioned conductive layer 210, and such a conductive layer 215' is connected to an upwardly positioned one or plurality of the conductive layers 210.

[Manufacturing Method]

Next, a manufacturing method of the semiconductor memory device according to the present embodiment will be described with reference to FIGS. 45 to 54. FIGS. 45 to 54, which are schematic cross-sectional views for explaining same manufacturing method, each show a cross section corresponding to FIG. 44.

The manufacturing method of the semiconductor memory device according to the present embodiment is similar to the manufacturing method according to the first embodiment up to the step described with reference to FIG. 27.

Figure 45:
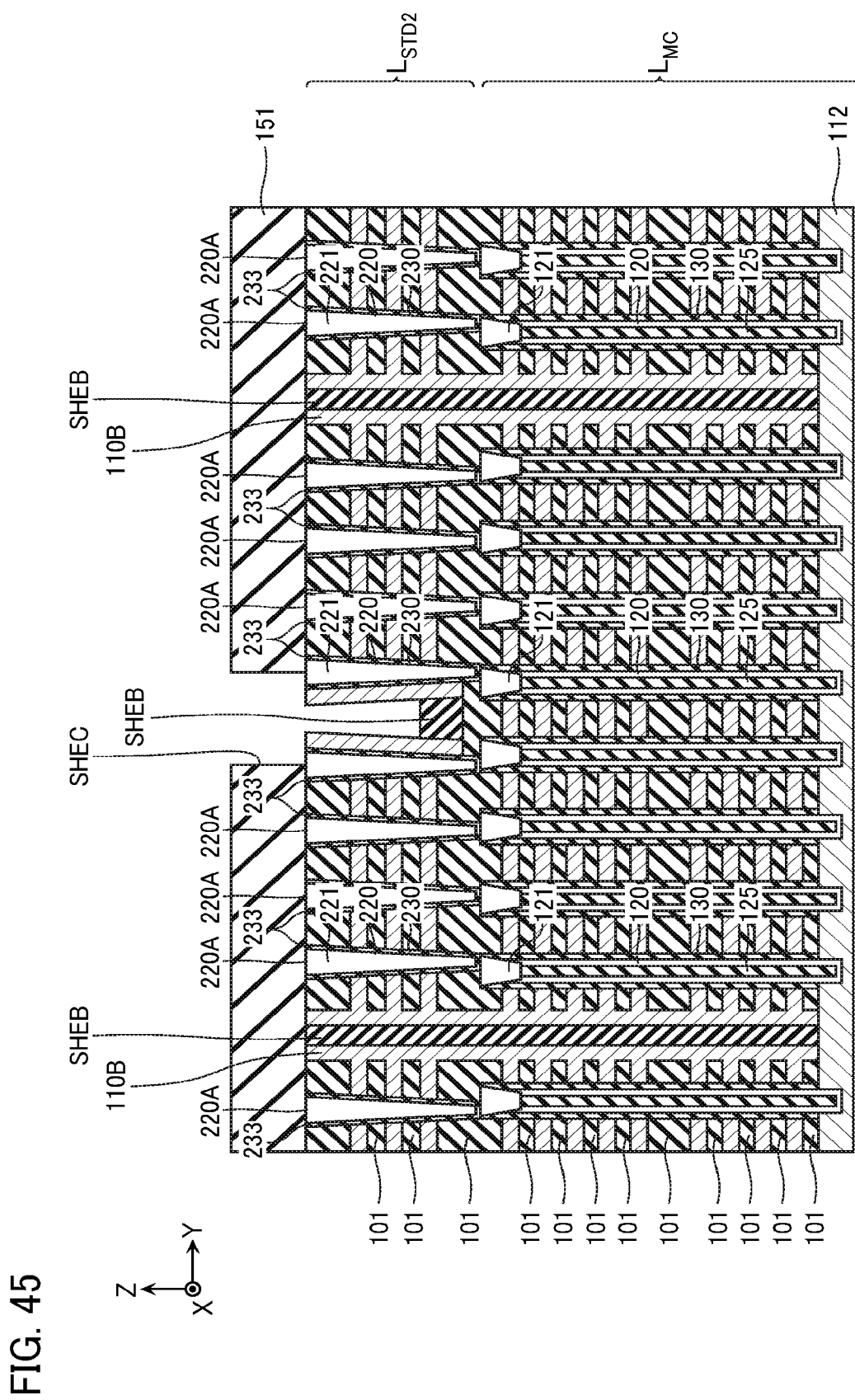
FIG. 45 is a schematic cross-sectional view for explaining a manufacturing method of the semiconductor memory device according to the second embodiment.

Next, as shown in FIG. 45, for example, part of the sacrifice layer SHEB is removed to expose a side surface in the Y direction of part of the conductive layer 110B. This step is performed by a method such as RIE, for example. Moreover, this step is performed in such a manner that the upper surface of the sacrifice layer SHEB will be positioned at a position corresponding to downward of the lower surface of the uppermost-layer conductive layer 210 and upward of the upper surface of the lowermost-layer conductive layer 210.

Figure 46:
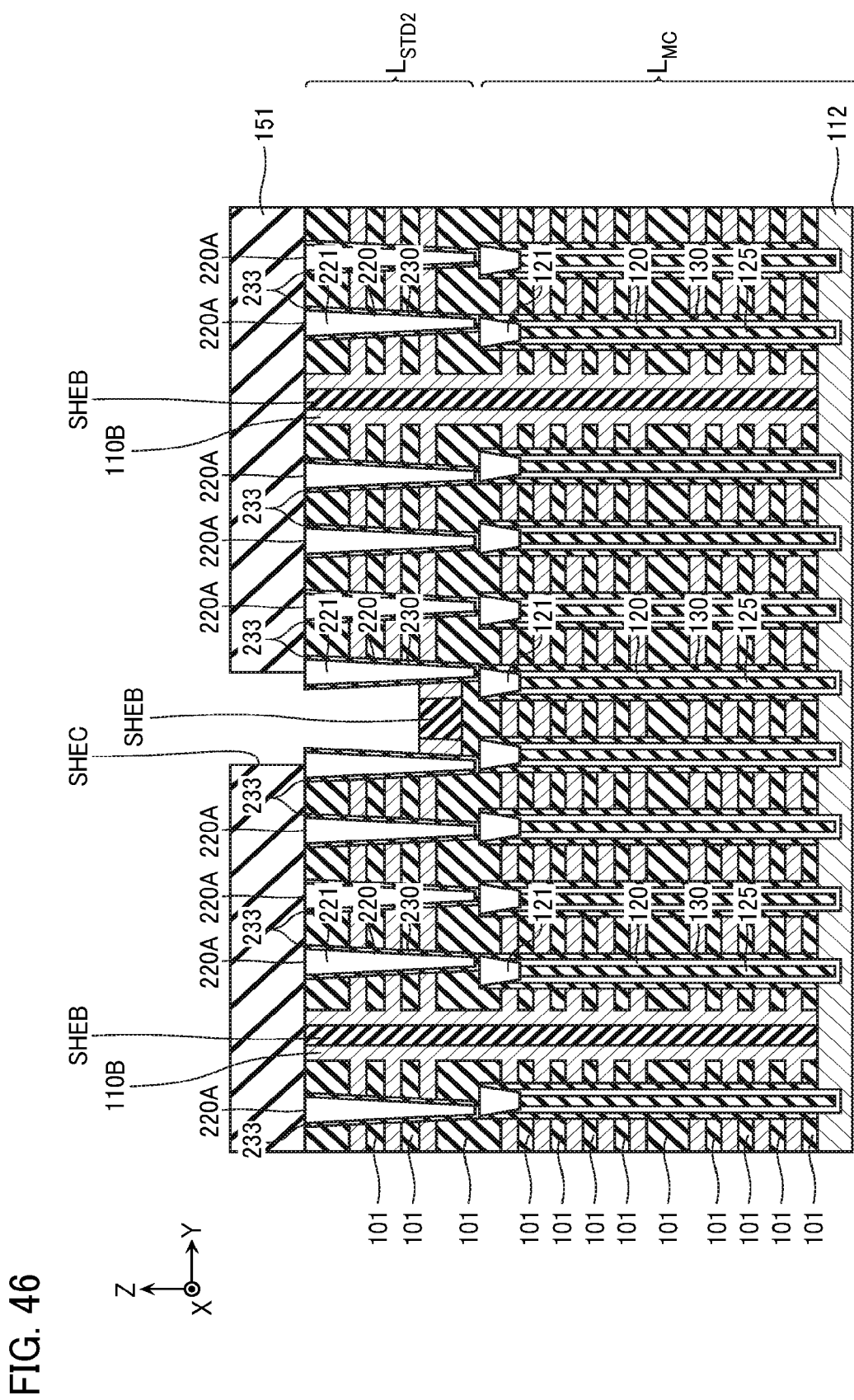
FIG. 46 is a schematic cross-sectional view for explaining same manufacturing method.

Next, as shown in FIG. 46, for example, a portion provided on part of a side surface of the block insulating film 233, of the conductive layer 110B, is removed. This step is performed by a method such as wet etching, for example.

Figure 47:
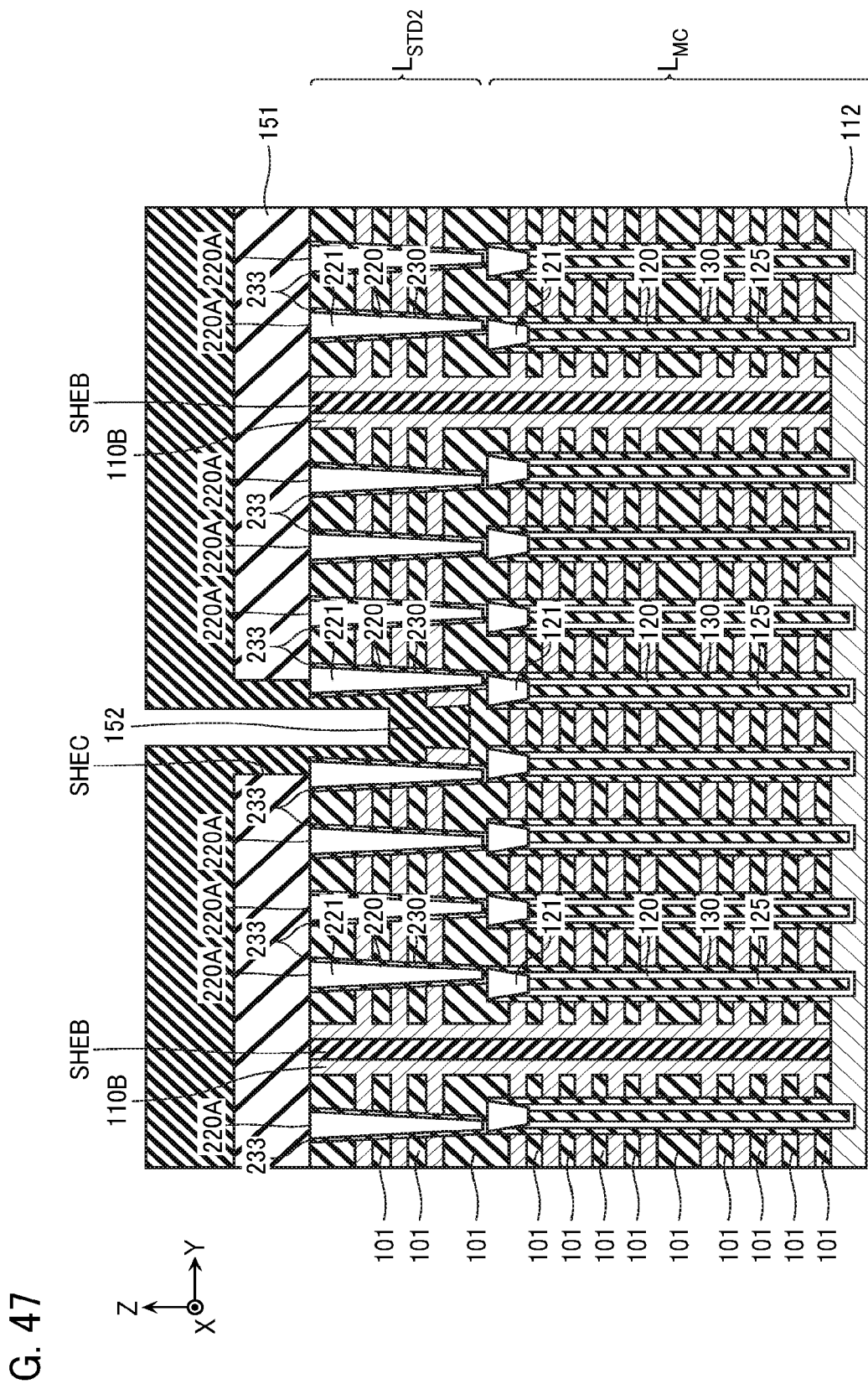
FIG. 47 is a schematic cross-sectional view for explaining same manufacturing method.

Next, as shown in FIG. 47, for example, the sacrifice layer SHEB formed inside the trench SHEA is removed. This step is performed by a method such as wet etching, for example.

In addition, an insulating layer 152 is formed on an upper surface of the insulating layer 151 and inside the trench SHEA, for example. The insulating layer 152 is an insulating layer of the likes of silicon oxide ($SiO_2$), for example. This step is performed by a method such as sputtering, for example. Moreover, in this step, film formation of the insulating layer 152 is performed thinly enough for the trench SHEA not to be fully filled in.

Figure 48:
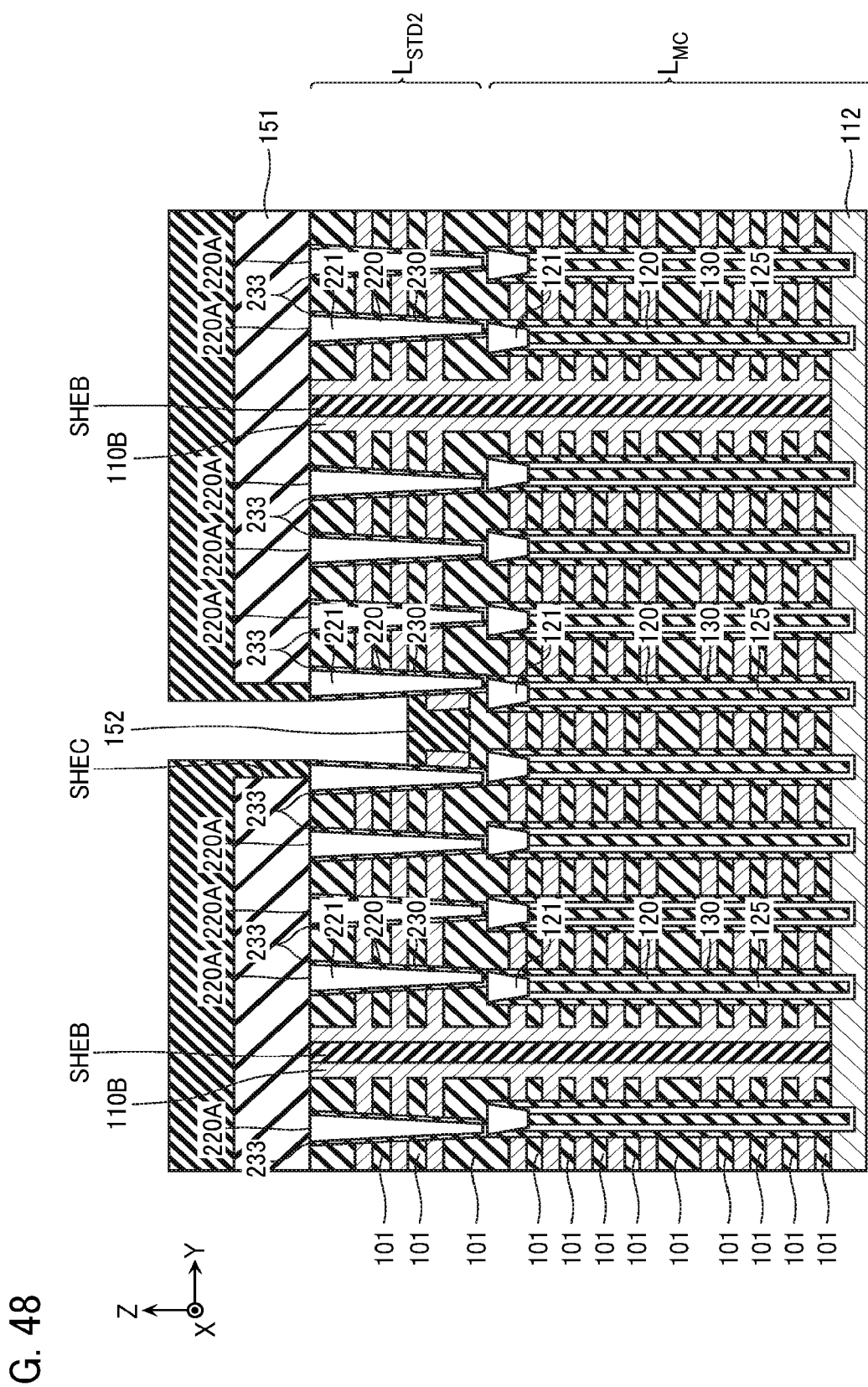
FIG. 48 is a schematic cross-sectional view for explaining same manufacturing method.

Next, as shown in FIG. 48, for example, part of the insulating layer 152 is removed to expose part of the side surface of the block insulating film 233. This step is performed by a method such as wet etching, for example.

Figure 49:
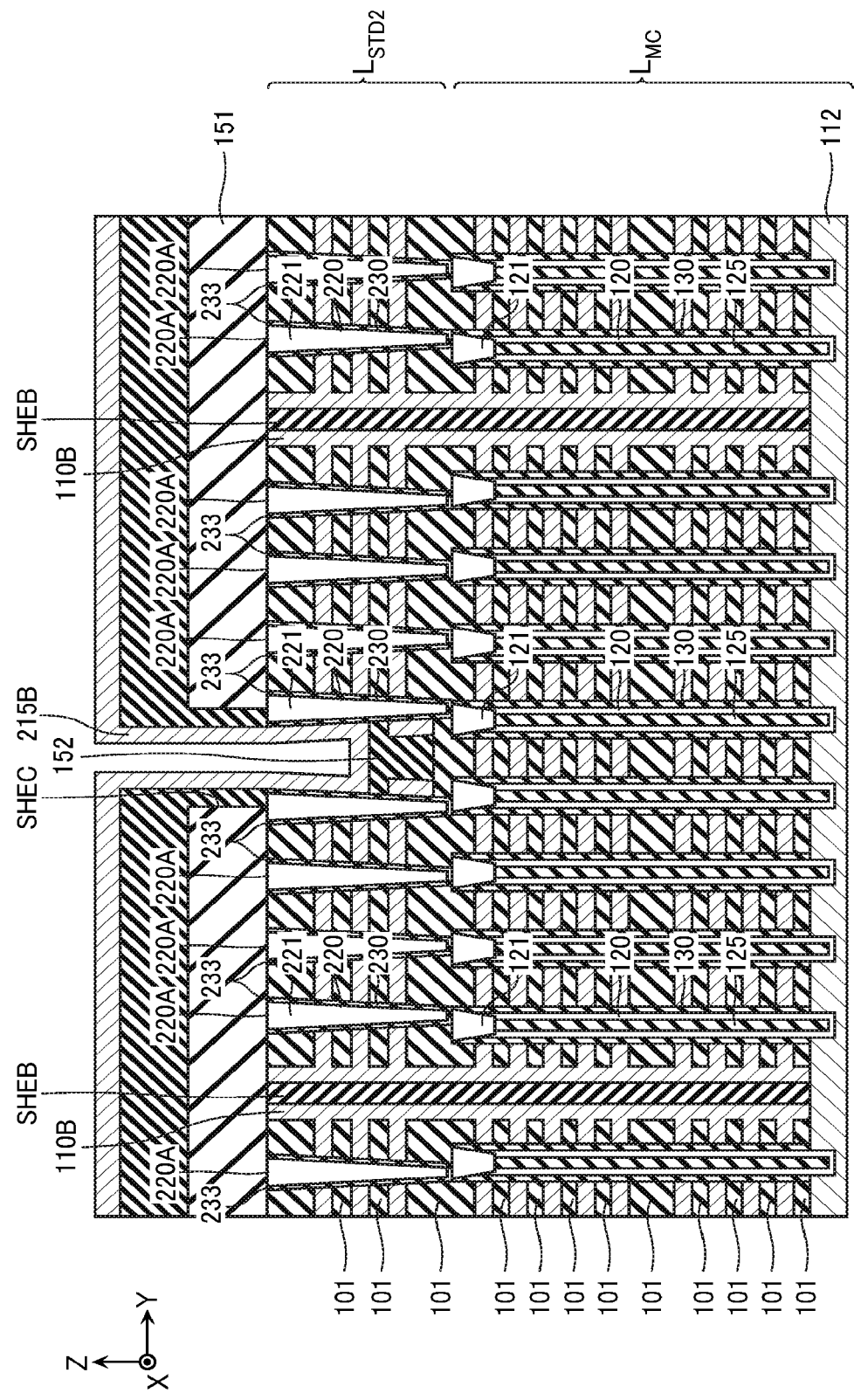
FIG. 49 is a schematic cross-sectional view for explaining same manufacturing method.

Next, as shown in FIG. 49, for example, a conductive layer 215B is formed on an upper surface and a side surface of the insulating layer 152. This step is performed by a method such as CVD, for example.

Figure 50:
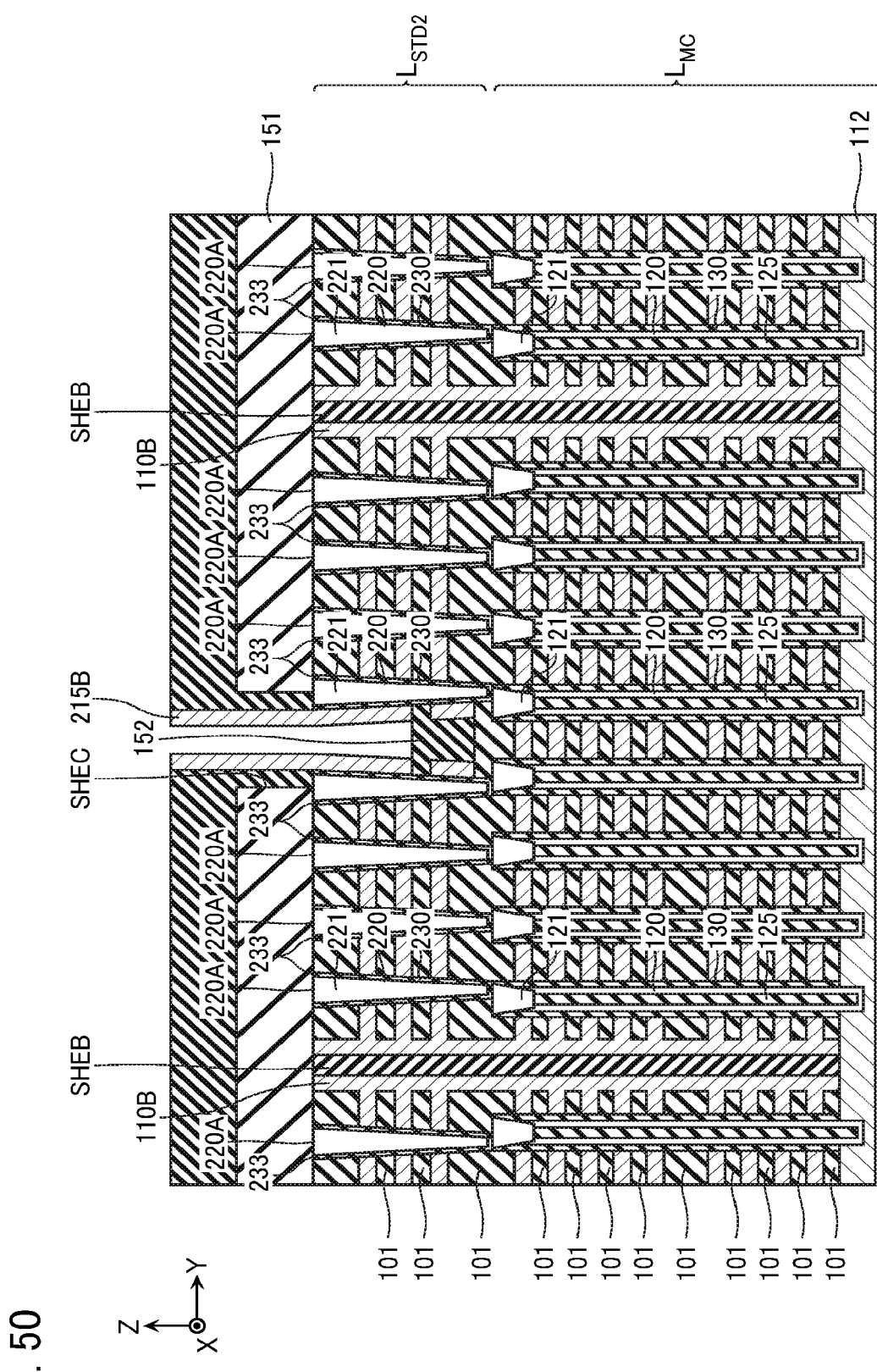
FIG. 50 is a schematic cross-sectional view for explaining same manufacturing method.

Next, as shown in FIG. 50, for example, a portion covering the upper surface of the insulating layer 152, of the conductive layer 215B is removed. This step is performed by a method such as RIE, for example.

Figure 51:
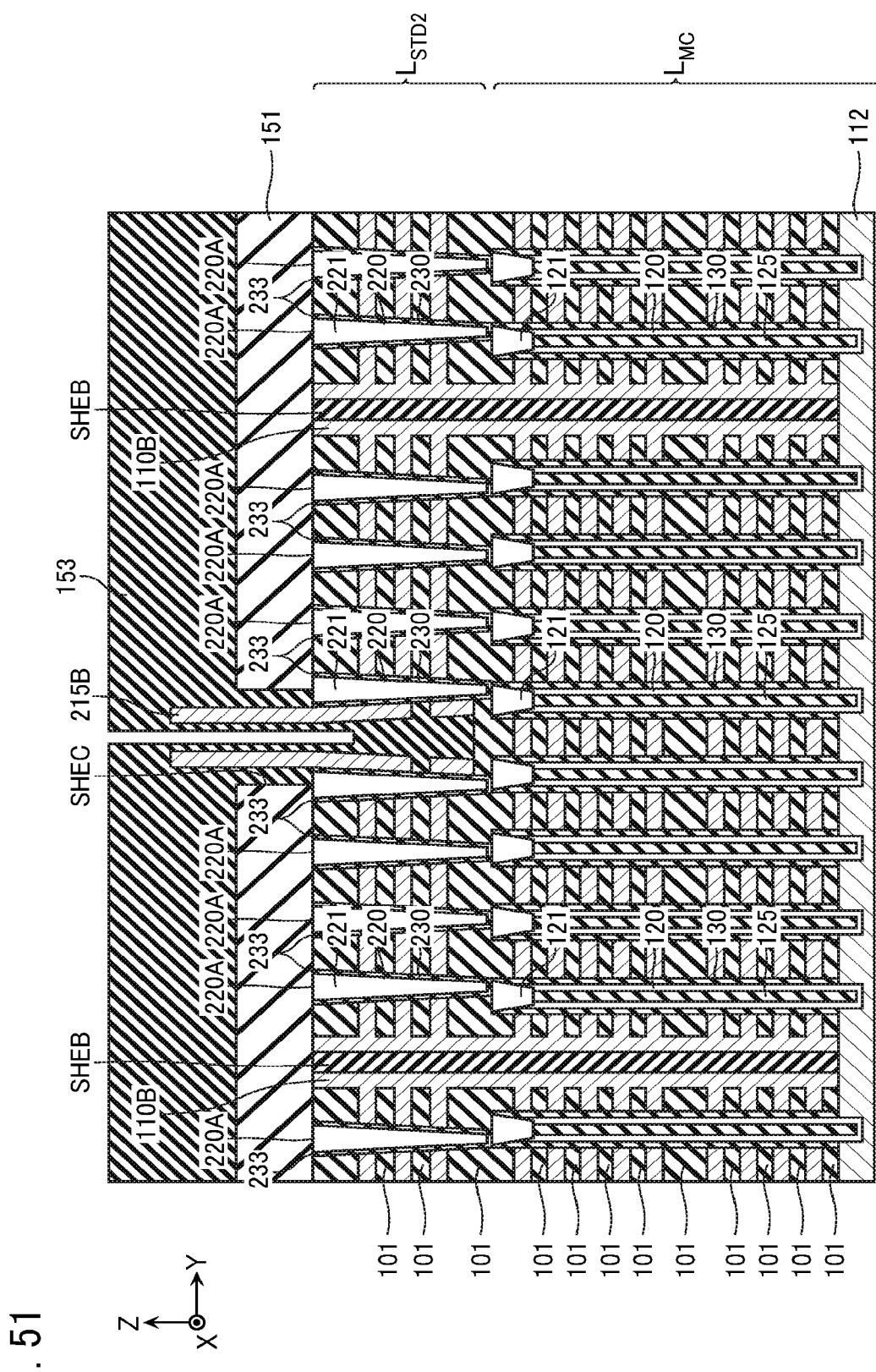
FIG. 51 is a schematic cross-sectional view for explaining same manufacturing method.

Next, as shown in FIG. 51, for example, an insulating layer 153 is formed on the upper surface of the insulating layer 152 and a side surface of the conductive layer 215B. The insulating layer 153 is an insulating layer of the likes of silicon oxide ($SiO_2$), for example. This step is performed by a method such as sputtering, for example. Moreover, in this step, film formation of the insulating layer 153 is performed thinly enough for the trench SHEA not to be fully filled in.

Figure 52:
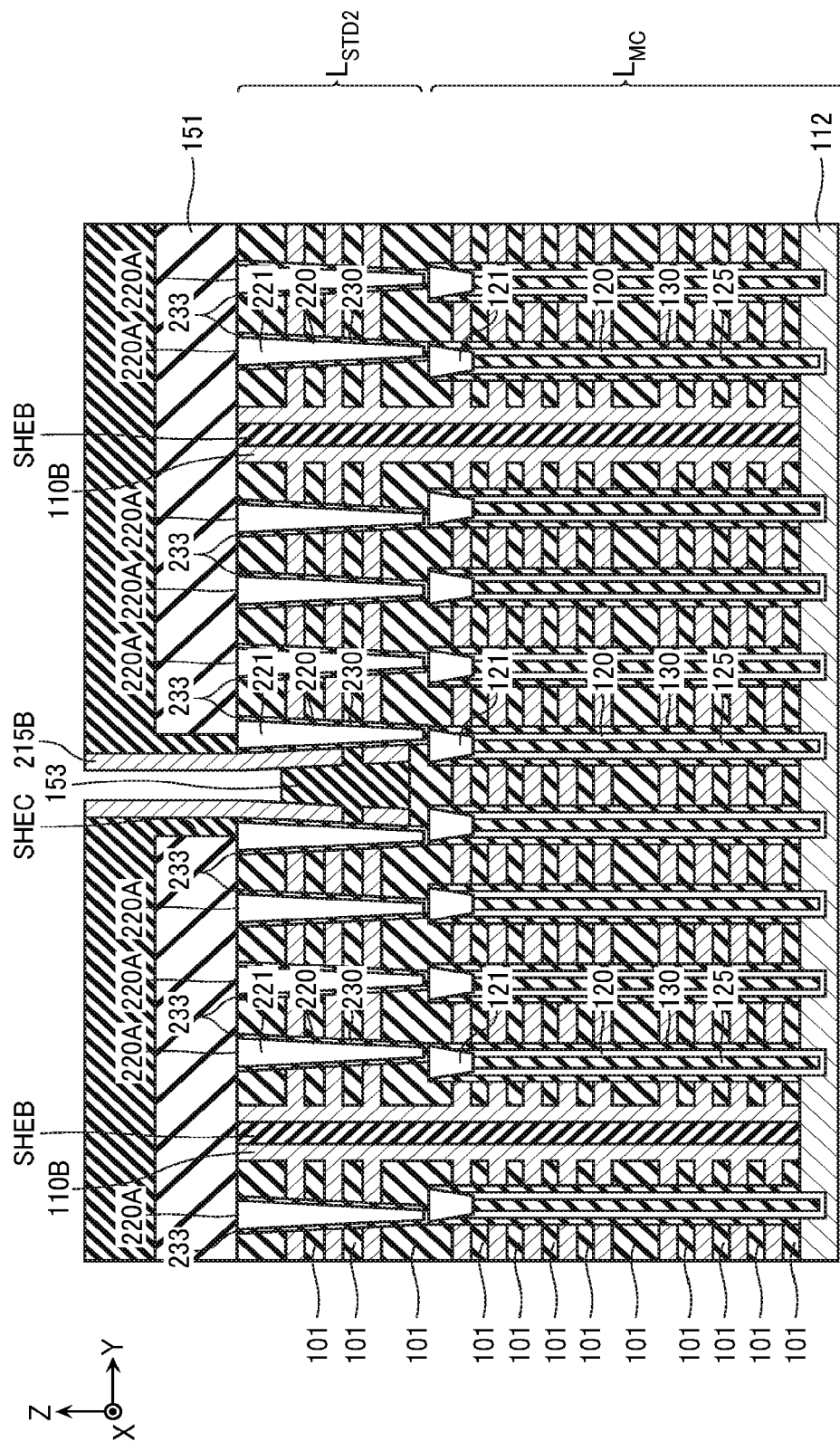
FIG. 52 is a schematic cross-sectional view for explaining same manufacturing method.

Next, as shown in FIG. 52, for example, part of the insulating layer 153 is removed to expose part of the side surface of the conductive layer 215B. This step is performed by a method such as wet etching, for example.

Figure 53:
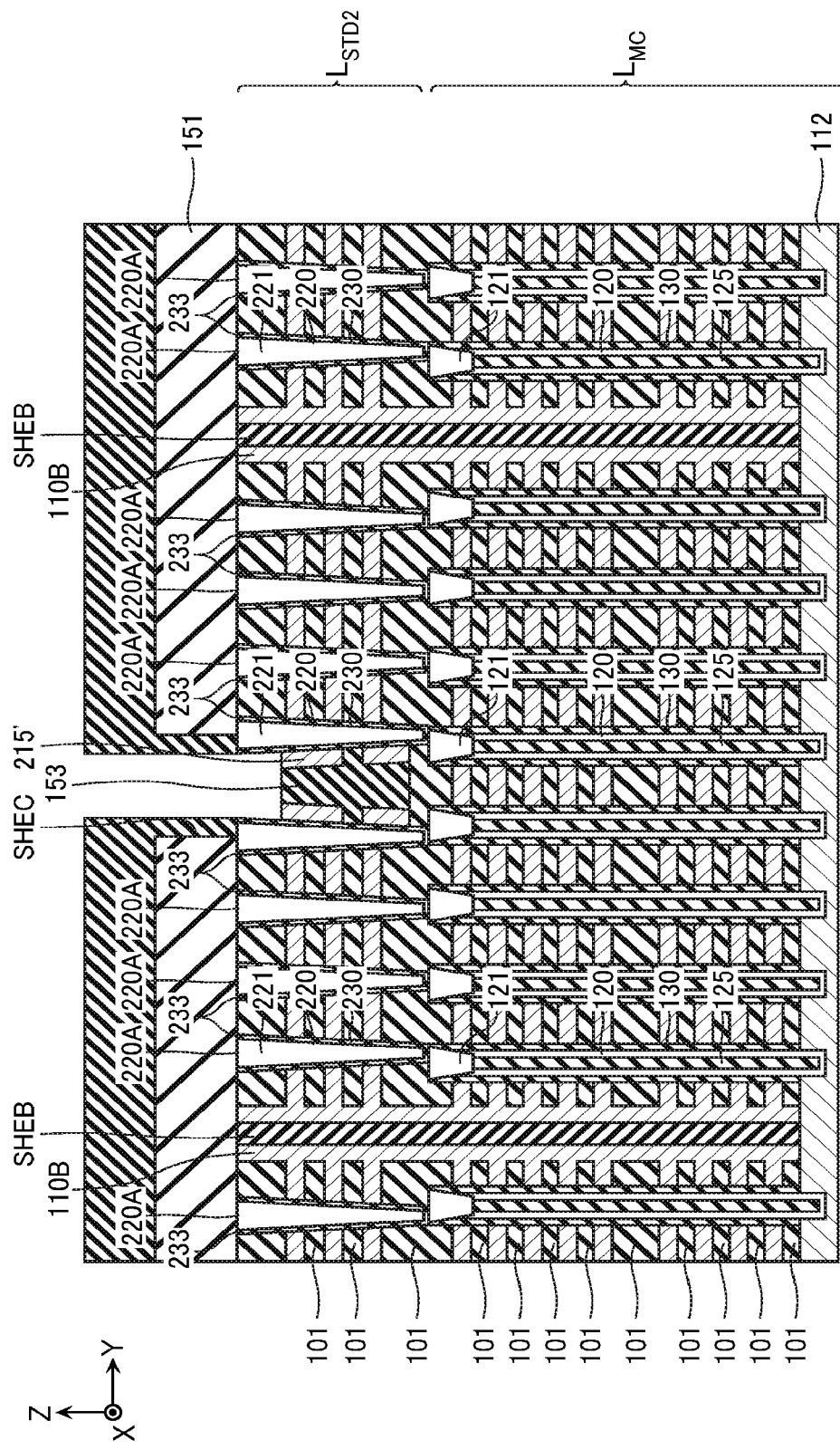
FIG. 53 is a schematic cross-sectional view for explaining same manufacturing method.

Next, as shown in FIG. 53, for example, a portion not covered by the insulating layer 153, of the conductive layer 215B, is removed. This step is performed by a method such as wet etching, for example.

Figure 54:
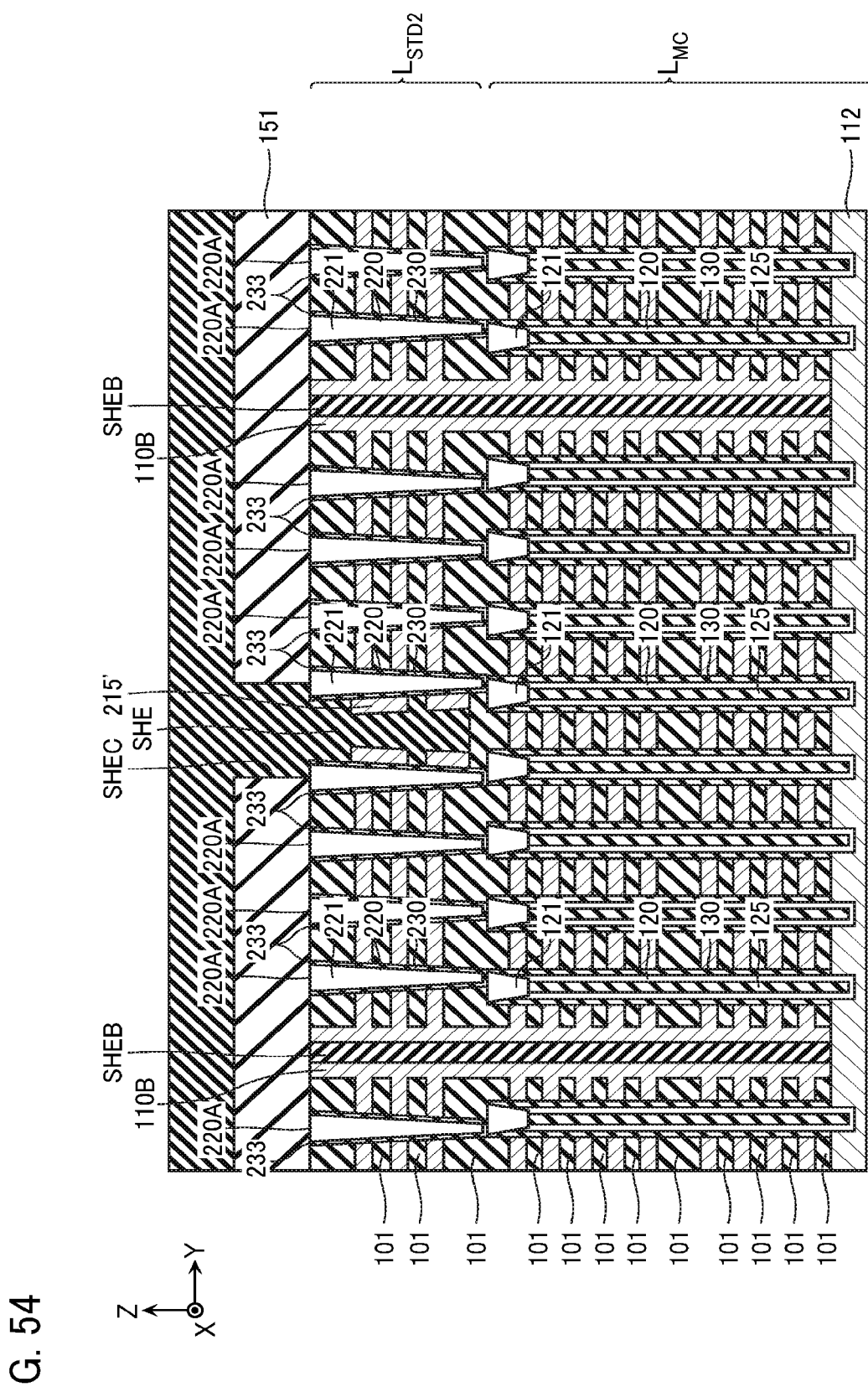
FIG. 54 is a schematic cross-sectional view for explaining same manufacturing method.

Next, as shown in FIG. 54, for example, the inter-string unit insulating layer SHE is formed inside the trench SHEA. This step is performed by a method such as CVD, for example.

Subsequently, steps of the step described with reference to FIG. 32 onwards of the manufacturing method according to the first embodiment are executed, whereby the semiconductor memory device according to the second embodiment is manufactured.

Other Embodiments

That concludes description of the semiconductor memory devices according to the first and second embodiments. However, configurations of the semiconductor memory devices according to the first and second embodiments are merely exemplifications, and specific configurations thereof may be appropriately adjusted.

For example, the semiconductor memory devices according to the first and second embodiments are manufactured by forming the transistor layer $L_{TR}$ and the memory cell layer $L_{MC}$ on the same wafer. In such a configuration, as described with reference to the likes of FIG. 3, for example, the drain side select transistor layer $L_{STD}$ is provided above the memory cell layer $L_{MC}$. However, the semiconductor memory device may be manufactured by, for example, forming the transistor layer $L_{TR}$ and the memory cell layer $L_{MC}$ on separate wafers and bonding these two wafers. In such a case, the drain side select transistor layer $L_{STD}$ is sometimes provided below the memory cell layer $L_{MC}$.

Figure 55:
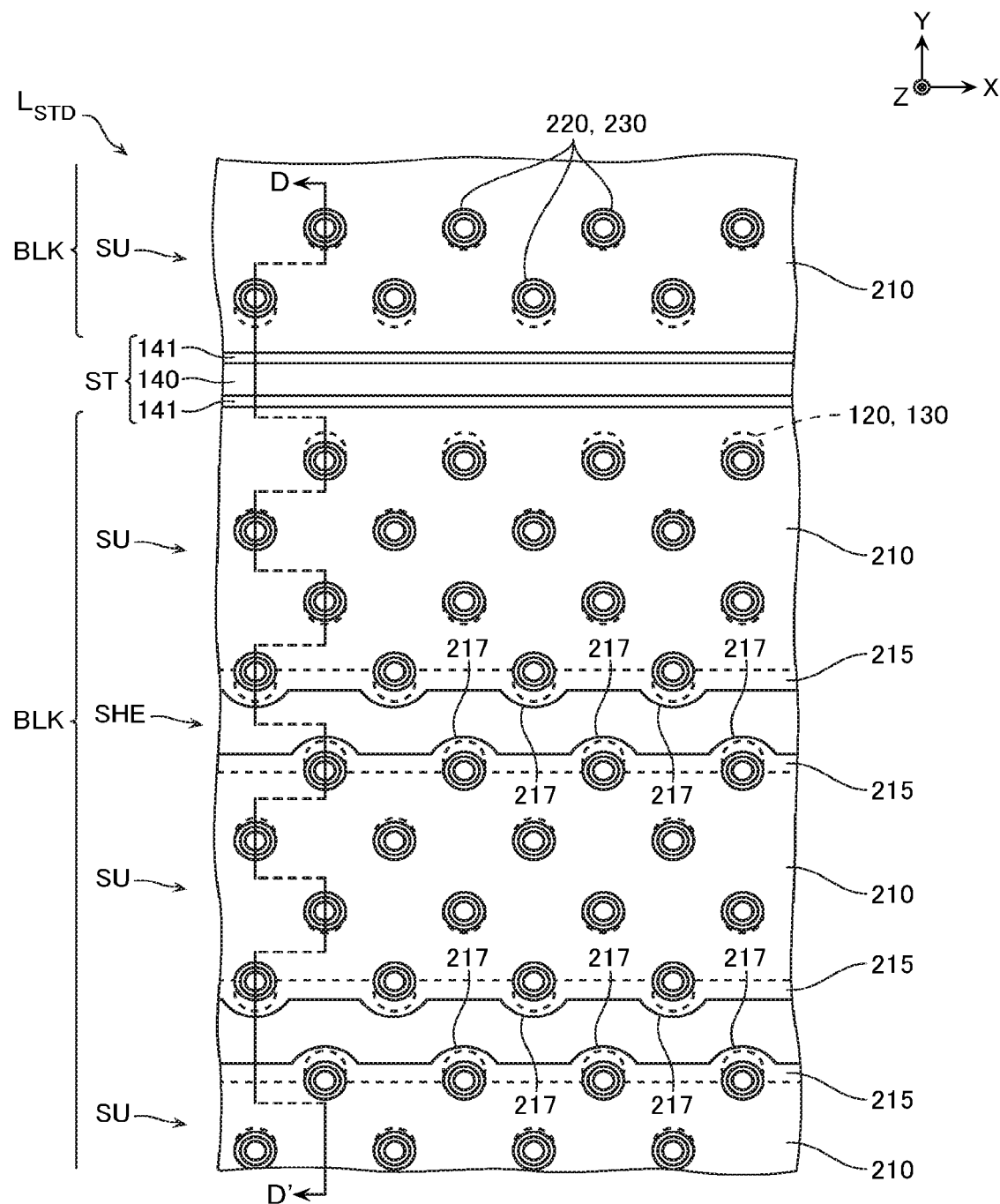
FIG. 55 is a schematic plan view showing a configuration of a semiconductor memory device according to another embodiment.
Figure 56:
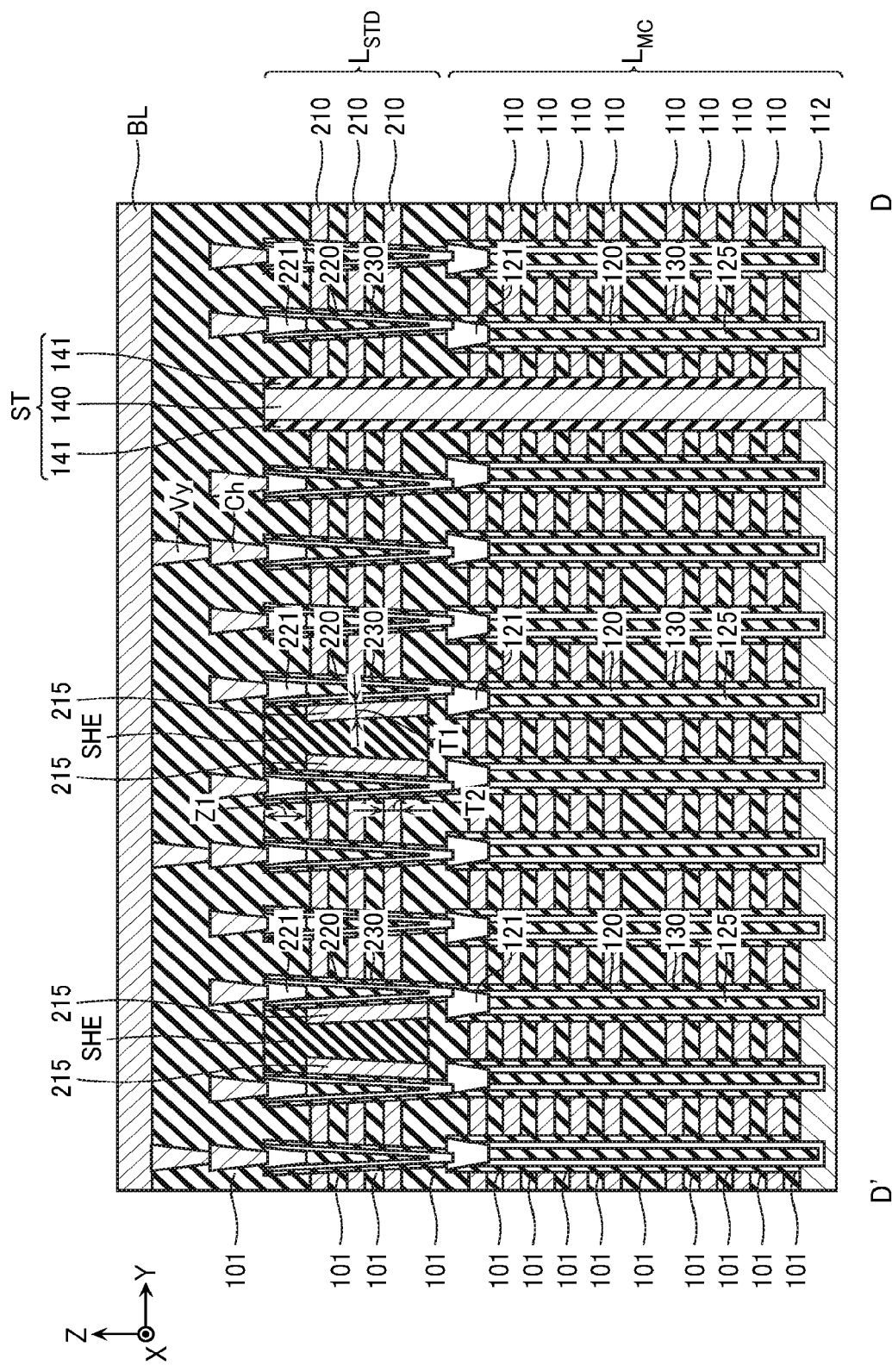
FIG. 56 is a schematic cross-sectional view showing a configuration of a semiconductor memory device according to another embodiment.

Moreover, for example, in the first and second embodiments, as described with reference to the likes of FIG. 4, for example, the memory block BLK comprises two of the string units SU arranged in the Y direction. However, as exemplified in FIGS. 55 and 56, for example, the memory block BLK according to the first and second embodiments may comprise three or more of the string units SU arranged in the Y direction.

Moreover, for example, in the first and second embodiments, as described with reference to the likes of FIGS. 8 to 10, for example, the conductive layers 110, 210, 215 comprise laminated films of the barrier conductive films 113, 213 and the metal films 114, 214. Moreover, contact portions with the conductive layers 110, 210, 215 of the gate insulating films 130, 230 are provided with the high-dielectric-constant insulating films 134, 234. However, such configurations are merely exemplifications, and specific configurations may be appropriately adjusted. For example, the barrier conductive films 113, 213 may be omitted from all of the conductive layers 110, 210, 215, or the high-dielectric-constant insulating films 134, 234 may be omitted from all of the gate insulating films 130, 230.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a substrate;
    a plurality of first conductive layers that are arranged in a first direction intersecting a surface of the substrate;
    a first semiconductor layer that extends in the first direction and faces the plurality of first conductive layers;
    a second semiconductor layer that extends in the first direction, faces the plurality of first conductive layers, and is spaced from the first semiconductor layer in a second direction intersecting the first direction;
    a plurality of second conductive layers that are provided at a position overlapping the plurality of first conductive layers when viewed from the first direction, and are arranged in the first direction;
    a plurality of third conductive layers that are provided at a position overlapping the plurality of first conductive layers when viewed from the first direction, are arranged in the first direction, and are arranged with the plurality of second conductive layers in the second direction;
    a third semiconductor layer that extends in the first direction, faces the plurality of second conductive layers, and includes one end in the first direction connected to the first semiconductor layer;

a fourth semiconductor layer that extends in the first direction, faces the plurality of third conductive layers, and includes one end in the first direction connected to the second semiconductor layer;

a fourth conductive layer that is provided between the plurality of second conductive layers and the plurality of third conductive layers, and faces part of an outer peripheral surface of the third semiconductor layer; and a fifth conductive layer that is provided between the plurality of second conductive layers and the plurality of third conductive layers, and is connected to the plurality of third conductive layers, wherein, when a cross section that extends in the first direction and the second direction and includes part of the first semiconductor layer, part of the second semiconductor layer, part of the third semiconductor layer, and part of the fourth semiconductor layer is assumed to be a first cross section, in the first cross section, a distance from a central axis of the third semiconductor layer to a central axis of the fourth semiconductor layer being larger than a distance from a central axis of the first semiconductor layer to a central axis of the second semiconductor layer.

2. The semiconductor memory device according to claim 1, wherein
the fourth conductive layer is connected to the plurality of second conductive layers.

3. The semiconductor memory device according to claim 1, wherein
in the first cross section, when
a position in the first direction of an end portion of the third semiconductor layer that is on an opposite side to the first semiconductor layer in the first direction is assumed to be a first position,
a position in the first direction of an end portion of the fourth conductive layer that is on an opposite side to the first semiconductor layer in the first direction is assumed to be a second position, and
a distance in the second direction from a side surface of the fourth conductive layer on a third conductive layer side in the second direction to a side surface of the fourth conductive layer on a third semiconductor layer side in the second direction is assumed to be a first distance,
a distance in the first direction between the first position and the second position is larger than the first distance.

4. The semiconductor memory device according to claim 1, comprising:
a first gate insulating layer provided between the plurality of first conductive layers and the first semiconductor layer;
a second gate insulating layer provided between the plurality of first conductive layers and the second semiconductor layer;
a third gate insulating layer provided between the plurality of second conductive layers and the third semiconductor layer; and
a fourth gate insulating layer provided between the plurality of third conductive layers and the fourth semiconductor layer, wherein
the fourth conductive layer contacts the third gate insulating layer.

5. The semiconductor memory device according to claim 1, comprising:

a sixth conductive layer that is provided at a position overlapping the plurality of second conductive layers when viewed from the first direction, and faces the third semiconductor layer;

a seventh conductive layer that is provided at a position overlapping the plurality of third conductive layers when viewed from the first direction, is arranged with the sixth conductive layer in the second direction, and faces the fourth semiconductor layer;

an eighth conductive layer that is provided between the sixth conductive layer and the seventh conductive layer, and faces part of the outer peripheral surface of the third semiconductor layer; and a ninth conductive layer that is provided between the sixth conductive layer and the seventh conductive layer, and is connected to the seventh conductive layer, wherein the eighth conductive layer is spaced from the fourth conductive layer in the first direction, and the ninth conductive layer is spaced from the fifth conductive layer in the first direction.

6. The semiconductor memory device according to claim 5, wherein
the eighth conductive layer is connected to the sixth conductive layer.

7. The semiconductor memory device according to claim 5, comprising:
a first gate insulating layer provided between the plurality of first conductive layers and the first semiconductor layer;
a second gate insulating layer provided between the plurality of first conductive layers and the second semiconductor layer;
a third gate insulating layer provided between the plurality of second conductive layers and the third semiconductor layer; and
a fourth gate insulating layer provided between the plurality of third conductive layers and the fourth semiconductor layer, wherein
the fourth conductive layer contacts the third gate insulating layer, and
the eighth conductive layer contacts the third gate insulating layer.

8. The semiconductor memory device according to claim 1, comprising:
a first insulating layer including an outer peripheral surface covered by the first semiconductor layer;
a second insulating layer including an outer peripheral surface covered by the second semiconductor layer;
a third insulating layer including an outer peripheral surface covered by the third semiconductor layer; and
a fourth insulating layer including an outer peripheral surface covered by the fourth semiconductor layer, wherein
the third insulating layer is spaced from the first insulating layer in the first direction, and
the fourth insulating layer is spaced from the second insulating layer in the first direction.

9. The semiconductor memory device according to claim 1, comprising:
a first impurity region provided at one end in the first direction of the first semiconductor layer; and
a second impurity region provided at one end in the first direction of the second semiconductor layer, wherein
the third semiconductor layer includes one end in the first direction connected to the first impurity region, and
the fourth semiconductor layer includes one end in the first direction connected to the second impurity region.

10. A semiconductor memory device comprising:
a substrate;
a plurality of first conductive layers that are arranged in a first direction intersecting a surface of the substrate;
a first semiconductor layer that extends in the first direction and faces the plurality of first conductive layers;
a second semiconductor layer that extends in the first direction, faces the plurality of first conductive layers, and is spaced from the first semiconductor layer in a second direction intersecting the first direction;
a plurality of second conductive layers that are provided at a position overlapping the plurality of first conductive layers when viewed from the first direction, and are arranged in the first direction;
a plurality of third conductive layers that are provided at a position overlapping the plurality of first conductive layers when viewed from the first direction, are arranged in the first direction, and are arranged with the plurality of second conductive layers in the second direction;
a third semiconductor layer that extends in the first direction, faces the plurality of second conductive layers, and includes one end in the first direction connected to the first semiconductor layer;
a fourth semiconductor layer that extends in the first direction, faces the plurality of third conductive layers, and includes one end in the first direction connected to the second semiconductor layer;
a fourth conductive layer that is provided between the plurality of second conductive layers and the plurality of third conductive layers, and faces part of an outer peripheral surface of the third semiconductor layer; and
a fifth conductive layer that is provided between the plurality of second conductive layers and the plurality of third conductive layers, and is connected to the plurality of third conductive layers,
wherein, when a cross section that extends in the first direction and the second direction and includes part of the first semiconductor layer, part of the second semiconductor layer, part of the third semiconductor layer, and part of the fourth semiconductor layer is assumed to be a first cross section,
in the first cross section, a position in the first direction of an end portion of the third semiconductor layer that is on an opposite side to the first semiconductor layer in the first direction is assumed to be a first position,
in the first cross section, a position in the first direction of an end portion of the fourth conductive layer that is on an opposite side to the first semiconductor layer in the first direction is assumed to be a second position, and
in the first cross section, a distance in the second direction from a side surface of the fourth conductive layer on a third conductive layer side in the second direction to a side surface of the fourth conductive layer on a third semiconductor layer side in the second direction is assumed to be a first distance,
a distance in the first direction between the first position and the second position being larger than the first distance.

11. The semiconductor memory device according to claim 10, wherein
the fourth conductive layer is connected to the plurality of second conductive layers.

12. The semiconductor memory device according to claim 10, comprising:
a first gate insulating layer provided between the plurality of first conductive layers and the first semiconductor layer;
a second gate insulating layer provided between the plurality of first conductive layers and the second semiconductor layer;
a third gate insulating layer provided between the plurality of second conductive layers and the third semiconductor layer; and
a fourth gate insulating layer provided between the plurality of third conductive layers and the fourth semiconductor layer, wherein
the fourth conductive layer contacts the third gate insulating layer.

13. The semiconductor memory device according to claim 10, comprising:
a first insulating layer including an outer peripheral surface covered by the first semiconductor layer;
a second insulating layer including an outer peripheral surface covered by the second semiconductor layer;
a third insulating layer including an outer peripheral surface covered by the third semiconductor layer; and
a fourth insulating layer including an outer peripheral surface covered by the fourth semiconductor layer, wherein
the third insulating layer is spaced from the first insulating layer in the first direction, and
the fourth insulating layer is spaced from the second insulating layer in the first direction.

14. The semiconductor memory device according to claim 10, comprising:
a first impurity region provided at one end in the first direction of the first semiconductor layer; and
a second impurity region provided at one end in the first direction of the second semiconductor layer, wherein
the third semiconductor layer includes one end in the first direction connected to the first impurity region, and
the fourth semiconductor layer includes one end in the first direction connected to the second impurity region.

15. A semiconductor memory device comprising:
a substrate;
a plurality of first conductive layers that are arranged in a first direction intersecting a surface of the substrate;
a first semiconductor layer that extends in the first direction and faces the plurality of first conductive layers;
a second semiconductor layer that extends in the first direction, faces the plurality of first conductive layers, and is spaced from the first semiconductor layer in a second direction intersecting the first direction;
a plurality of second conductive layers that are provided at a position overlapping the plurality of first conductive layers when viewed from the first direction, and are arranged in the first direction;
a plurality of third conductive layers that are provided at a position overlapping the plurality of first conductive layers when viewed from the first direction, are arranged in the first direction, and are arranged with the plurality of second conductive layers in the second direction;
a fourth conductive layer that is provided at a position overlapping the plurality of second conductive layers when viewed from the first direction;
a fifth conductive layer that is provided at a position overlapping the plurality of third conductive layers when viewed from the first direction, and is arranged with the fourth conductive layer in the second direction;

a third semiconductor layer that extends in the first direction, faces the plurality of second conductive layers and the fourth conductive layer, and includes one end in the first direction connected to the first semiconductor layer;

a fourth semiconductor layer that extends in the first direction, faces the plurality of third conductive layers and the fifth conductive layer, and includes one end in the first direction connected to the second semiconductor layer;

a sixth conductive layer that is provided between the plurality of second conductive layers and the plurality of third conductive layers, and faces part of an outer peripheral surface of the third semiconductor layer;

a seventh conductive layer that is provided between the plurality of second conductive layers and the plurality of third conductive layers, and is connected to the plurality of third conductive layers;

an eighth conductive layer that is provided between the fourth conductive layer and the fifth conductive layer, and faces part of the outer peripheral surface of the third semiconductor layer; and a ninth conductive layer that is provided between the fourth conductive layer and the fifth conductive layer, and is connected to the fifth conductive layer, the eighth conductive layer being spaced from the sixth conductive layer in the first direction, and the ninth conductive layer being spaced from the seventh conductive layer in the first direction.

16. The semiconductor memory device according to claim 15, wherein
the sixth conductive layer is connected to the plurality of second conductive layers, and
the eighth conductive layer is connected to the fourth conductive layer.

17. The semiconductor memory device according to claim 15, comprising:
a first gate insulating layer provided between the plurality of first conductive layers and the first semiconductor layer;
a second gate insulating layer provided between the plurality of first conductive layers and the second semiconductor layer;
a third gate insulating layer provided between the plurality of second conductive layers and the third semiconductor layer; and
a fourth gate insulating layer provided between the plurality of third conductive layers and the fourth semiconductor layer, wherein
the sixth conductive layer contacts the third gate insulating layer, and
the eighth conductive layer contacts the third gate insulating layer.

18. The semiconductor memory device according to claim 15, comprising:
a first insulating layer including an outer peripheral surface covered by the first semiconductor layer;
a second insulating layer including an outer peripheral surface covered by the second semiconductor layer;
a third insulating layer including an outer peripheral surface covered by the third semiconductor layer; and
a fourth insulating layer including an outer peripheral surface covered by the fourth semiconductor layer, wherein
the third insulating layer is spaced from the first insulating layer in the first direction, and
the fourth insulating layer is spaced from the second insulating layer in the first direction.

19. The semiconductor memory device according to claim 15, comprising:
a first impurity region provided at one end in the first direction of the first semiconductor layer; and
a second impurity region provided at one end in the first direction of the second semiconductor layer, wherein
the third semiconductor layer includes one end in the first direction connected to the first impurity region, and
the fourth semiconductor layer includes one end in the first direction connected to the second impurity region.

* * * * *